United States Patent
Naito

(10) Patent No.: US 10,396,189 B2
(45) Date of Patent: Aug. 27, 2019

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/987,912

(22) Filed: May 24, 2018

(65) Prior Publication Data

US 2018/0350960 A1 Dec. 6, 2018

(30) Foreign Application Priority Data

May 30, 2017 (JP) .................. 2017-107215
Oct. 18, 2017 (JP) .................. 2017-201793
May 10, 2018 (JP) .................. 2018-091774

(51) Int. Cl.
*H01L 29/78* (2006.01)
*H01L 29/739* (2006.01)
(Continued)

(52) U.S. Cl.
CPC ...... *H01L 29/7397* (2013.01); *G01R 31/2607* (2013.01); *H01L 21/221* (2013.01); *H01L 21/268* (2013.01); *H01L 21/26513* (2013.01); *H01L 21/28035* (2013.01); *H01L 21/302* (2013.01); *H01L 21/324* (2013.01); *H01L 21/3213* (2013.01); *H01L 21/3223* (2013.01); *H01L 21/743* (2013.01); *H01L 21/7685* (2013.01); *H01L 22/30* (2013.01); *H01L 22/32* (2013.01); *H01L 23/528* (2013.01); *H01L 23/535* (2013.01); *H01L 23/53214* (2013.01); *H01L 23/53271* (2013.01); *H01L 27/0727* (2013.01); *H01L 29/0696* (2013.01); *H01L 29/32* (2013.01); *H01L 29/401* (2013.01); (Continued)

(58) Field of Classification Search
None
See application file for complete search history.

(56) References Cited

U.S. PATENT DOCUMENTS 9,991,353 B2 * 6/2018 Naito .................. H01L 23/528
2017/0162662 A1    6/2017 Naito

FOREIGN PATENT DOCUMENTS

JP      2008235405 A    10/2008
JP      2008258406 A    10/2008
(Continued)

*Primary Examiner* — Minh Loan Tran

(57) ABSTRACT

Considering ease of electrical conduction tests and the like, electrodes provided mainly above an active region are desirably continuous on a single plane. A semiconductor device is provided, including: a semiconductor substrate; a first top surface electrode and a second top surface electrode that are provided above a top surface of the semiconductor substrate and contain a metal material; and a first connecting portion that electrically connects to the first top surface electrode and contains a semiconductor material, wherein the second top surface electrode has: a first region and a second region that are arranged being separated from each other with the first connecting portion as a boundary in a top view of the semiconductor substrate, and a second connecting portion that connects the first region and the second region above the first connecting portion.

28 Claims, 40 Drawing Sheets

(51) Int. Cl.
  *H01L 29/423* (2006.01)
  *H01L 29/417* (2006.01)
  *H01L 29/32* (2006.01)
  *H01L 29/40* (2006.01)
  *H01L 29/06* (2006.01)
  *H01L 29/49* (2006.01)
  *H01L 21/768* (2006.01)
  *H01L 27/07* (2006.01)
  *H01L 21/66* (2006.01)
  *H01L 29/861* (2006.01)
  *H01L 21/22* (2006.01)
  *H01L 21/74* (2006.01)
  *H01L 29/66* (2006.01)
  *H01L 21/268* (2006.01)
  *H01L 21/302* (2006.01)
  *H01L 21/322* (2006.01)
  *H01L 21/324* (2006.01)
  *H01L 21/265* (2006.01)
  *H01L 21/3213* (2006.01)
  *H01L 21/28* (2006.01)
  *H01L 23/528* (2006.01)
  *H01L 23/532* (2006.01)
  *H01L 23/535* (2006.01)
  *G01R 31/26* (2014.01)
  *H01L 29/51* (2006.01)

(52) U.S. Cl.
  CPC .......... *H01L 29/404* (2013.01); *H01L 29/407* (2013.01); *H01L 29/41708* (2013.01); *H01L 29/41741* (2013.01); *H01L 29/4236* (2013.01); *H01L 29/4238* (2013.01); *H01L 29/4916* (2013.01); *H01L 29/66303* (2013.01); *H01L 29/7805* (2013.01); *H01L 29/7813* (2013.01); *H01L 29/861* (2013.01); *H01L 21/28202* (2013.01); *H01L 21/28211* (2013.01); *H01L 23/53223* (2013.01); *H01L 29/063* (2013.01); *H01L 29/0619* (2013.01); *H01L 29/518* (2013.01)

(56) References Cited

FOREIGN PATENT DOCUMENTS

| | | |
|---|---|---|
| JP | 2012099695 A | 5/2012 |
| JP | 2017028244 A | 2/2017 |
| JP | 2017103400 A | 6/2017 |

* cited by examiner

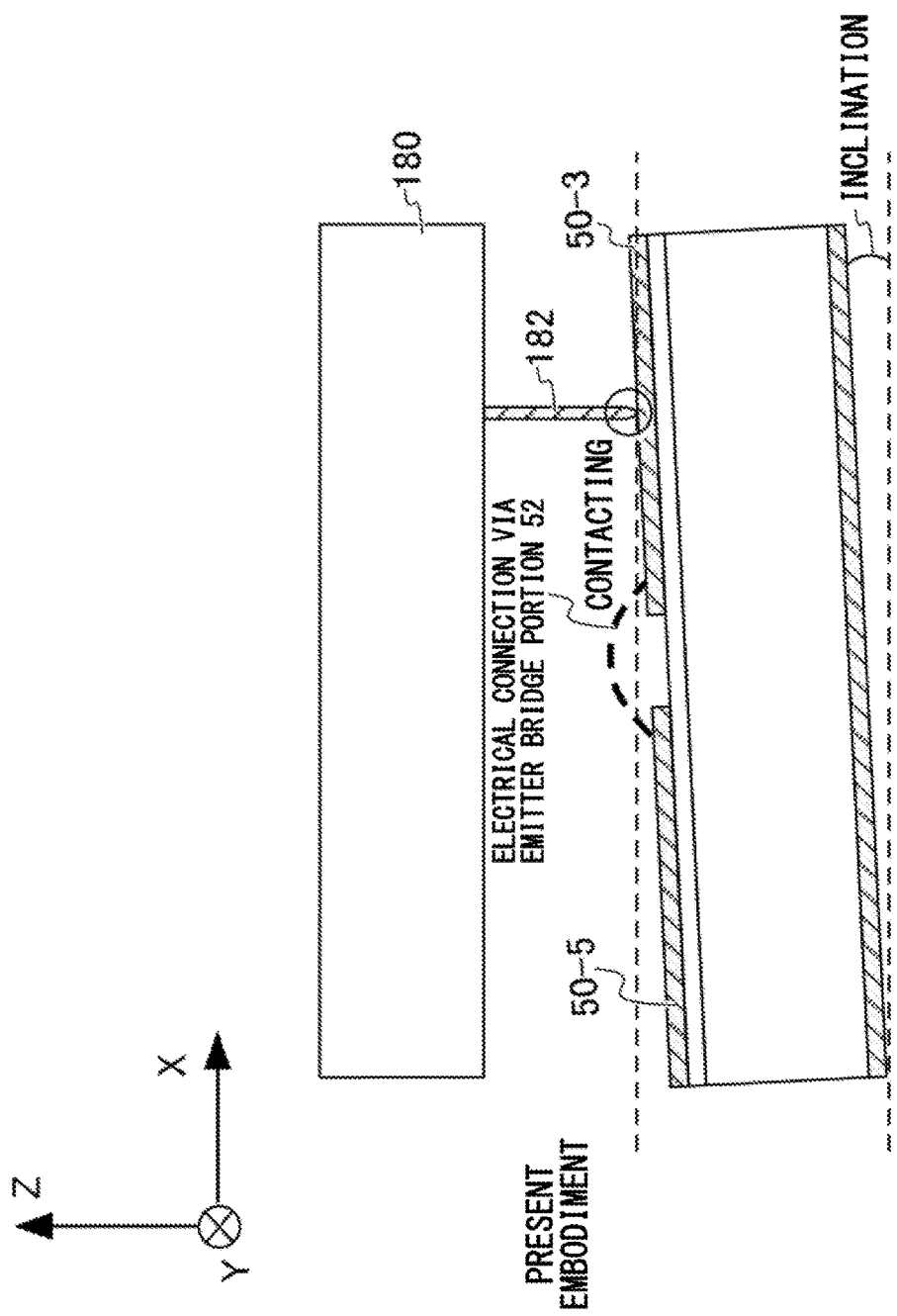

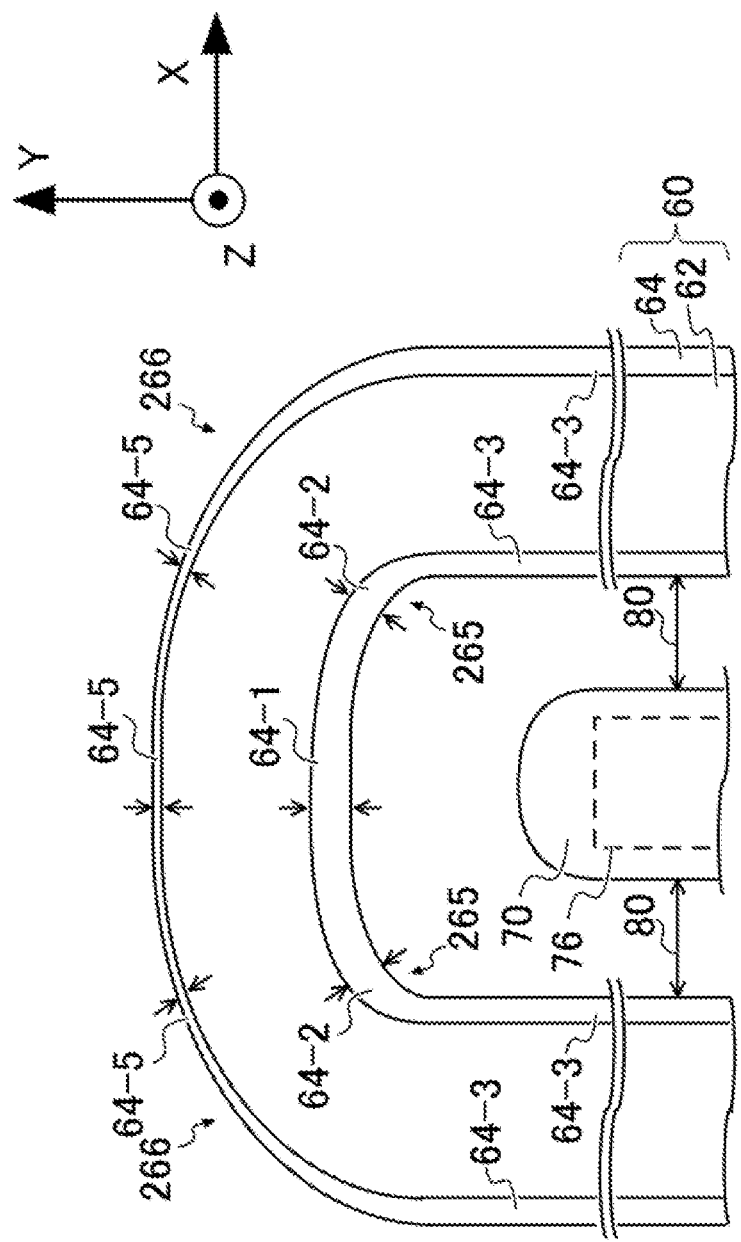

SEMICONDUCTOR DEVICE

The contents of the following Japanese patent applications are incorporated herein by reference:
NO. 2017-107215 filed in JP on May 30, 2017,
NO. 2017-201793 filed in JP on Oct. 18, 2017 and
NO. 2018-091774 filed in JP on May 10, 2018.

BACKGROUND

1. Technical Field

The present invention relates to a semiconductor device.
Conventionally, a semiconductor device having an insulated-gate bipolar transistor (IGBT) region and a free wheeling diode (FWD) region on a single semiconductor substrate has been known (please see Patent Documents 1 and 2, for example).

PRIOR ART DOCUMENTS

Patent Documents

[Patent Document 1] Japanese Patent Application Publication No. 2008-258406
[Patent Document 2] Japanese Patent Application Publication No. 2008-235405

Considering ease of electrical property tests and the like, electrodes provided mainly above an active region are desirably continuous on a single plane.

SUMMARY

A first aspect of the present invention provides a semiconductor device. The semiconductor device may include: a semiconductor substrate; a first top surface electrode and a second top surface electrode; and a first connecting portion. The first top surface electrode and the second top surface electrode may be provided above a top surface of the semiconductor substrate. The first top surface electrode and the second top surface electrode may contain a metal material. The first connecting portion may electrically connect to the first top surface electrode. The first connecting portion may contain a semiconductor material. The second top surface electrode may have: a first region and a second region; and a second connecting portion. The first region and the second region may be arranged being separated from each other with the first connecting portion as a boundary in a top view of the semiconductor substrate. The second connecting portion may connect the first region and the second region above the first connecting portion.

The first connecting portion may have a gate bridge trench portion. The gate bridge trench portion may be provided spreading from the top surface of the semiconductor substrate and reaching a predetermined depth. The gate bridge trench portion may be positioned below the second connecting portion. The gate bridge trench portion may electrically connect with the first top surface electrode.

The first top surface electrode may have a metallic wiring layer. The metallic wiring layer may be separated at least at a position of the second connecting portion in a top view of the semiconductor substrate. The metallic wiring layer may electrically connect to the gate bridge trench portion.

The semiconductor device may further include a first trench portion and a second trench portion. The first trench portion and the second trench portion may each be provided at a predetermined depth position from the top surface of the semiconductor substrate. The first trench portion may electrically connect with the first top surface electrode. The second trench portion may electrically connect with the second top surface electrode. A width of the gate bridge trench portion may be larger than both a width of the second trench portion and a width of the first trench portion. The width of the gate bridge trench portion may be a width in a second direction perpendicular to a first direction which is a direction of extension of the first connecting portion in a top view of the semiconductor substrate. The width of the second trench portion may be a width in the first direction. The width of the first trench portion may be a width in the first direction.

The first connecting portion may have a plurality of the gate bridge trench portions. The plurality of the gate bridge trench portions may be provided being separated from each other in a second direction. The second direction may be a direction perpendicular to a first direction which is a direction of extension of the first connecting portion in a top view of the semiconductor substrate.

The first connecting portion may have the gate bridge trench portion provided annularly in a top view of the semiconductor substrate.

A second aspect of the present invention provides a semiconductor device. The first connecting portion may be a polysilicon wiring layer. The first connecting portion may be provided above the top surface of the semiconductor substrate. The polysilicon wiring layer may be provided also below the second connecting portion.

The first top surface electrode may be a gate metal layer. The second top surface electrode may be an emitter electrode.

The semiconductor device may have an active region. The active region may include a transistor region and a free wheeling diode region. The second connecting portion may connect the first region and the second region between at least two of the free wheeling diode regions that are detached from each other in a second direction. The second direction may be a direction perpendicular to a first direction which is a direction of extension of the first connecting portion in a top view of the semiconductor substrate.

A width of the second connecting portion in the first direction may be smaller than a width of one of the free wheeling diode regions in the first direction.

The second connecting portion that connects the first region and the second region may not be provided between at least two of the free wheeling diode regions among a plurality of the free wheeling diode regions detached from each other in the second direction.

The semiconductor substrate may have a top surface killer region. The top surface killer region may be is provided in a predetermined depth range from the top surface between the free wheeling diode regions (FWD) detached from each other in the second direction; and adjusts hole lifetime. A width of the top surface killer region in the first direction in a region not provided with the second connecting portion may be larger than a width of the top surface killer region in the first direction in a region provided with the second connecting portion.

The second connecting portion may be provided at least between two of the free wheeling diode regions arranged close to a middle portion of the semiconductor substrate in a top view of the semiconductor substrate.

A width, in the first direction, of the second connecting portion provided between two of the free wheeling diode regions arranged close to a middle portion of the semiconductor substrate in a top view of the semiconductor substrate may be larger than a width, in the first direction, of the second connecting portion provided between two of the free wheeling diode regions arranged away from the middle portion of the semiconductor substrate in a top view of the semiconductor substrate.

A third aspect of the present invention provides a semiconductor device. In the active region, the first top surface electrode may electrically connect with a first trench portion in the transistor region. The semiconductor device may further include a third top surface electrode. The third top surface electrode may be provided, in the active region, being detached from the first top surface electrode and the second top surface electrode. In the active region, the third top surface electrode may electrically connect with a second trench portion in the transistor region.

The semiconductor substrate may have a dummy bridge trench portion. The dummy bridge trench portion may be provided spreading from the top surface of the semiconductor substrate and reaching a predetermined depth. The dummy bridge trench portion may be positioned below the second connecting portion. The dummy bridge trench portion may electrically connect with the third top surface electrode.

The first connecting portion may have a gate bridge trench portion that: is provided spreading from the top surface of the semiconductor substrate and reaching a predetermined depth; is positioned below the third top surface electrode; and electrically connects with the first top surface electrode.

The gate bridge trench portion may electrically connect: a periphery portion of the first top surface electrode; and an extending portion of the first top surface electrode. The periphery portion of the first top surface electrode may be provided near an end portion of an active region of the semiconductor substrate. The periphery portion of the first top surface electrode may extend in a second direction perpendicular to a first direction which is a direction of extension of the first connecting portion. The extending portion of the first top surface electrode may extend in the first direction between a pair of the periphery portions.

The semiconductor device may have a first trench portion, a second trench portion and a mesa portion. The first trench portion may be provided at a predetermined depth position from the top surface of the semiconductor substrate. The first trench portion may extend in a second direction perpendicular to a first direction which is a direction in which the first connecting portion extends if the semiconductor substrate is seen from above. The second trench portion may be provided at the predetermined depth position. The second trench portion may extend in the second direction. The second trench portion may electrically connect with the second top surface electrode. The mesa portion may be positioned between the first trench portion and the second trench portion that are adjacent to each other in the first direction. A width, in the first direction, at a second opening portion for electrically connecting the second top surface electrode and the second trench portion may be larger than a width, in the first direction, at a first opening portion for electrically connecting the mesa portion and the second top surface electrode.

A width, in the first direction, at a second contact portion at which the second top surface electrode and the second trench portion are electrically connected may be larger than a width, in the first direction, at a first contact portion at which the mesa portion and the second top surface electrode are electrically connected.

The second top surface electrode and the second trench portion may be electrically connected at the second opening portion not via a polysilicon wiring layer.

The second opening portion and the first opening portion may be provided at different positions in the second direction.

The semiconductor device may include an active region and an edge termination region. The active region may include a transistor region and a free wheeling diode region. The edge termination region may be provided around the active region. The transistor region may have a first conductivity type emitter region provided to the semiconductor substrate. The edge termination region may have a second conductivity type guard ring and a silicon dioxide layer. The second conductivity type guard ring may be provided spreading from the top surface of the semiconductor substrate and reaching a predetermined depth. The silicon dioxide layer may be provided on the guard ring. The silicon dioxide layer may have a thickness which is equal to or larger than 1 μm. A distance between an end portion, of the silicon dioxide layer, which is closest to the emitter region and an end portion of the emitter region which is closest to the edge termination region may be equal to or larger than 100 μm.

The first trench portion may include a first extending region and a second extending region. The first extending region may extend in the first direction. The second extending region may extend in the second direction. The first extending region may connect at least three of the second extending regions in the first direction.

The semiconductor device may include an active region and an edge termination region provided around the active region. The active region may include a transistor region and a free wheeling diode region. The edge termination region may be provided around the active region. At an end portion, of the active region, which is on the edge termination region side, the first extending region of the first trench portion may connect to a gate periphery trench portion extending in the second direction.

The semiconductor device may have an active region. The active region may include a transistor region and a free wheeling diode region. The free wheeling diode region may have a second trench portion. The second trench portion may be provided at the predetermined depth position; and electrically connect with the second top surface electrode. The second trench portion may include: a third extending region extending in the first direction; and a fourth extending region extending in the second direction. The third extending region may connect at least three of the fourth extending regions in the first direction.

The first extending region may have a recessed portion which is at one end portion among end portions of the first extending region in the second direction and is recessed toward the second extending region, the one end portion being opposite to the second extending region.

The third extending region may connect, in the first direction, all the fourth extending regions in a plurality of the second trench portions in one of the free wheeling diode regions.

The summary clause does not necessarily describe all necessary features of the embodiments of the present invention. The present invention may also be a sub-combination of the features described above.

BRIEF DESCRIPTION OF THE DRAWINGS

FIG. 7B is a side view in the present embodiment in which respective regions of the emitter electrode 50 are electrically connected.

FIG. 28B is an enlarged view of Y-axis direction end portions of a gate trench portion 60 and an emitter trench portion 70 in a comparative example.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
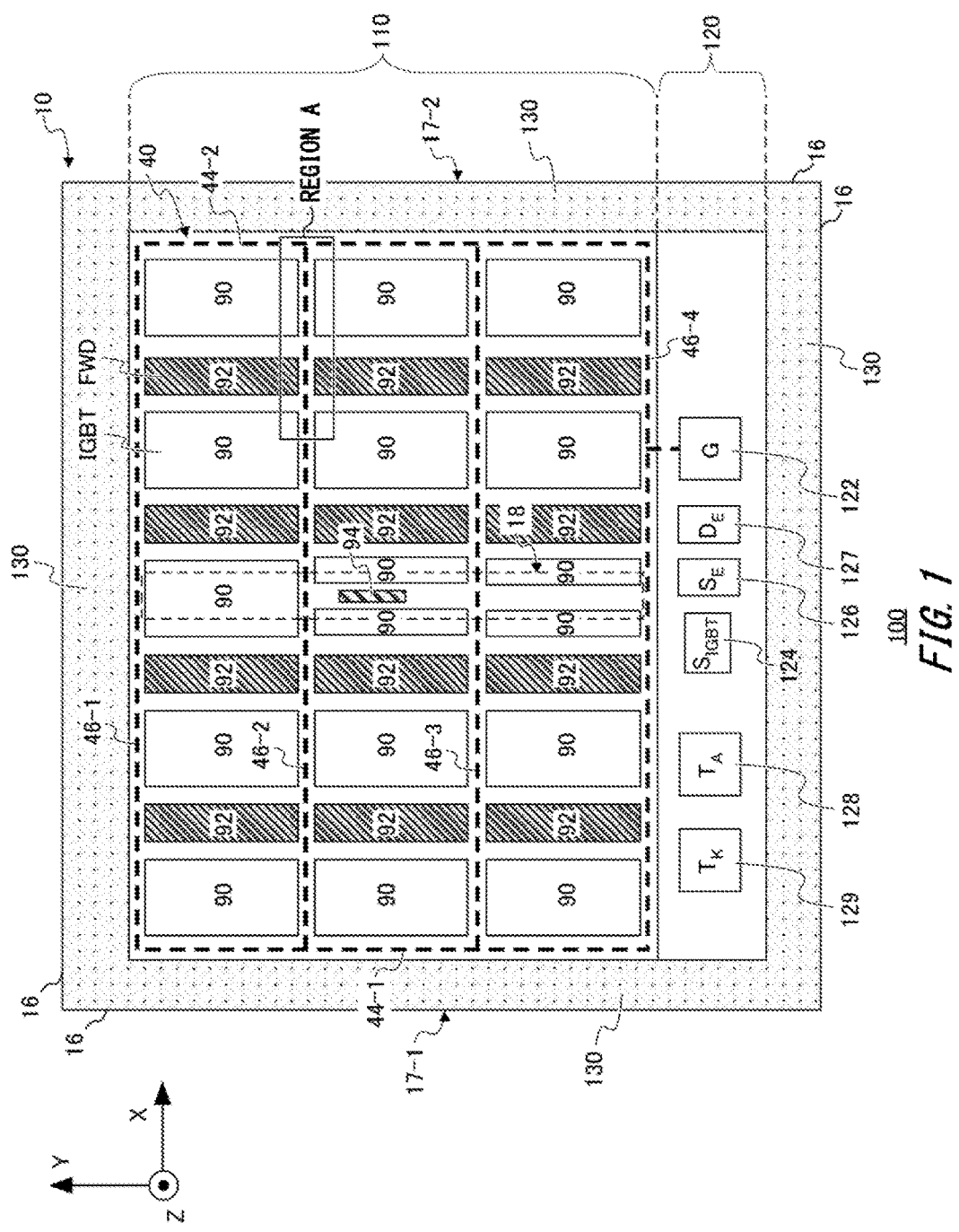
FIG. 1 is a schematic diagram showing the top surface of a semiconductor device 100.
Figure 3:
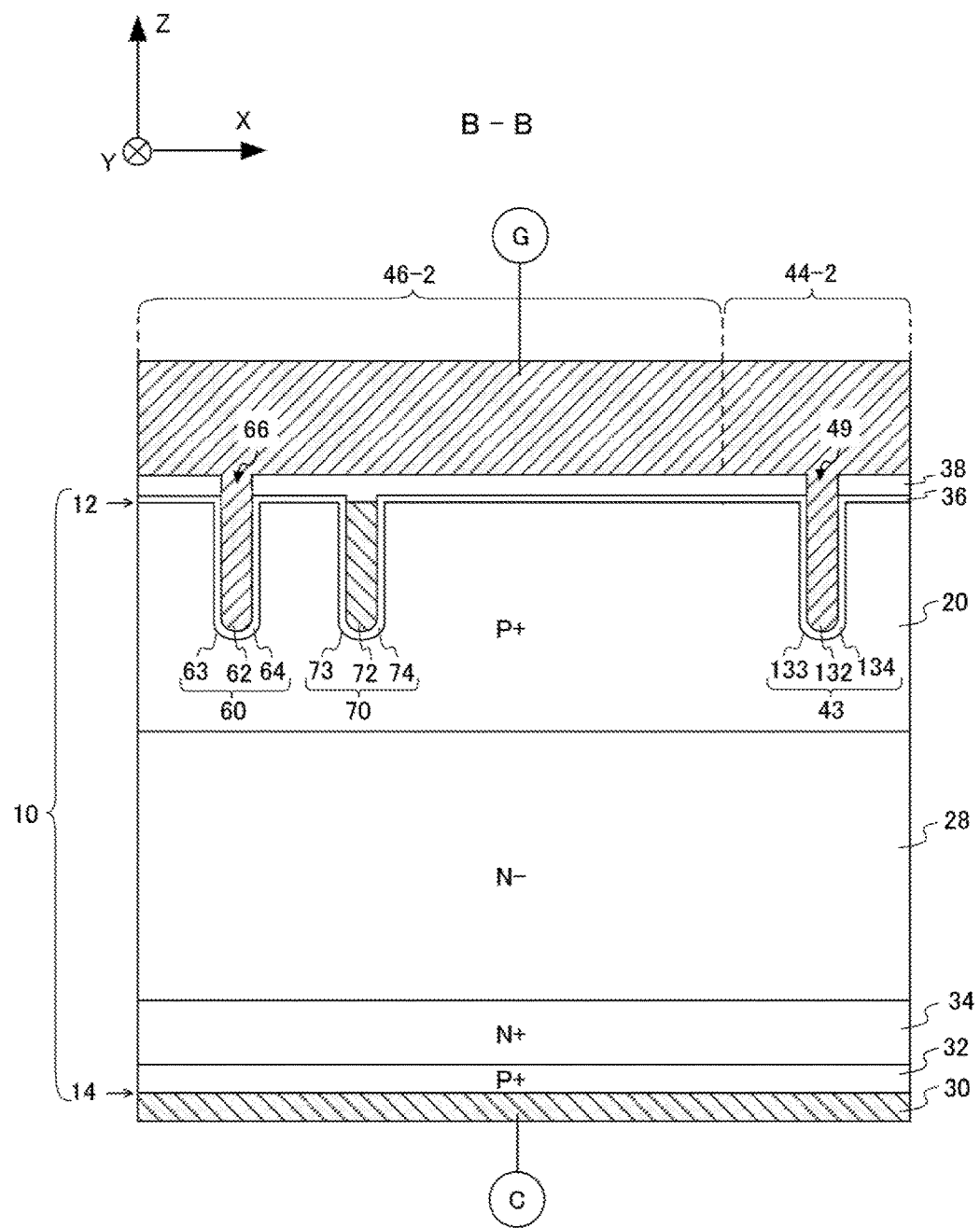
FIG. 3 is a figure showing a cross section taken along B-B in FIG. 2.

FIG. 1 is a schematic diagram showing the top surface of a semiconductor device 100. The semiconductor device 100 of the present example includes a semiconductor substrate 10. In FIG. 1, respective X-axis direction and Y-axis direction end portions of the semiconductor substrate 10 are shown as a periphery 16. The semiconductor substrate 10 has a top surface 12 at a Z-axis positive direction end portion, and a bottom surface 14 at a Z-axis negative direction end portion. The top surface 12 and the bottom surface 14 are shown in FIG. 3. Although the semiconductor substrate 10 of the present example is a silicon substrate, in another example, the semiconductor substrate 10 may also be a silicon carbide substrate, a gallium nitride substrate or a gallium oxide substrate.

In the present specification, the X-axis direction and the Y-axis direction are perpendicular to each other, and the Z-axis direction is vertical to the X-Y plane. The X-axis direction, Y-axis direction and Z-axis direction constitute a so-called right-handed system. In the present example, the X-axis direction is one example of a first direction, and the Y-axis direction is one example of a second direction. In the present specification, a direction parallel with the Z-axis direction is referred to as the depth direction of the semiconductor substrate 10, in some cases. In the present specification, terms "up", "down", "above" and "below" are not limited by the upward and downward directions in the direction of gravity. These terms merely refer to directions relative to predetermined axes.

The semiconductor device 100 has an active region 110, a pad region 120 and an edge termination region 130. The active region 110 may have a plurality of element regions. The active region 110 of the present example has a plurality of IGBT regions 90, a plurality of FWD regions 92 and a temperature sense diode region 94. The temperature sense diode region 94 is provided to a middle portion 18 of the semiconductor substrate 10 if the semiconductor substrate 10 is seen from above.

In FIG. 1, the middle portion 18 is indicated with a broken line frame. In the present example, the middle portion 18 is a region near the center of the active region 110 in the X-axis direction. The middle portion 18 of the present example has a width in the X-axis direction which is narrower than that of an IGBT region 90 that: is positioned at the center of the active region 110 in the X-axis direction; and has the largest region area, and a width in the Y-axis direction which is equal to the total of widths of three IGBT regions 90 that are adjacent in the Y-axis direction.

The semiconductor device 100 of the present example is a so-called RC-IGBT (Reverse Conducting-IGBT). In the present example, the plurality of IGBT regions 90 are provided side-by-side in the Y-axis direction. In addition, the plurality of FWD regions 92 also are provided side-by-side in the Y-axis direction. Furthermore, except for the middle portion 18, the IGBT regions 90 and the FWD regions 92 are provided alternately in the X-axis direction.

Some IGBT regions 90 at the middle portion 18 may have small region areas as compared with IGBT regions 90 outside the middle portion 18, if the semiconductor substrate 10 is seen from above. Two IGBT regions 90 which are provided to the middle portion 18 and sandwich the temperature sense diode region 94 in the X-axis direction may have region areas smaller than IGBT regions 90 outside the middle portion 18. In the present example, two IGBT regions 90 positioned at Y-axis negative direction end portions of the middle portion 18 and the two IGBT regions 90 sandwiching the temperature sense diode region 94 in the middle portion 18 have region areas smaller than IGBT regions 90 outside the middle portion 18.

The semiconductor device 100 further includes a gate metal layer 40. The gate metal layer 40 may be provided above the semiconductor substrate 10. In FIG. 1 the gate metal layer 40 is indicated with thick broken lines. The gate metal layer 40 of the present example is a metallic layer or metallic wiring layer that supplies gate potential. That is, the gate metal layer 40 of the present example also includes a gate runner which is a metallic wiring layer provided on the semiconductor substrate 10. The gate metal layer 40 of the present example includes periphery portions 44 positioned near X-axis direction end portions of the active region 110 and extending portions 46 extending between a pair of the periphery portions 44.

The periphery portions 44 of the present example include a periphery portion 44-1 and a periphery portion 44-2. The periphery portion 44-1 is parallel with one side 17-1 that: is part of the periphery 16 of the semiconductor substrate 10; and is parallel with the Y-axis direction, and the periphery portion 44-2 is parallel with another one side 17-2 that: is opposite to the one side 17-1; and is parallel with the Y-axis direction. The periphery portion 44-1 and the periphery portion 44-2 are opposite to each other in the X-axis direction. The extending portions 46 may be provided extending from the periphery portions 44 toward the middle portion 18. In the present example, four extending portions 46 extend from the periphery portion 44-1 to the periphery portion 44-2 and in parallel with the X-axis direction.

The pad region 120 may have a plurality of pads and an element region. The pad region 120 of the present example has a gate pad 122, a sense IGBT region 124, a sense emitter pad 126, a dummy emitter pad 127, a temperature sense anode pad 128 and a temperature sense cathode pad 129. The gate pad 122 is indicated with a symbol G. The gate pad 122 may electrically connect with the gate metal layer 40. A gate signal to drive the IGBT may be supplied from the gate pad 122 to the semiconductor device 100.

The sense IGBT region 124 is indicated with $S_{IGBT}$. The sense IGBT region 124 may be provided for the purpose of detecting main current flowing through the IGBT regions 90 of the active region 110. By taking sense current flowing through the sense IGBT region 124 into a control circuit provided outside the semiconductor device 100, main current flowing through the IGBT regions 90 can be sensed. The value of sense current may be sufficiently small as compared with main current.

The sense emitter pad 126 is indicated with $S_E$. The sense emitter pad 126 may be an electrode pad at the same potential as the emitter of the sense IGBT region 124. Sense current may be taken into the above-mentioned control circuit through the sense emitter pad 126.

The dummy emitter pad 127 is indicated with $D_E$. The dummy emitter pad 127 may be utilized if a test is conducted on the IGBT regions 90 and the sense IGBT region 124. In particular, the dummy emitter pad 127 may be utilized if a screening test of an insulating film provided in an emitter trench portion is conducted on the IGBT regions 90 and the sense IGBT region 124.

The temperature sense anode pad 128 is indicated with $T_A$. In addition, the temperature sense cathode pad 129 is indicated with $T_K$. The temperature sense anode pad 128 and temperature sense cathode pad 129 of the present example are pads electrically connected with the anode and cathode of the temperature sense diode region 94, respectively. By monitoring the voltage characteristics observed if constant current is caused to flow through the temperature sense diode region 94, temperature of the temperature sense diode region 94 can be identified.

The edge termination region 130 may be provided around the active region 110 and the pad region 120. The edge termination region 130 is indicated with dots. The edge termination region 130 may have the function of relaxing electric field concentration near the top surface 12 of the semiconductor substrate 10. The edge termination region 130 has a guard ring, a field plate, a RESURF or a structure obtained by combining any two or more of them, for example.

Figure 2:
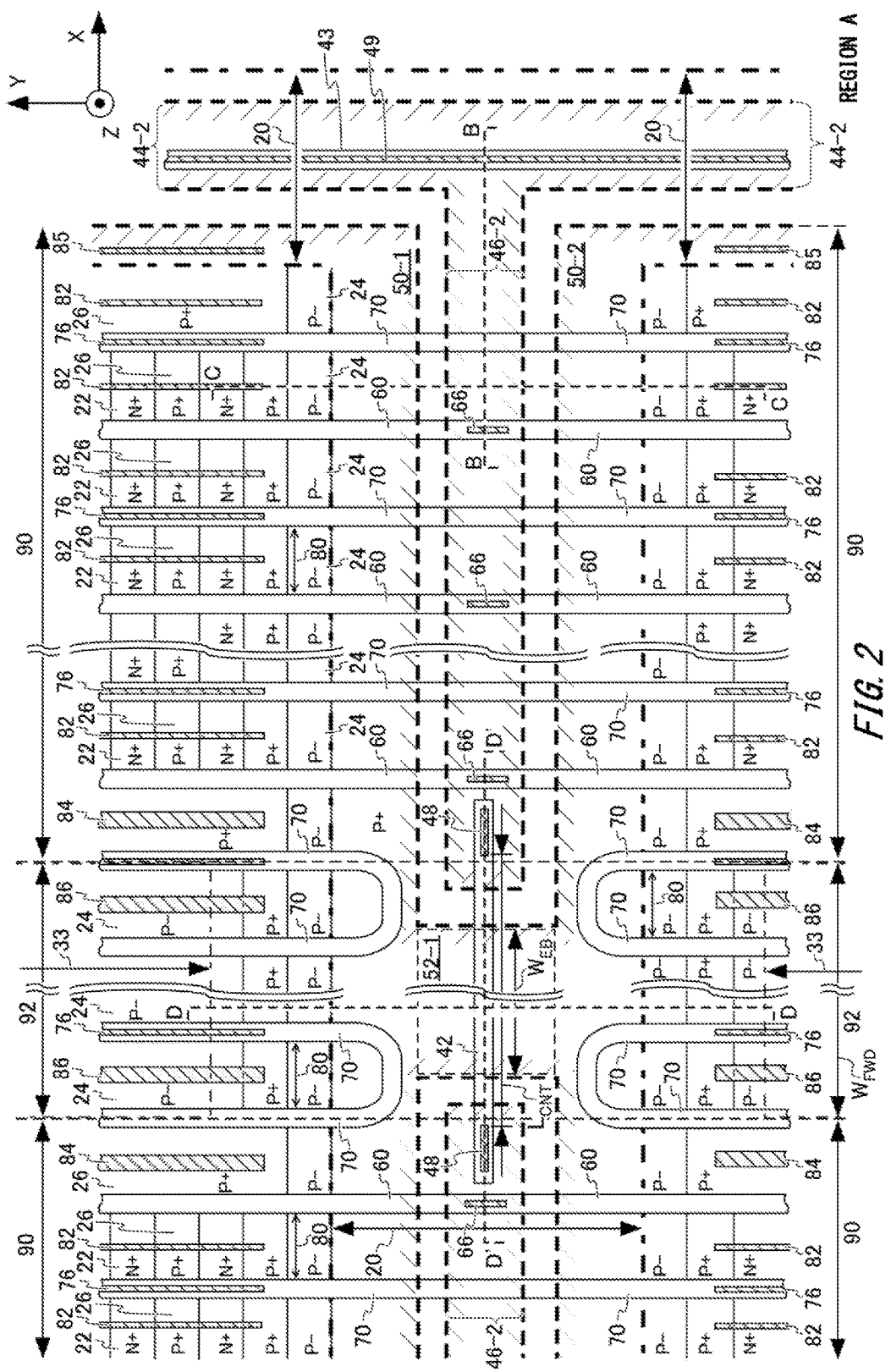
FIG. 2 is an enlarged view of a region A in a first embodiment.

FIG. 2 is an enlarged view of a region A in a first embodiment. FIG. 2 is a top view of the semiconductor substrate 10. In FIG. 2, the external forms of the gate metal layer 40 and an emitter electrode 50 are indicated with thick broken lines. In FIG. 2, for the purpose of facilitating understanding, an oxide film 36 and an interlayer dielectric film 38 provided between the gate metal layer 40 and emitter electrode 50, and the top surface 12 of the semiconductor substrate 10 are omitted. The oxide film 36 and interlayer dielectric film 38 are explained with reference to FIG. 3.

The IGBT regions 90 may be regions that imaginarily appear on the top surface 12 of the semiconductor substrate 10 in the active region 110 if collector regions 32 are imaginarily projected vertically thereonto, and in which predetermined unit configurations including emitter regions 22 and contact regions 26 are orderly arranged. The collector regions 32 are shown in FIG. 3.

In addition, the FWD regions 92 may be regions of the bottom surface 14 that match regions in which cathode regions 33 are provided in the active region 110 or regions that imaginarily appear on the top surface 12 of the active region 110 if the cathode regions 33 are projected vertically thereonto. In FIG. 2, the ranges over which the cathode regions 33 are provided are indicated with alternate long and short dash lines, and Y-axis direction end portions of the cathode regions 33 are indicated with arrows. In the present example, the boundaries between the IGBT regions 90 and the FWD regions 92 are U-shaped emitter trench portions 70 adjacent to linearly-shaped gate trench portions 60 in the X-axis direction. In addition, about two FWD regions 92 that face each other in the Y-axis direction while sandwiching the gate metal layer 40 or an emitter bridge portion 52, regions reaching Y-axis direction end portions of U-shaped emitter trench portions 70 may be respectively regarded as FWD regions 92 for convenience.

Each among the IGBT regions 90 and FWD regions 92 may include a mesa portion 80 and a plurality of trench portions. The mesa portion 80 is a partial region of the semiconductor substrate provided between adjacent two trench portions. The mesa portion 80 is part of the semiconductor substrate 10 positioned at a region closer to the top surface 12 than the bottom surfaces of the trench portions are. In the present specification, gate trench portions 60 and emitter trench portions 70 are referred to as trench portions collectively in some cases.

The IGBT regions 90 of the present example have gate trench portions 60 and emitter trench portions 70. The gate trench portions 60 and emitter trench portions 70 of the IGBT regions 90 extend in the Y-axis direction, and may be provided alternately in the X-axis direction. The gate trench portion 60 and emitter trench portions 70 in the IGBT regions 90 may extend from one IGBT region 90 to another IGBT region 90, and may cross an extending portion 46 of the gate metal layer 40 below the extending portion 46.

The FWD regions 92 of the present example do not have gate trench portions 60, but have emitter trench portions 70. The emitter trench portions 70 of the FWD regions 92 also may extend in the Y-axis direction, and be provided alternately in the X-axis direction. However, the emitter trench portions 70 of the FWD regions 92 may not be provided between FWD regions 92 that are adjacent to each other in the Y-axis direction. In the present example, the emitter trench portions 70 of the FWD regions 92 have U-shapes at respective Y-axis direction end portions. A U-shape may be constituted by two longer-side portions that are parallel with the Y-axis direction and one shorter-side portion parallel with the X-axis direction. Emitter trench portions 70 positioned in the Y-axis positive direction relative to the extending portions 46 may constitute normally oriented U-shapes, and emitter trench portions 70 positioned in the Y-axis negative direction relative to the extending portions 46 may constitute inversely oriented U-shapes. The emitter trench portions 70 of the FWD regions 92 may have shapes formed by joining longer-side portions of normally oriented U-shapes and of inversely oriented U-shapes, respectively.

Each among the gate trench portions 60 and the emitter trench portions 70 may be provided in the semiconductor substrate 10. A gate trench portion 60 may have a gate conductive portion 62 that electrically connects with the gate metal layer 40. The gate conductive portion 62 is shown in FIG. 3. The gate metal layer 40 is one example of a first top surface electrode, and the gate trench portion 60 is one example of a first trench portion. In the present example, the gate conductive portion 62 electrically connects with an extending portion 46 of the gate metal layer 40 through an opening in the interlayer dielectric film 38 between the gate trench portion 60 and the extending portion 46. A connecting portion between the gate conductive portion 62 and the gate metal layer 40 is shown as a contact portion 66.

An emitter trench portion 70 may have an emitter conductive portion 72 that electrically connects with the emitter electrode 50. The emitter conductive portion 72 is shown in FIG. 3. The emitter electrode 50 is one example of a second top surface electrode, and the emitter trench portion 70 is one example of a second trench portion. In the present example, the emitter conductive portion 72 electrically connects with the emitter electrode 50 through an opening in the interlayer dielectric film 38 between the emitter trench portion 70 and the emitter electrode 50. A connecting portion between the emitter conductive portion 72 and the emitter electrode 50 is shown as a contact portion 76.

At the contact portion 66 and the contact portion 76, each conductive portion and an electrode may contact directly, may contact via a barrier metal or may also contact via a barrier metal and a plug. The barrier metal may be formed to contact a bottom portion and side portion of an opening in the interlayer dielectric film 38. The barrier metal may be molybdenum (Mo), titanium (Ti) or the like. In addition, the plug may be a plug made of tungsten (W). The plug may be formed being embedded in an opening in the interlayer dielectric film 38 to contact the barrier metal from above.

The semiconductor substrate 10 may have $N^+$-type emitter regions 22, $P^+$-type contact regions 26, $P^-$-type base regions 24 and a $P^+$-type well region 20 in the IGBT regions 90. The emitter regions 22, contact regions 26, base regions 24 and well region 20 may be provided spreading from the top surface 12 of the semiconductor substrate 10 and reaching respective predetermined depths. In a mesa portion 80 of an IGBT region 90, the emitter regions 22 and contact regions 26 may be provided alternately in the Y-axis direction. However, in a mesa portion 80 positioned at an X-axis direction end portion of an IGBT region 90, emitter regions 22 may not be provided. In FIG. 2, a range over which the $P^+$-type well region 20 is provided is indicated with an alternate long and short dash lines and arrows.

In the present example, N and P mean that electrons and holes are the majority carriers, respectively. In addition, about + and − affixed to N and P, N+ or P+ means that the carrier concentration is higher than what N or P without + indicates, and N− or P− means that the carrier concentration is lower than what N or P without—indicates.

In a mesa portion 80 of an IGBT region 90, a base region 24 may be provided below an emitter region 22 and a contact region 26. In addition, base regions 24 may be provided also to respective Y-axis positive/negative direction end portions of emitter regions 22 and contact regions 26 provided alternately in the Y-axis direction. In contrast to this, in a mesa portion 80 positioned at the boundary between an IGBT region 90 and a FWD region 92, base regions 24 may be provided below a contact region 26 and at respective Y-axis positive/negative direction end portions of the contact region 26. A well region 20 may be provided between two IGBT regions 90 that are adjacent in the Y-axis direction.

The emitter electrode 50 may electrically connect with emitter regions 22 and contact regions 26 provided alternately in the Y-axis direction through openings in the oxide film 36 and the interlayer dielectric film 38. Connecting portions between the emitter electrode 50 and the emitter regions 22 and contact regions 26 provided alternately in the Y-axis direction are shown as contact portions 82. A contact portion 82 provided to an X-axis positive direction end portion which is the closest to a periphery portion 44 may be a connecting portion of connection with a contact region 26. A plurality of contact portions 82 provided to an X-axis positive direction end portion in an IGBT region 90 may be formed into stripes. The plurality of contact portions 82 may be formed to be adjacent to each other in the X-axis direction.

In addition, the emitter electrode 50 may electrically connect with a contact region 26 of a mesa portion 80 positioned at the boundary between an IGBT region 90 and a FWD region 92, through openings in the oxide film 36 and the interlayer dielectric film 38. A connecting portion between the contact region 26 of the mesa portion 80 positioned at the boundary and the emitter electrode 50 is shown as a contact portion 84. Furthermore, the emitter electrode 50 may electrically connect with the P$^+$-type well region 20 at an X-axis positive direction end portion of an IGBT region 90, through openings in the oxide film 36 and the interlayer dielectric film 38. A connecting portion between the emitter electrode 50 and the well region 20 is shown as a contact portion 85. The contact portion 85 may be provided on the well region 20, and a plurality of the contact portions 85 in stripes may be formed to be adjacent to each other in the X-axis direction.

The semiconductor substrate 10 may have contact regions 26, base regions 24 and the well region 20 in a FWD region 92. The contact regions 26, base regions 24 and well region 20 may be provided spreading from the top surface 12 of the semiconductor substrate 10 and reaching respective predetermined depths. In a mesa portion 80 of a FWD region 92, the base regions 24 and contact regions 26 may be provided alternately in the Y-axis direction.

In a mesa portion 80 of a FWD region 92, the contact regions 26 may be formed only at both ends, in the Y-axis direction, of a contact portion 86 formed at the top surface of a base region 24. Alternatively, the contact regions 26 may also be provided to alternate with the base regions 24 in the Y-axis direction. The base regions 24 may be provided also below the contact regions 26. In addition, in the base regions 24 and contact regions 26 provided alternately in the Y-axis direction, respective Y-axis positive/negative direction end portions may be base regions 24. The well region 20 may be provided between two FWD regions 92 adjacent to each other in the Y-axis direction.

The emitter electrode 50 may electrically connect with base regions 24 and contact regions 26 provided alternately in the Y-axis direction through openings in the oxide film 36 and the interlayer dielectric film 38. Connecting portions between the base regions 24 and contact regions 26 provided alternately in the Y-axis direction and the emitter electrode 50 are shown as contact portions 86.

The gate metal layer 40 and the emitter electrode 50 may be provided above the top surface 12 of the semiconductor substrate 10. The gate metal layer 40 and the emitter electrode 50 may contain metal materials. The gate metal layer 40 and the emitter electrode 50 may be aluminum (Al) electrodes, may be aluminum (Al)-silicon (Si) alloys, or may also be aluminum (Al)-nickel (Ni) alloys.

The gate metal layer 40 may be the same material as that of the emitter electrode 50. The gate metal layer 40 of the present example is a metallic wiring layer containing mainly aluminum. That is, the periphery portions 44 and extending portions 46 of the gate metal layer 40 are a metallic wiring layer containing mainly aluminum. The gate metal layer 40 may be provided in contact with the interlayer dielectric film 38 located above the semiconductor substrate 10. Assuming that the periphery portions 44 and extending portions 46 of the gate metal layer 40 are a polysilicon wiring layer, because polysilicon wiring layers have high resistivity as compared with those of metallic wiring layers, the width of the polysilicon wiring layer (for example, the width of an extending portion 46 in the Y-axis direction) needs to be made larger as compared with a metallic wiring layer in order to lower the resistance value of the polysilicon wiring layer.

In contrast to this, because in the present example, the gate metal layer 40 is a metallic wiring layer, the width of an extending portion 46 in the Y-axis direction can be made smaller as compared with that in the case where it is a polysilicon wiring layer. Thereby, the chip size of the semiconductor device 100 can be reduced. In addition, by using a metallic wiring layer for the gate metal layer 40, as compared with the case where it is a polysilicon wiring layer, current imbalance and gate signal transfer lags at an extending portion 46 of the gate metal layer 40 can also be reduced.

If a polysilicon wiring layer is used for the periphery portions 44 and extending portions 46 of the gate metal layer 40, connection regions that are provided at the same layer as the polysilicon wiring layer and are processed into an island-like form by patterning of the polysilicon wiring layer are provided on the contact portions 66 and 76. In contrast to this, because in the present example, a polysilicon wiring layer is not used, steps attributable to connection regions of a polysilicon wiring layer processed into an island-like form can be eliminated. Thereby, because variation in processing precision in fine processing can be reduced, characteristic variation of IGBTs can be reduced.

The semiconductor device 100 may have a gate bridge trench portion 42 that electrically connects to the gate metal layer 40. The gate bridge trench portion 42 is one example of a first connecting portion. The gate bridge trench portion 42 may be provided to reach a predetermined depth from the top surface 12 of the semiconductor substrate 10. That is, the gate bridge trench portion 42 is provided in the semiconductor substrate 10. In a top view of the semiconductor substrate 10, the direction of extension of the gate bridge trench portion 42 may be the X-axis direction. That is, in the top view, the gate bridge trench portion 42 may have a width in the Y-axis direction which is larger than the width in the X-axis direction.

The extending portions 46 of the gate metal layer 40 may be separated at least at the position of the emitter bridge portion 52 in a top view of the semiconductor substrate 10. Thereby, the gate metal layer 40 and emitter electrode 50 respectively provided on the interlayer dielectric film 38 can be electrically separated. In the present example, the extending portion 46 separated by the emitter bridge portion 52 electrically connects to the gate bridge trench portion 42. Thereby, electrical conduction can be ensured.

Figure 5A:
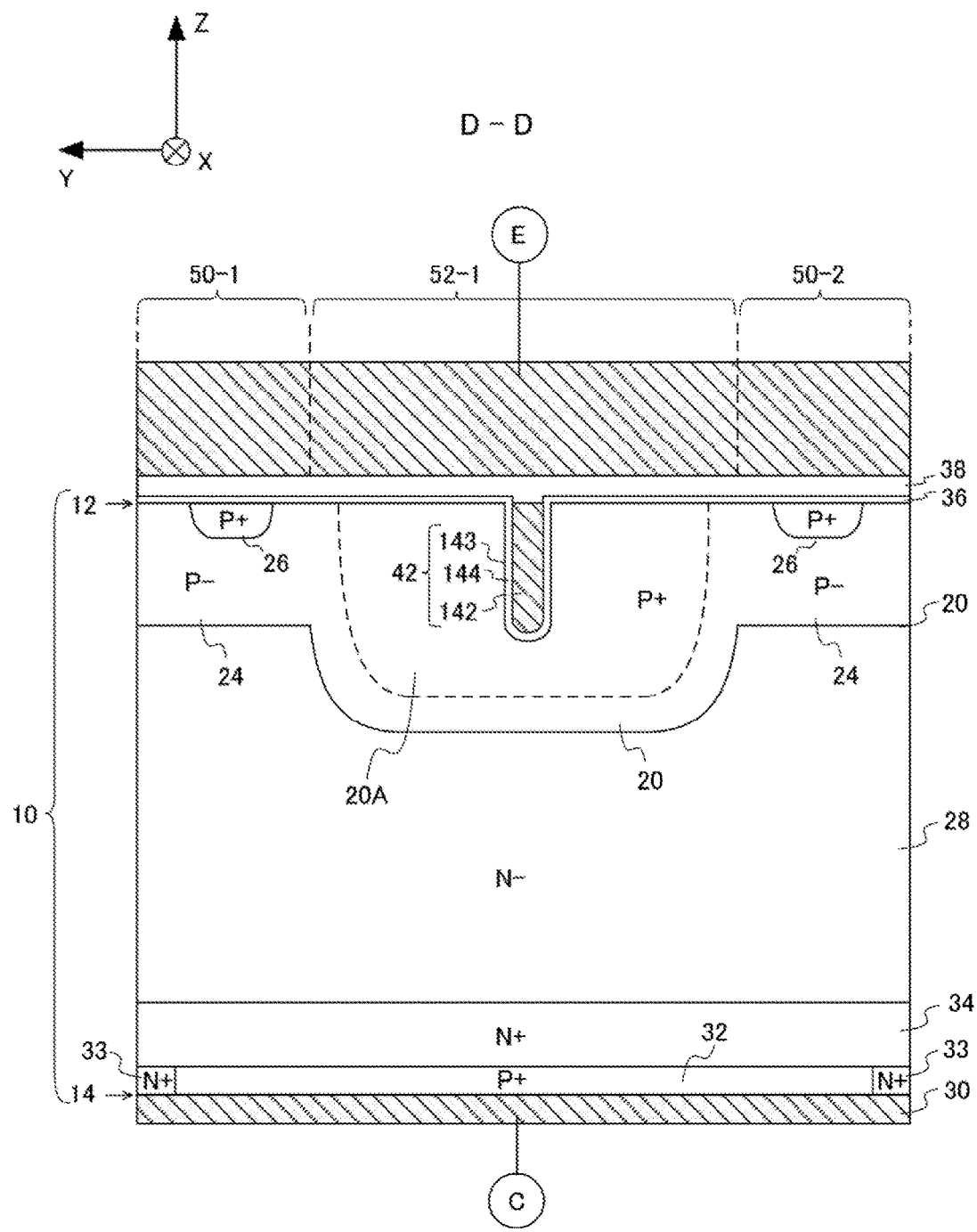
FIG. 5A is a figure showing a cross section taken along D-D in FIG. 2.
Figure 5B:
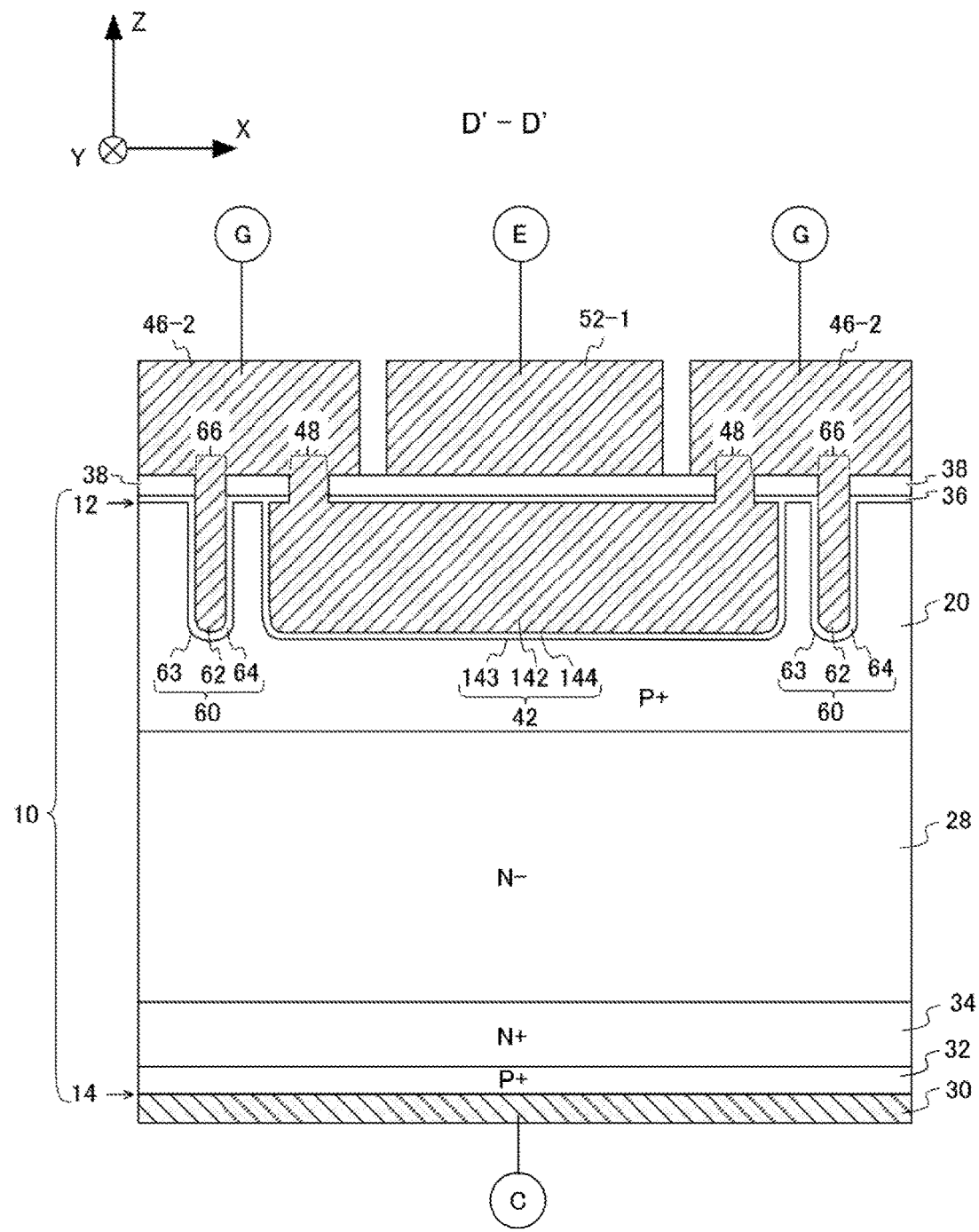
FIG. 5B is a figure showing a cross section taken along D'-D' in FIG. 2.

The gate bridge trench portion 42 may include a conductive portion. A gate bridge conductive portion 142 of the gate bridge trench portion 42 may be a semiconductor material. The gate bridge conductive portion 142 is shown in FIG. 5A and FIG. 5B. The gate bridge conductive portion 142 of the present example is made of polysilicon. The gate bridge conductive portion 142 may, at a portion near an X-axis direction end portion thereof, electrically connect with the extending portion 46 of the gate metal layer 40. In the present example, the gate bridge conductive portion 142 electrically connects with the extending portion 46 through an opening in the interlayer dielectric film 38 between the gate bridge trench portion 42 and the extending portion 46. Connecting portions between the gate bridge conductive portion 142 and the extending portion 46 are shown as contact portions 48. That is, the gate bridge trench portion 42 may be regarded as a trench portion including a conductive portion connecting, to each other, extending portions 46 of two gate metal layers 40 separated in the X-axis direction at the emitter bridge portion 52, with a material of different conductivity from that of the gate metal layer 40.

In the present example, the gate bridge trench portion 42 is positioned below the emitter bridge portion 52. Because the gate bridge trench portion 42 does not protrude from the top surface 12 of the semiconductor substrate 10, the top surface 12 below an emitter bridge portion 52-1 can be made flat as compared with the case where a polysilicon wiring layer is provided below the emitter bridge portion 52-1.

The emitter electrode 50 may include a first region 50-1 and a second region 50-2. In the present example, each among the first region 50-1 and the second region 50-2 is part of the emitter electrode 50 arranged being separated from the other by the gate bridge trench portion 42 as their boundary in a top view of the semiconductor substrate 10.

The emitter electrode 50 may further include the emitter bridge portion 52-1. Above the gate bridge trench portion 42, the emitter bridge portion 52-1 may connect the first region 50-1 and the second region 50-2. Between at least two FWD regions 92 detached from each other in the Y-axis direction, the emitter bridge portion 52-1 may connect the first region 50-1 and the second region 50-2. Again, the emitter bridge portion 52 of the present example is part of the emitter electrode 50. The first region 50-1 and the second region 50-2 are electrically at the same potential via the emitter bridge portion 52-1. That is, the emitter bridge portion 52 may be regarded as an electrode layer that connects, with each other, emitter electrodes 50 of two FWD regions 92 separated in the Y-axis direction sandwiching an extending portion 46 of the gate metal layer 40, with a material of the same conductivity as that of the emitter electrodes 50.

The width of the emitter bridge portion 52 in the X-axis direction may be smaller than the width of one FWD region 92 in the X-axis direction. A width $W_{EB}$ of the emitter bridge portion 52 in the X-axis direction may be equal to or smaller than ¾ or may also be equal to or smaller than ½ of a width $W_{FWD}$ of one FWD region 92 in the X-axis direction. For example, the width $W_{FWD}$ of the FWD region 92 is 200 μm, and the width $W_{EB}$ of the emitter bridge portion 52 is 80 μm. In this manner, by making the width $W_{EB}$ of the emitter bridge portion 52 smaller than the width $W_{FWD}$ of the FWD region 92, by a corresponding amount, the length of the extending portions 46 of the gate metal layer 40 in the X-axis direction can be made longer. Corresponding to this, a distance $L_{CNT}$ between the contact portions 48 of the gate bridge trench portion 42 can be made shorter. As mentioned above, the metallic wiring layer of the extending portions 46 has resistivity lower than polysilicon which is the gate bridge conductive portion 142 of the gate bridge trench portion 42. By making the length between the contact portions 48 of the gate bridge trench portion 42 shorter, the resistance value at the gate bridge trench portion 42 can be lowered.

The semiconductor substrate 10 of the present example has a gate periphery trench portion 43 below a periphery portion 44 of the gate metal layer 40. The gate periphery trench portion 43 may have a gate periphery conductive portion 132 made of a semiconductor material. The gate periphery conductive portion 132 is shown in FIG. 3. The gate periphery conductive portion 132 of the present example electrically connects with the periphery portion 44 through an opening in the interlayer dielectric film 38 between the gate periphery trench portion 43 and the periphery portion 44. A connecting portion between the gate periphery conductive portion 132 and the gate metal layer 40 is shown as a contact portion 49. The contact portion 49 may be provided not to a partial region on the gate periphery trench portion 43 but to the entire region on the gate periphery trench portion 43.

In addition to being provided below the periphery portion 44, the gate periphery trench portions 43 may be provided also below an extending portion 46-1 positioned at a Y-axis positive direction end portion and below an extending portion 46-4 positioned at a Y-axis negative direction end portion. The gate periphery trench portion 43 may be provided as one continuous portion so as to form a quadrangular frame-like form below the extending portion 46-1, periphery portion 44-1, extending portion 46-4 and periphery portion 44-2. Corresponding to this, the contact portion 49 also may be provided as one continuous portion so as to form a quadrangular frame-like form.

FIG. 3 is a figure showing a cross section taken along B-B in FIG. 2. The cross section taken along B-B is a cross section that is parallel with the X-Z plane and passes through a gate trench portion 60, an emitter trench portions 70 and a gate periphery trench portion 43. The semiconductor substrate 10 has the top surface 12, the bottom surface 14, the P⁺-type well region 20, an N⁻-type drift region 28, an N⁺-type buffer region 34 and the P⁺-type collector region 32. In addition, the semiconductor device 100 further includes a collector electrode 30, the oxide film 36 and the interlayer dielectric film 38.

The bottom surface of the collector region 32 may coincide with the bottom surface 14 of the semiconductor substrate 10. The collector electrode 30 may be provided in contact with the bottom surface 14. The collector electrode 30 may be an aluminum electrode or may also be an aluminum-silicon alloy.

The buffer region 34 may be positioned between the drift region 28 and the collector region 32 in the Z-axis direction. The buffer region 34 may have the function of preventing a depletion layer spreading from the bottom surface of the base region 24 at the time of turn-OFF of the semiconductor device 100 from reaching the collector region 32. The buffer region 34 may be a fieldstop (FS) region that has discrete N-type doping concentration peak values in the depth direction.

The gate trench portion 60 of the present example includes a gate conductive portion 62, a gate trench 63 and a gate insulating film 64. The gate insulating film 64 may be formed to cover the inner wall of the gate trench 63. The gate insulating film 64 may be formed by oxidizing or nitriding a semiconductor on the inner wall of the gate trench 63. The gate insulating film 64 may electrically insulate the gate conductive portion 62 and the semiconductor substrate 10. The gate conductive portion 62 may be formed on the gate insulating film 64 in the gate trench 63. The gate conductive portion 62 may be a conductive material such as polysilicon doped with impurities.

In an IGBT region 90, a channel may be formed in a base region 24 contacting the side wall of a gate trench 63 at the time of gate-ON. Due to electrons introduced into the drift region 28 via the channel and holes introduced from the collector region 32 into the drift region 28, electric conductivity modulation may be caused in the drift region 28. Thereby, current may flow from the collector electrode 30 to the emitter electrode 50.

The emitter trench portion 70 of the present example includes an emitter conductive portion 72, an emitter trench 73 and an emitter insulating film 74. The emitter insulating film 74 may be formed to cover the inner wall of the emitter trench 73. The emitter insulating film 74 may be formed by oxidizing or nitriding a semiconductor on the inner wall of the emitter trench 73. The emitter insulating film 74 may electrically insulate the emitter conductive portion 72 and the semiconductor substrate 10. The emitter conductive portion 72 may be formed on the emitter insulating film 74 in the emitter trench 73. The emitter conductive portion 72 may be a conductive material such as polysilicon doped with impurities.

At the time of gate-ON, a channel is not formed on the side wall of the emitter trench 73. The emitter trench portion 70 may exhibit an effect of enhancing carrier injection (Injection Enhancement effect, IE effect) at the time of gate-ON.

The gate periphery trench portion 43 of the present example includes a gate periphery conductive portion 132, a gate periphery trench 133 and a gate periphery insulating film 134. The gate periphery insulating film 134 may be formed to cover the inner wall of the gate periphery trench 133. The gate periphery insulating film 134 may be formed by oxidizing or nitriding a semiconductor on the inner wall of the gate periphery trench 133. The gate periphery insulating film 134 may electrically insulate the gate periphery conductive portion 132 and the semiconductor substrate 10. The gate periphery conductive portion 132 may be formed on the gate periphery insulating film 134 in the gate periphery trench 133. The gate periphery conductive portion 132 may be a conductive material such as polysilicon doped with impurities.

The gate trench portion 60, emitter trench portion 70 and gate periphery trench portion 43 may respectively be provided at predetermined depth positions from the top surface 12 of the semiconductor substrate 10. The gate trench 63, emitter trench 73 and gate periphery trench 133 may have bottom portions at the same depth position, by being formed at a single step. In the present example, the bottom portions of the gate trench 63, emitter trench 73 and gate periphery trench 133 are provided at positions that are shallower than a bottom portion of the $P^+$-type well region 20 and are at the same depth. Although not illustrated, the bottom portions of the gate trench 63, emitter trench 73 and gate periphery trench 133 may be deeper than the boundary between the base regions 24 and the drift region 28.

The gate insulating film 64, emitter insulating film 74 and gate periphery insulating film 134 may be the same material, and may be formed at a single step. In the present example, the gate insulating film 64, emitter insulating film 74 and gate periphery insulating film 134 are silicon oxide films. In addition, the gate conductive portion 62, emitter conductive portion 72 and gate periphery conductive portion 132 also may be the same material, and may be formed at a single step. In the present example, the gate conductive portion 62, emitter conductive portion 72 and gate periphery conductive portion 132 are polysilicon doped with phosphorus (P).

The oxide film 36 may be provided in contact with the top surface 12. The oxide film 36 may also be formed at the same time when the gate insulating film 64 or the like is formed. For example, the gate insulating film 64 and the oxide film 36 are silicon dioxide films formed by performing thermal oxidation of a silicon substrate. Therefore, the oxide film 36 is provided on the inner walls and bottom portions of the gate trench 63, emitter trench 73 and the gate periphery trench 133, but not provided at upper portions.

In the present example, an extending portion 46-2 of the gate metal layer 40 electrically connects with the gate conductive portion 62 through the contact portion 66. Similarly, the periphery portion 44-2 of the gate metal layer 40 electrically connects with the gate periphery conductive portion 132 through the contact portion 49. In the gate metal layer 40, the boundary between the periphery portion 44-2 and the extending portion 46-2 is indicated with a broken line.

Figure 4:
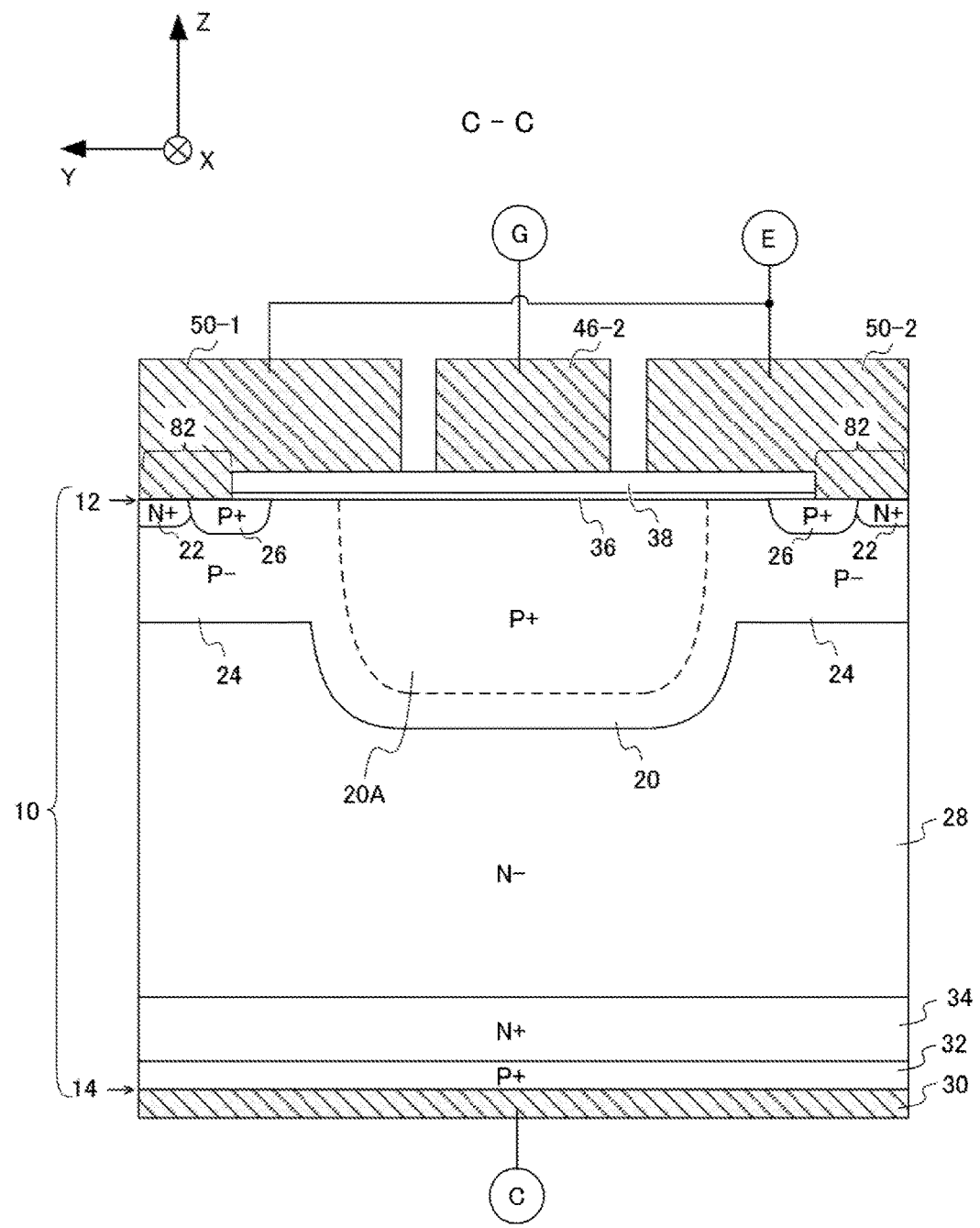
FIG. 4 is a figure showing a cross section taken along C-C in FIG. 2.

FIG. 4 is a figure showing a cross section taken along C-C in FIG. 2. The cross section taken along C-C is a cross section that is parallel with the Y-Z plane and passes through a first region 50-1 and second region 50-2 of the emitter electrode 50 and the extending portion 46-2. Emitter regions 22 and contact regions 26 may be provided at positions shallower than the base region 24. The emitter regions 22 and contact regions 26 of the present example electrically connect with the emitter electrode 50 through openings in the oxide film 36 and the interlayer dielectric film 38. The base region 24 is provided at a position shallower than the well region 20. That is, a bottom portion of the base region 24 is closer to the top surface 12 than the well region 20 is. A portion 20A with doping concentration higher than that of the base region 24 in the well region 20 is indicated with a broken line.

FIG. 5A is a figure showing a cross section taken along D-D in FIG. 2. The cross section taken along D-D is a cross section that is parallel with the Y-Z plane and passes through a first region 50-1 and second region 50-2 of the emitter electrode 50 and the emitter bridge portion 52-1. At part of the bottom surface 14 corresponding to the emitter bridge portion 52-1, the $P^+$-type collector region 32 may be formed.

The gate bridge trench portion 42 includes the gate bridge conductive portion 142, a gate bridge trench 143 and a gate bridge insulating film 144. The gate bridge insulating film 144 may be formed to cover the inner wall of the gate bridge trench 143. The gate bridge insulating film 144 may be formed by oxidizing or nitriding a semiconductor on the inner wall of the gate bridge trench 143. The gate bridge insulating film 144 may electrically insulate the gate bridge conductive portion 142 and the semiconductor substrate 10. The gate bridge conductive portion 142 may be formed on the gate bridge insulating film 144 in the gate bridge trench 143. The gate bridge conductive portion 142 may be a conductive material such as polysilicon doped with impurities. The gate bridge conductive portion 142 also may be formed at the same step as that for the gate trench portions 60, emitter trench portions 70 and gate periphery trench portion 43.

FIG. 5B is a figure showing a cross section taken along D'-D' in FIG. 2. The cross section taken along D'-D' is a cross section that passes through two contact portions 48 and two contact portions 66 arrayed respectively in the X-axis direction. The extending portions 46-2 of the gate metal layer 40 may be detached from the emitter bridge portion 52-1. As shown in the cross section taken along D'-D', the two extending portions 46-2 are detached from each other, sandwiching the emitter bridge portion 52-1 in the X-axis direction. The extending portions 46-2 of the present example electrically connect to gate conductive portions 62 of gate trench portions 60 and the gate bridge conductive portion 142 of the gate bridge trench portion 42. In addition, the emitter bridge portion 52-1 of the present example is electrically insulated from the gate bridge conductive portion 142 by the interlayer dielectric film 38 and the oxide film 36.

Figure 6:
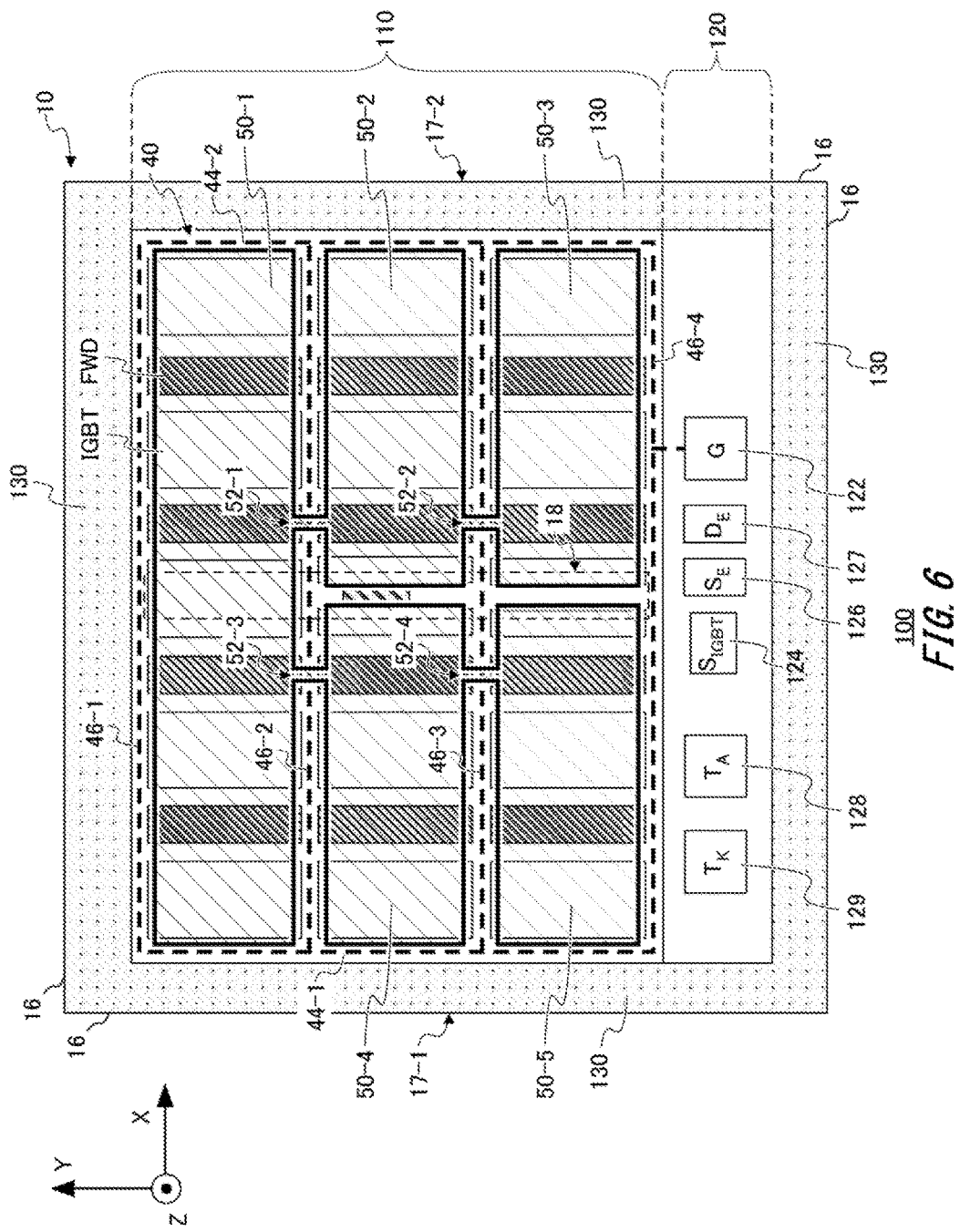
FIG. 6 is a figure showing the top view of FIG. 1 together with an emitter electrode added thereto.

FIG. 6 is a figure showing the top view of FIG. 1 together with the emitter electrode 50 added thereto. The emitter electrode 50 of the present example includes, in addition to the first region 50-1 and the second region 50-2, a third region 50-3, a fourth region 50-4 and a fifth region 50-5. In addition, the emitter electrode 50 of the present example includes, in addition to the emitter bridge portion 52-1, emitter bridge portions 52-2, 52-3, 52-4 and 52-4.

Each among the first region 50-1 to the fifth region 50-5 may be provided in belt-like forms within predetermined ranges. In the present example, the first region 50-1, the second region 50-2 and fourth region 50-4, and the third region 50-3 and fifth region 50-5 are provided in this order from the periphery 16 located in the Y-axis positive direction. In addition, the first region 50-1, the second region 50-2 and fourth region 50-4, and the third region 50-3 and fifth region 50-5 are detached from each other in the Y-axis direction.

The first region 50-1 of the present example is provided continuously from above an IGBT region 90 positioned at an X-axis positive direction end portion to above an IGBT region 90 positioned at an X-axis negative direction end portion. In contrast to this, the second region 50-2 and fourth region 50-4 are detached from each other at the middle portion 18. Similarly, the third region 50-3 and fifth region 50-5 are detached from each other at the middle portion 18.

The emitter bridge portion 52 may electrically connect two regions of the emitter electrode 50. In the present example, the emitter bridge portion 52-1 electrically connects the first region 50-1 and the second region 50-2, and the emitter bridge portion 52-2 electrically connects the second region 50-2 and the third region 50-3. In addition, the emitter bridge portion 52-3 electrically connects the first region 50-1 and the fourth region 50-4, and the emitter bridge portion 52-5 electrically connects the fourth region 50-4 and the fifth region 50-5. Thereby, the respective regions of the emitter electrode 50 can be at the same potential.

However, an emitter bridge portion 52 may not be provided between at least two FWD regions 92 that are among a plurality of FWD regions 92 and detached from each other in the Y-axis direction. By reducing the number of the emitter bridge portions 52 and making them sparse, the number of the gate bridge trench portions 42 can be reduced as compared with the case where an emitter bridge portion 52 is provided between every two adjacent FWD regions 92 that are detached from each other in the Y-axis direction. Thereby, because the area of the extending portions 46 of the gate metal layer 40 having lower resistivity than that of the gate bridge trench portion 42 can be increased, the gate resistance of the semiconductor device 100 can be lowered.

The emitter bridge portion 52 may be provided at least between two FWD regions 92 arranged close to the middle portion 18 of the semiconductor substrate 10 in a top view of the semiconductor substrate 10. Thereby, because as compared with the case where an emitter bridge portion 52 is provided between every two adjacent FWD regions 92 detached from each other in the Y-axis direction, the area of the extending portions 46 of the gate metal layer 40 having higher thermal conductivity than that of the gate bridge trench portion 42 can be increased; therefore, the heat dissipation property of the semiconductor device 100 improves. Although in the present example, emitter bridge portions 52 are provided between FWD regions 92 positioned closer to the middle portion 18 than to the gate periphery portions 44, emitter bridge portions 52 are not provided between FWD regions 92 positioned closer to the gate periphery portions 44 than to the middle portion 18.

On the other hand, if the area of the semiconductor device (semiconductor chip) in the X-Y plane becomes larger than, for example, 1 cm$^2$, emitter bridge portions 52 may be provided between every two adjacent FWD regions 92 that are detached from each other in the Y-axis direction.

Figure 7A:
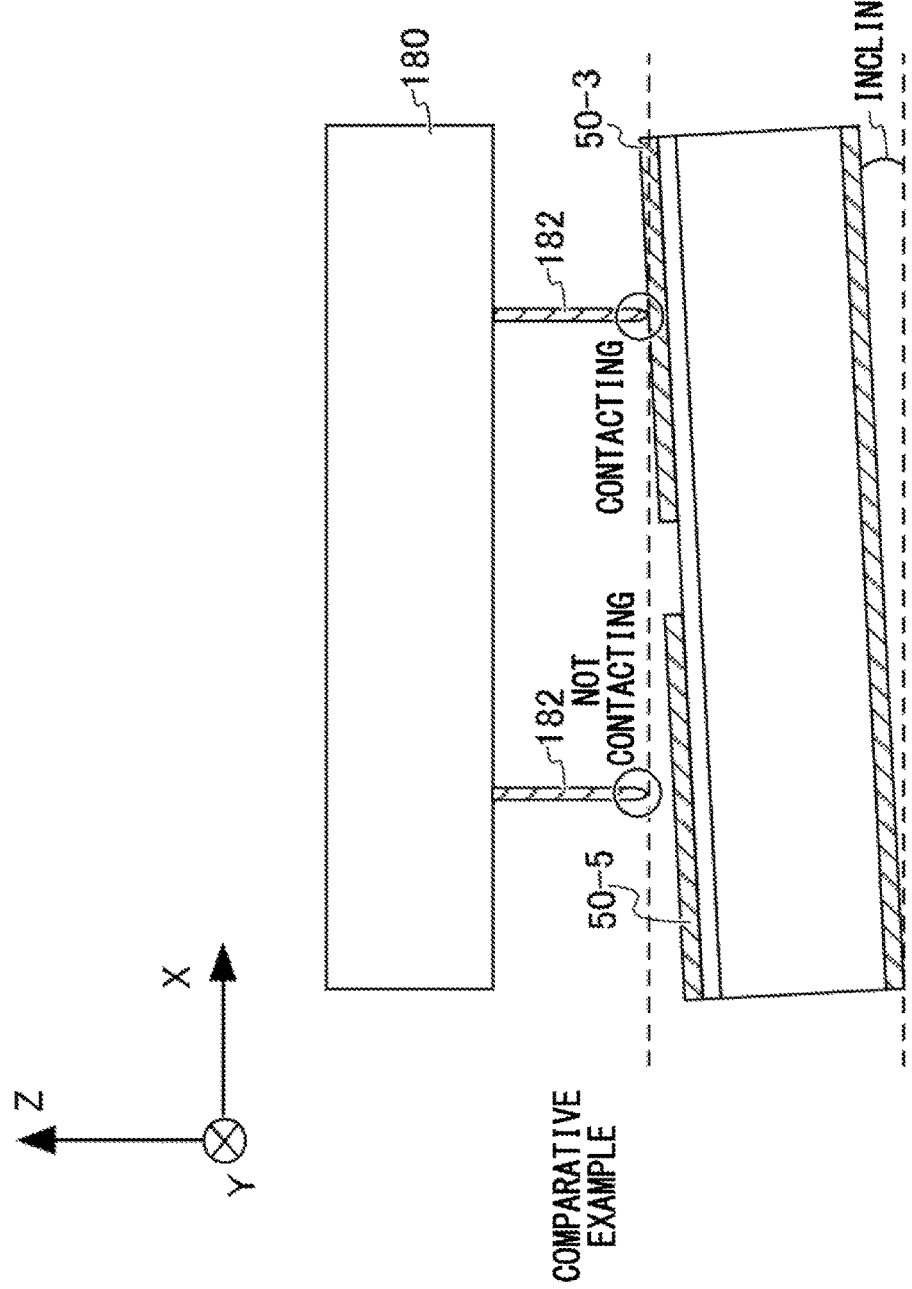
FIG. 7A is a side view in a comparative example in which respective regions of an emitter electrode 50 are electrically separated.

FIG. 7A is a side view in a comparative example in which respective regions of the emitter electrode 50 are electrically separated. Generally, a test is conducted to check whether a plurality of semiconductor devices 100 satisfy desired electrical properties, before assembling the semiconductor devices 100 into a semiconductor module by connecting each of them by wires or the like. For example, an electrical property test is conducted by causing a probe 182 to contact the emitter electrode 50 of a semiconductor device 100. The probe 182 of the present example is a needle protruding download from a probe card 180 which is a jig.

If the first region 50-1 to the fifth region 50-5 are electrically separated from each other, it is necessary to cause a probe 182 to contact the respective regions individually or to cause a plurality of probes 182 to contact the respective regions at once. Because the work time required for a test becomes long if a probe 182 is caused to contact the respective regions individually, it is desired to conduct a test by causing a plurality of probes 182 to contact the respective regions at once. However, if the first region 50-1 to the fifth region 50-5 are independent of each other, as shown in FIG. 7A, there is a fear that even a slight inclination of the semiconductor substrate 10 may inhibit secured contact between all the probes 182 and the respective regions.

FIG. 7B is a side view in the present embodiment in which respective regions of the emitter electrode 50 are electrically connected. In the present embodiment, an electrical property test can be conducted by causing a probe 182 to contact only any one region, without having to cause a probe 182 to contact all the regions of the first region 50-1 to the fifth region 50-5. Therefore, even if the semiconductor substrate 10 is slightly inclined, electrical conduction between the probe 182 and the entire emitter electrode 50 can be secured. In addition, the work time required for the test can be made short. In addition, because all the regions of the emitter electrode 50 are connected, current balance at the emitter electrode 50 can be improved as compared with the case where respective regions of the emitter electrode 50 are electrically separated. In addition, the heat dissipation property of the emitter electrode 50 can also be improved. The present example is advantageous over the case where respective electrically separated regions of the emitter electrode 50 are connected by stitching or plating, in terms of ease of conducting electrical property tests and improvement of current balance and heat dissipation properties. In particular, because if nickel is used for plating, the thermal conductivity of nickel is lower than the thermal conductivity of aluminum, it is advantageous to provide the emitter bridge portion 52 of the present example in terms of keeping heat of the entire emitter electrode 50 uniform.

(Manufacturing Method)

Next, one example of methods of manufacturing the semiconductor device 100 is explained. E means the base, which is 10 herein, and for example 1E+16 cm$^{-3}$ means $1 \times 10^{16}$ cm$^-$.

First, the semiconductor substrate 10 which is of the same conductivity and has the same doping concentration as the N$^-$-type drift region 28 is prepared. Next, an etching mask having a predetermined pattern is provided on the top surface 12 of the semiconductor substrate 10, and trenches of the gate trench portions 60, the gate bridge trench portion 42, the gate periphery trench portion 43 and the emitter trench portions 70 are formed.

At this time, the width of each trench and the opening width of a mask for forming each trench are made equal to each other. After forming the trenches, gate insulating films 64, gate bridge insulating films 144, gate periphery insulating films 134 and emitter insulating films 74 are formed on the inner walls of the respective trenches. At this time, the oxide film 36 may also be formed. Then, gate conductive portions 62, gate bridge conductive portions 142, gate periphery conductive portions 132 and emitter conductive portions 72 are formed to fill the trenches, in contact with the respective insulating films formed on the inner walls.

Next, P-type impurities are implanted selectively from the top surface 12 side of the semiconductor substrate 10, and thermal treatment is performed at temperature of approximately 1100° C. and for approximately two hours. Thereby, the P$^+$-type well region 20, P-type base regions 24 and P$^+$-type contact regions 26 are respectively formed on the entire top surface 12 of the semiconductor substrate 10. The P-type impurities may be boron (B). The P-type impurities may be implanted to the P$^+$-type well region 20, P$^-$-type base regions 24 and P$^+$-type contact regions 26 at the doses of 5.5E+15 cm$^{-2}$, 2.5E+13 cm$^{-2}$ and 3E+15 cm$^{-2}$, respectively.

Next, N-type impurities are implanted selectively from the top surface 12 side of the semiconductor substrate 10. Thereby, N$^+$-type emitter regions 22 are formed selectively. The N-type impurities may be any of or both phosphorus (P) and arsenic (As). The N-type impurities may be implanted to the N$^+$-type emitter regions 22 at the dose of 5E+19 cm$^{-2}$. Thereafter, the interlayer dielectric film 38 is formed on the top surface 12 side of the semiconductor substrate 10, and openings for the contact portions 48, 49, 66 and 76 are provided to the interlayer dielectric film 38 by selective etching. In addition, openings for the contact portions 82, 84, 85 and 86 are provided to the oxide film 36 and interlayer dielectric film 38 by selective etching.

Next, metallic films for formation of the gate metal layer 40 and emitter electrode 50 are formed on the interlayer dielectric film 38, and are subjected to patterning. Thereby, the periphery portions 44 and extending portions 46 of the gate metal layer 40 and the emitter electrode 50 having the first region 50-1 to fifth region 50-5 and emitter bridge portion 52 are formed.

Next, N-type impurities are implanted from the bottom surface 14 side of the semiconductor substrate 10 to form the N$^+$-type buffer region 34. For example, protons (H$^+$) may be implanted multiple times at a different dose of approximately 1.0E+14 cm$^{-2}$ from the bottom surface 14 side. Subsequently, thermal treatment is performed at temperature of approximately 300 to 400° C. Thereby, VOH defects consisting of hydrogen introduced into the semiconductor substrate 10 by proton implantation and oxygen and vacancies in the semiconductor substrate 10 are formed. These VOH defects become the donor (hydrogen donor). The hydrogen donor may function as an N-type dopant in the N$^+$-type buffer region 34.

Next, P-type impurities are implanted from the bottom surface 14 of the semiconductor substrate 10 in regions corresponding to IGBT regions 90. Thereby, the P$^+$-type collector region 32 is formed. For example, the P-type impurities are implanted from the bottom surface 14 side at the dose equal to or higher than 1.0E+13 cm$^{-2}$ and equal to or lower than 4.0E+13 cm$^{-2}$. In addition, the N-type impurities are implanted from the bottom surface 14 of the semiconductor substrate 10 in order to form N$^+$-type cathode regions 33 in regions corresponding to FWD regions 92. For example, the N-type impurities are implanted at the dose equal to or higher than 1.0E+14 cm$^{-2}$ and equal to or lower than 1.0E+16 cm$^{-2}$ from the bottom surface 14 side. Thereafter, the bottom surface 14 is irradiated with laser to anneal the semiconductor substrate 10. Thereby, the P-type and N-type impurities are activated. Last, the collector electrode 30 to contact the bottom surface 14 is formed.

Figure 8:
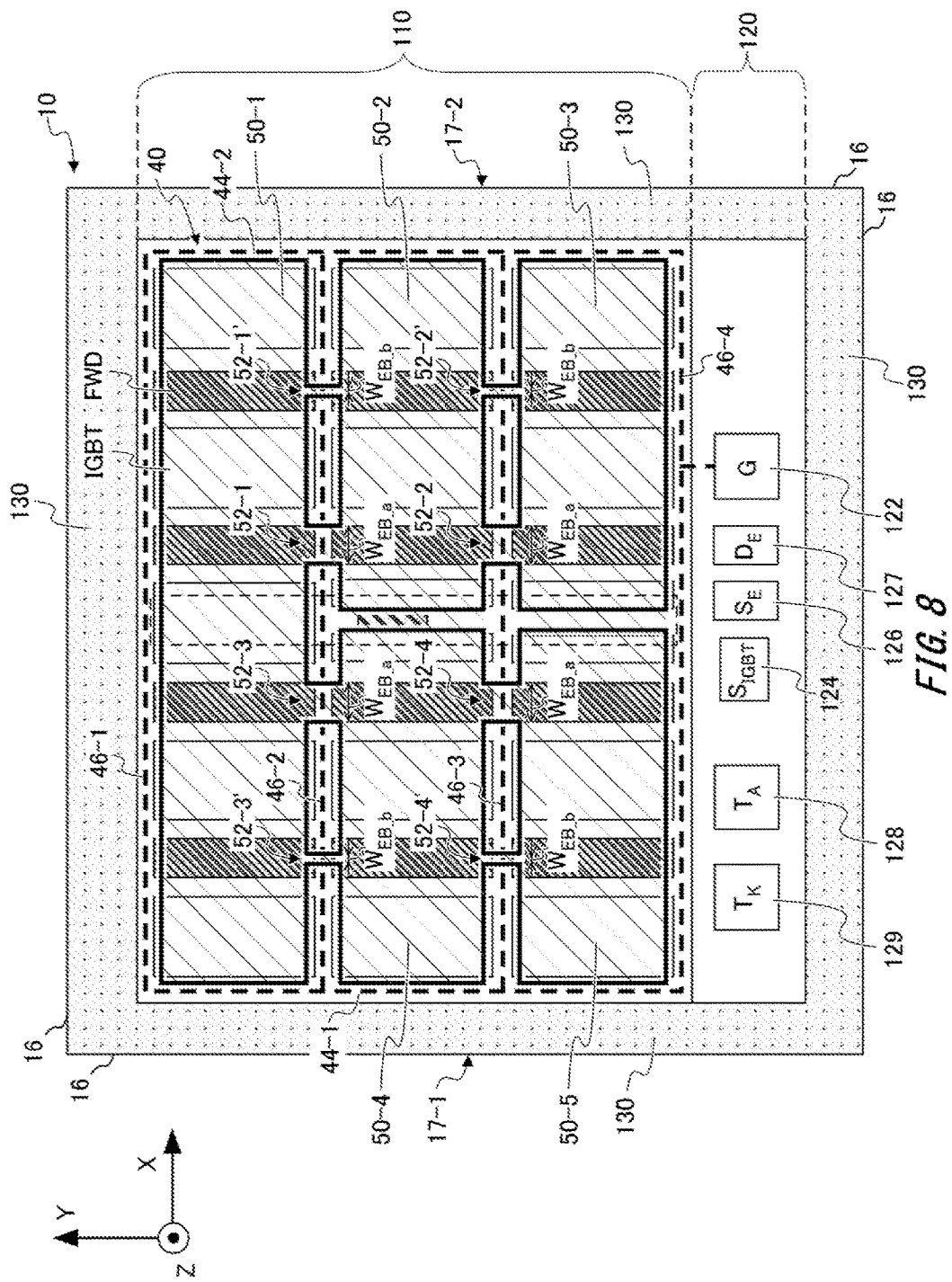
FIG. 8 is a figure showing a variant of the emitter electrode 50.

FIG. 8 is a figure showing a variant of the emitter electrode 50. FIG. 8 is the top view of the semiconductor substrate 10 which is the same as FIG. 1, FIG. 2 and FIG. 6. In the present example, an emitter bridge portion 52 is provided between every two adjacent FWD regions 92 that are detached from each other in the Y-axis direction. However, in the present example, the width of the emitter bridge portions 52-1, 52-2, 52-3 and 52-4 each provided between two FWD regions 92 arranged close to the middle portion 18 is made larger than the width of emitter bridge portions 52-1', 52-2', 52-3' and 52-4' each provided between two FWD regions 92 arranged away from the middle portion 18. In the present example, the emitter bridge portions 52-1, 52-2, 52-3 and 52-4 have a width $W_{EB\_a}$ in the X-axis direction. In contrast to this, the emitter bridge portions 52-1', 52-2', 52-3' and 52-4' have a width $W_{EB\_b}$ in the X-axis direction. The width $W_{EB\_a}$ is larger than the width $W_{EB\_b}$.

In the present example, it is necessary to separate the extending portions 46 of the gate metal layer 40 at portions near the respective emitter bridge portions 52, and to electrically connect the separated extending portion 46 by gate bridge trench portions 42 at portions below the respective emitter bridge portions 52. Therefore, in terms of resistivity, it might be inferior to the first embodiment. However, because electrical connection between the respective regions of the emitter electrode 50 can be made surer as compared with the first embodiment, the current balance and heat dissipation property at the emitter electrode 50 can be improved.

Figure 9:
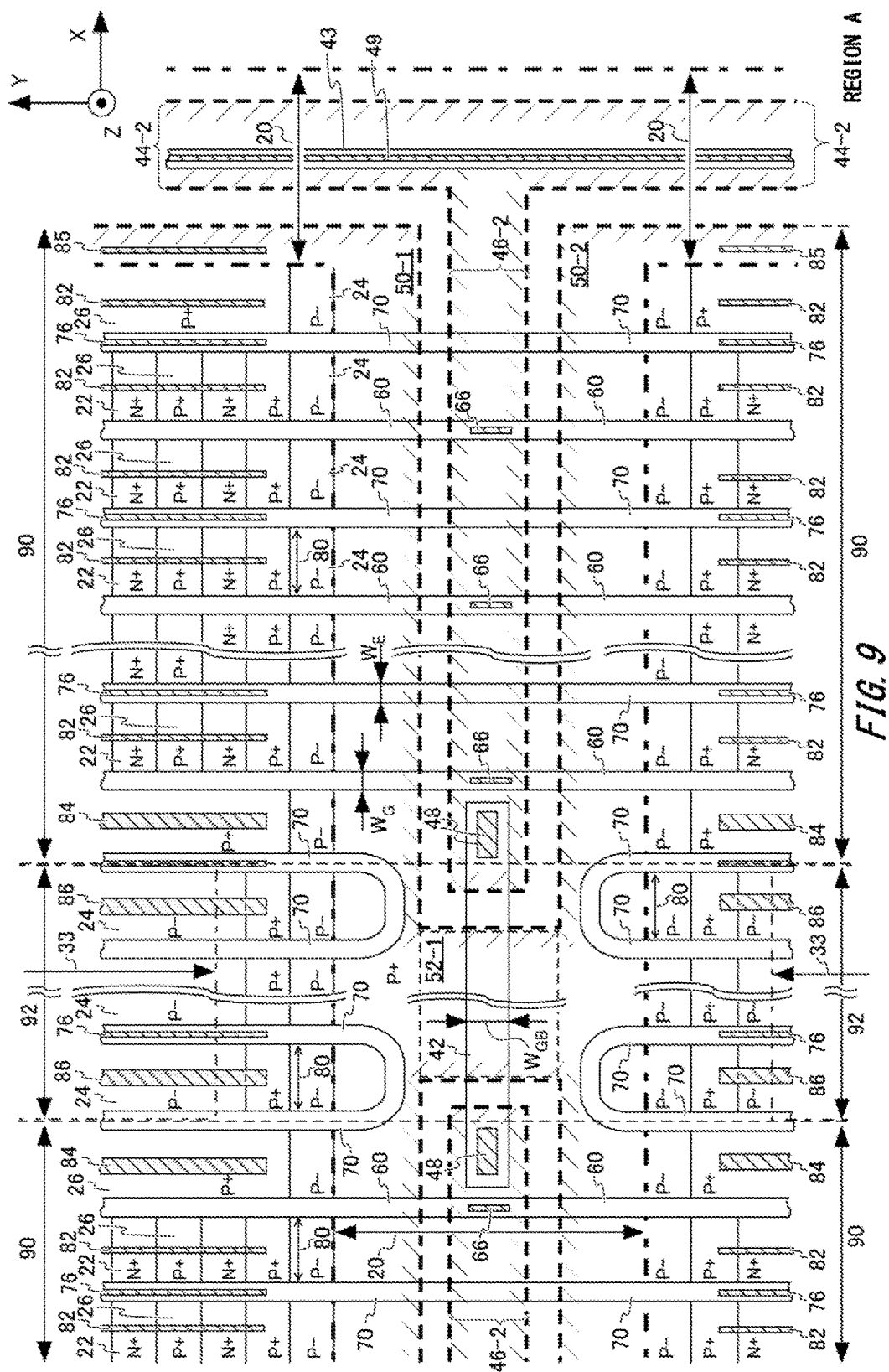
FIG. 9 is a figure showing a first variant of a gate bridge trench portion 42.

FIG. 9 is a figure showing a first variant of the gate bridge trench portion 42. In the present example, a width $W_{GB}$ of the gate bridge trench portion 42 in the Y-axis direction is larger than both a width $W_E$ of the emitter trench portions 70 in the X-axis direction and a width $W_G$ of gate trench portions 60 in the X-axis direction. The gate metal layer 40 needs to supply the gate potential to each gate trench portion 60 in a plurality of IGBT regions 90. Therefore, lowering the resistance value of the gate bridge trench portion 42 by making the width $W_{GB}$ of the gate bridge trench portion 42 relatively larger is effective in preventing in lowering of the gate potential to be supplied to each gate trench portion 60.

Figure 10:
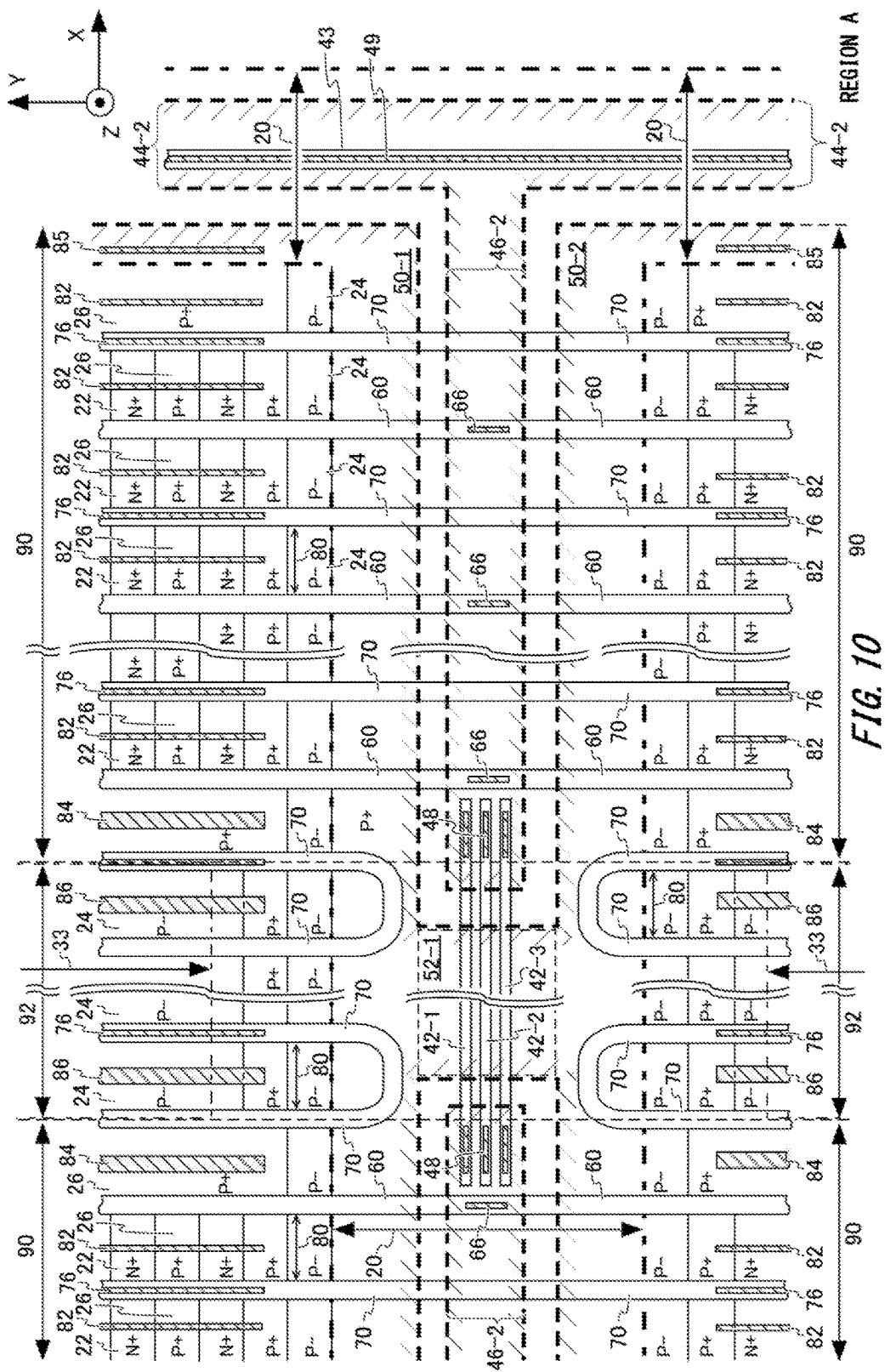
FIG. 10 is a figure showing a second variant of the gate bridge trench portion 42.

FIG. 10 is a figure showing a second variant of the gate bridge trench portion 42. In the present example, a plurality of the gate bridge trench portions 42 are provided being separated from each other in the Y-axis direction. In the present example, the width of each gate bridge trench portion 42 in the Y-axis direction may be equal to or may also be smaller than the width, in the Y-axis direction, of the gate bridge trench portion 42 in the first embodiment. However, the total of the widths of the plurality of gate bridge trench portions 42 in the Y-axis direction may be larger than the width, in the Y-axis direction, of the gate bridge trench portion 42 in the first embodiment. In the present example, the width of the gate bridge trench portions 42 is increased effectively. Thereby, the resistance value of the gate bridge trench portions 42 can be lowered.

Figure 11:
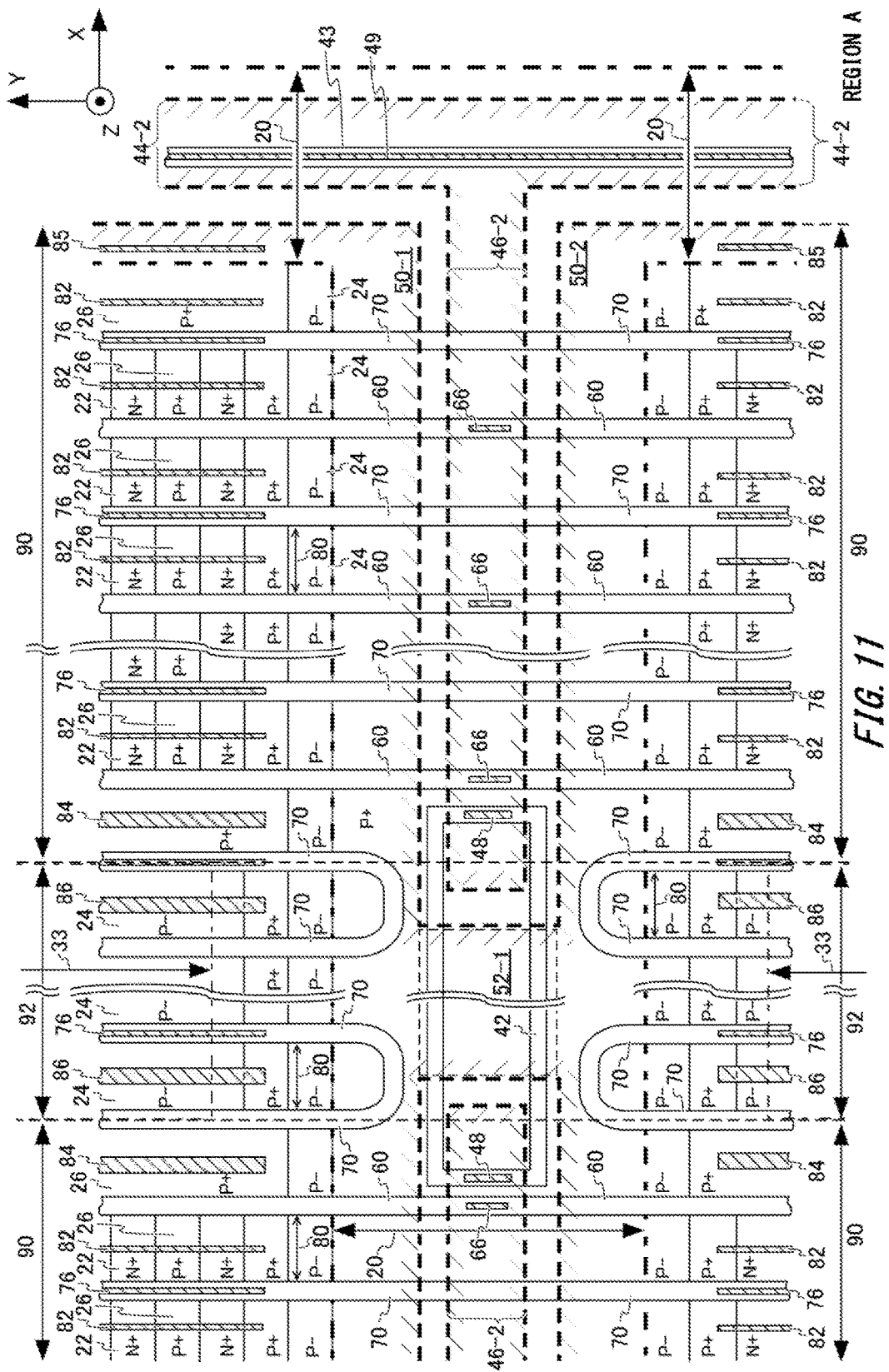
FIG. 11 is a figure showing a third variant of the gate bridge trench portion 42.

FIG. 11 is a figure showing a third variant of the gate bridge trench portion 42. In the present example, the gate bridge trench portions 42 provided annularly correspond to a first connecting portion. The contact portions 48 that connect the extending portions 46 of the gate metal layer 40 and the gate bridge trench portions 42 may be provided to the gate bridge trench portions 42 that are parallel with the Y-axis direction. A portion of the gate bridge trench portions 42 that is parallel with the X-axis direction may be formed between the emitter electrode 50 and the extending portions 46 of the gate metal layer 40 that are separated from each other while sandwiching the emitter bridge portion 52-1. In the present example also, the width of each gate bridge trench portion 42 in the Y-axis direction may be equal to or may also be smaller than the width, in the Y-axis direction, of the gate bridge trench portion 42 in the first embodiment. In the present example also, the resistance value of the gate bridge trench portions 42 can be lowered by increasing the width of the gate bridge trench portions 42 effectively.

Figure 12:
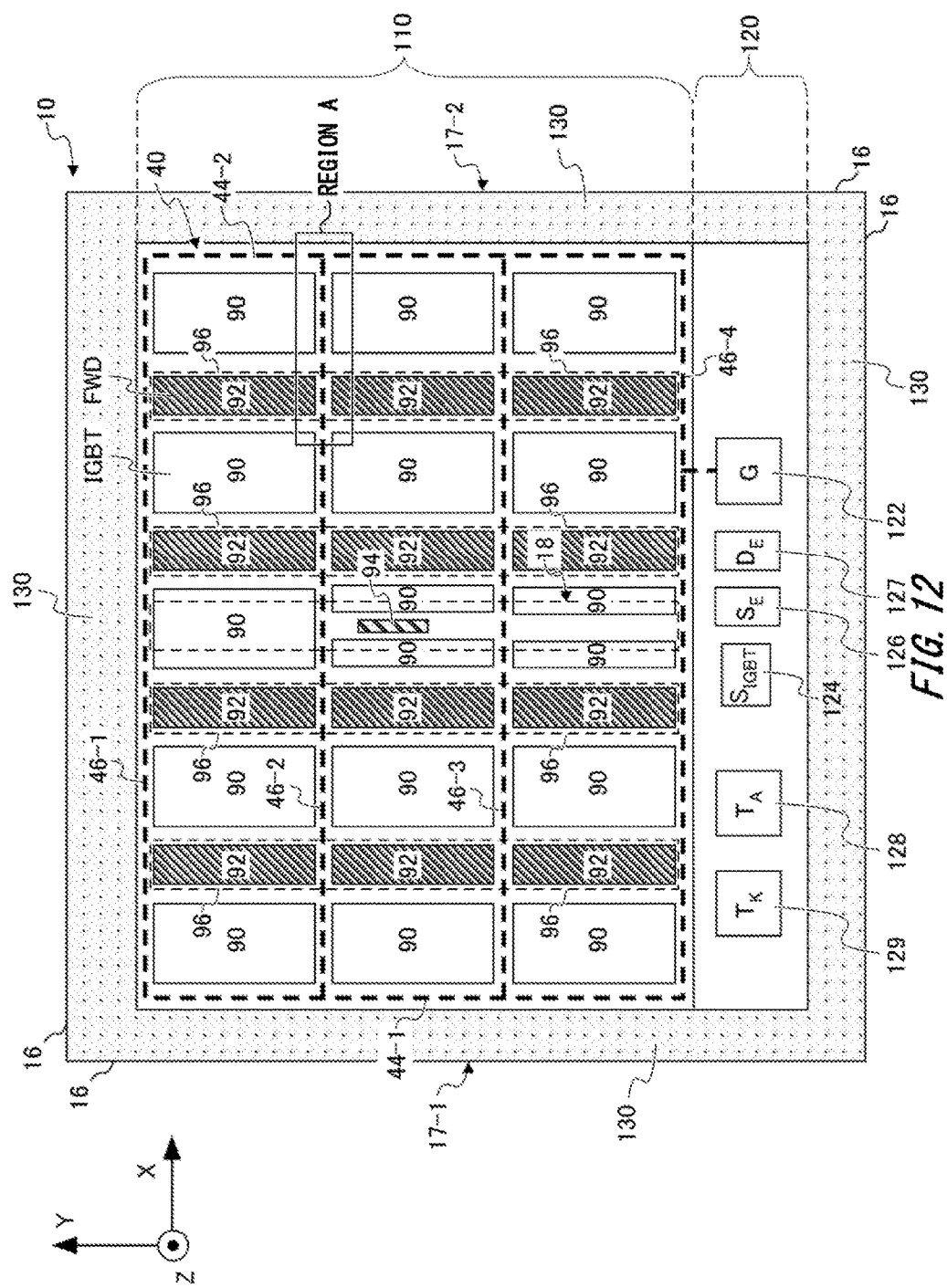
FIG. 12 is a top view showing top surface killer regions 96.

FIG. 12 is a top view showing top surface killer regions 96. In FIG. 12, in order to facilitate understanding, the gate metal layer 40 and the emitter electrode 50 are omitted. The semiconductor substrate 10 in the first embodiment may also have the top surface killer regions 96. The top surface killer regions 96 of the present example are defect regions provided in a predetermined depth range from the top surface 12 by irradiation of helium ions from the top surface 12 side or bottom surface 14 side of the semiconductor substrate 10. The top surface killer regions 96 may be provided, continuously along the Y-axis direction, to FWD regions 92 and between FWD regions 92 detached from each other in the Y-axis direction. Furthermore, the top surface killer regions 96 may spread from the FWD regions 92 to enter IGBT regions 90 adjacent to the FWD regions 92. Thereby, the lifetime of holes in the FWD regions 92 can be adjusted to reduce loss at the time of reverse recovery. In the present example, the top surface killer regions 96 having the same width in the X-axis direction as that of the FWD regions 92 are provided also between FWD regions 92 that are adjacent to each other in the Y-axis direction.

Figure 13:
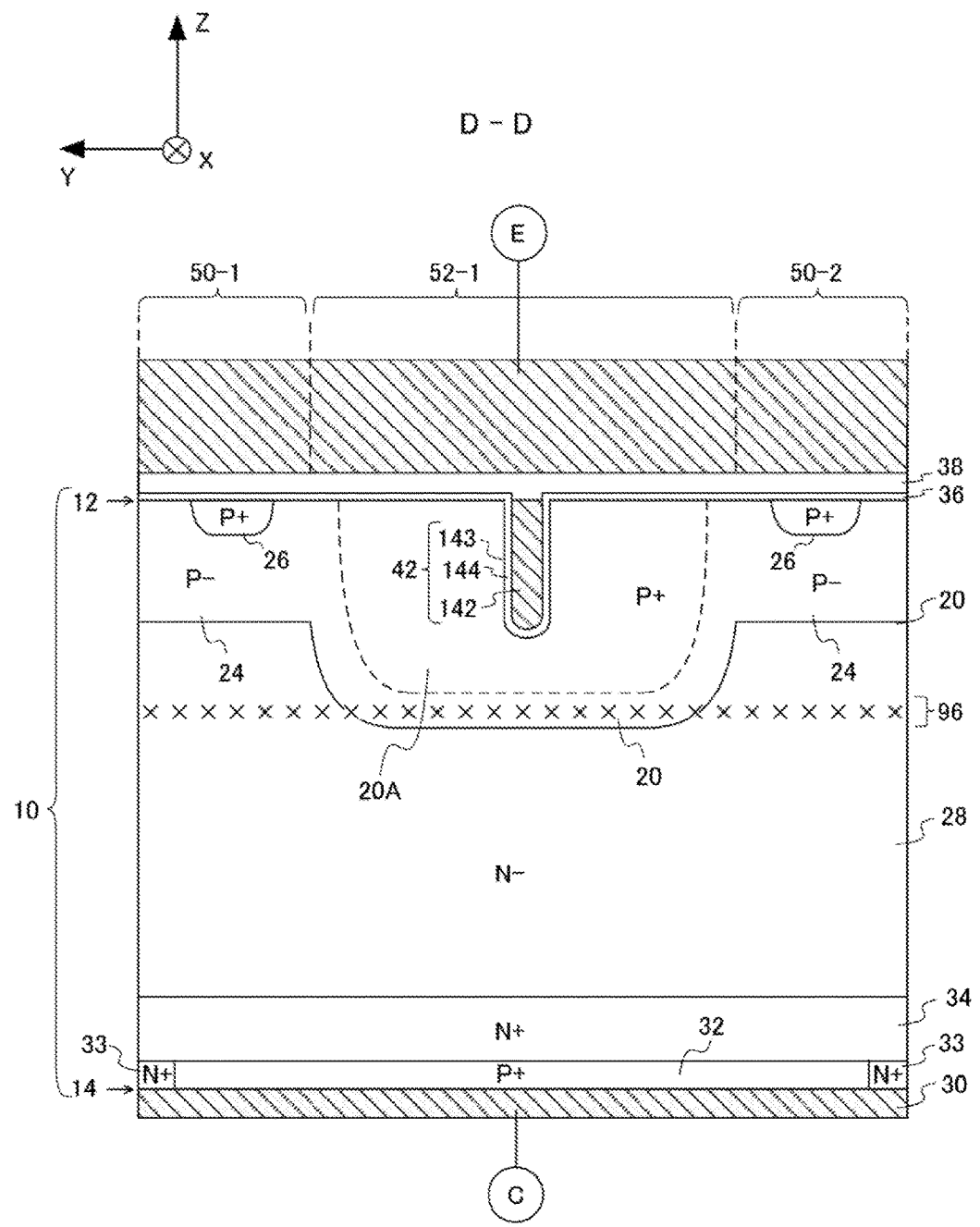
FIG. 13 is a figure showing a cross section taken along D-D in FIG. 2.

FIG. 13 is a figure corresponding to a cross section taken along D-D in FIG. 2. A difference from FIG. 5A which is a cross section taken along D-D in FIG. 2 is that a top surface killer region 96 is provided. The top surface killer regions 96 may be formed below the bottom surface of the base region 24 or may also be formed below the bottom surface of the well region 20. In addition, it may be formed below a bottom portion of a trench portion. The top surface killer region 96 of the present example is provided above the bottom surface of the well region 20 and near the top surface of the drift region 28 below the bottom surface of a base region which is not illustrated. In another example, the top surface killer region 96 may also be provided between the bottom surface of the well region 20 and respective bottom portions of the gate bridge trench portion 42, gate trench portions 60 and emitter trench portions 70.

Figure 14:
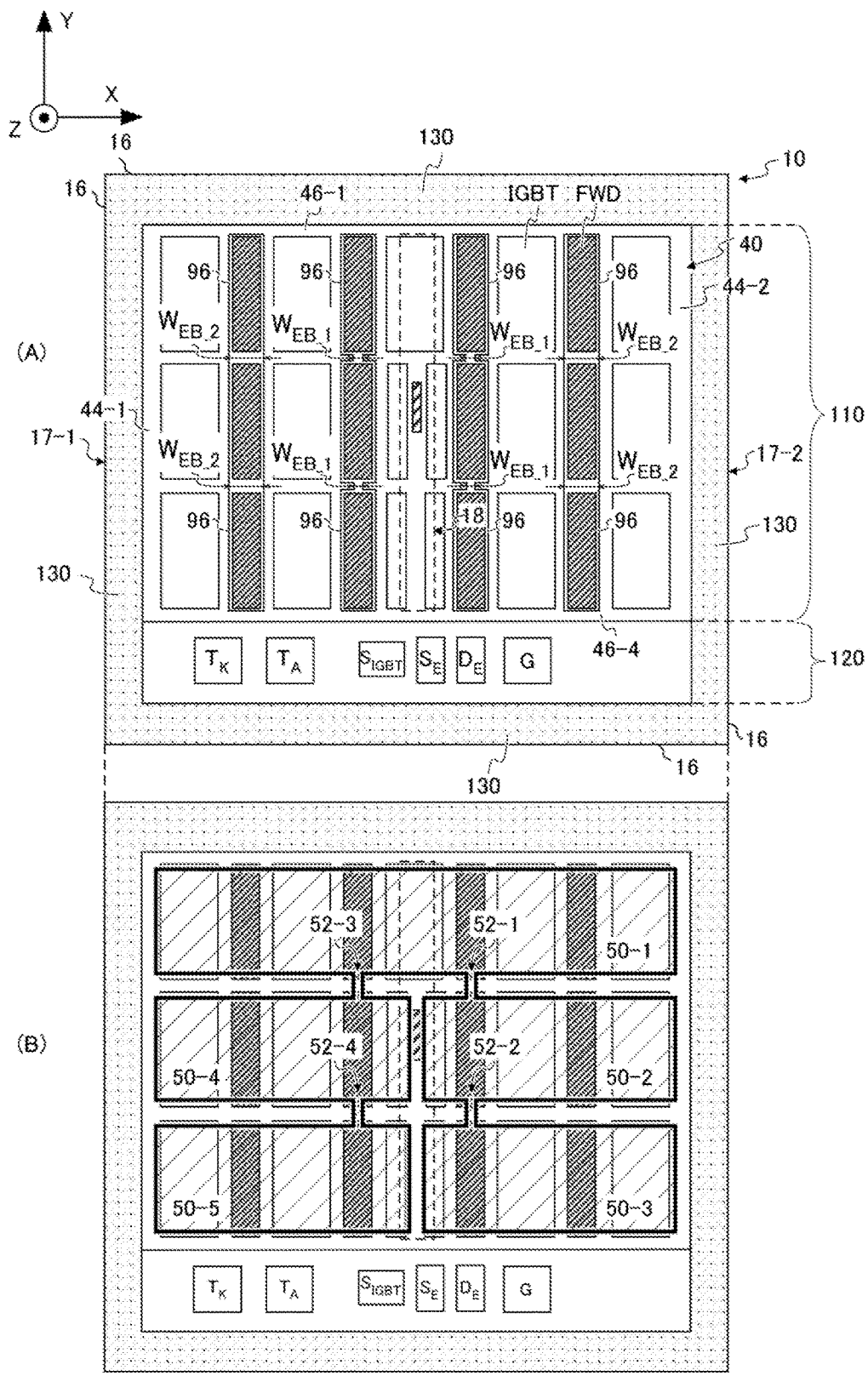
FIG. 14 includes (A) a top view showing a first variant of the top surface killer regions 96, and (B) a top view showing the external form of the emitter electrode 50 in the first embodiment.

(A) in FIG. 14 is a top view showing a first variant of the top surface killer regions 96. (B) in FIG. 14 is a top view showing the external form of the emitter electrode 50 in the first embodiment. For the purpose of facilitating understanding, in (A) in FIG. 14, the periphery portions 44 and extending portions 46 of the gate metal layer 40, and the like are omitted. In addition, the top surface killer regions 96 are indicated with solid lines.

The semiconductor substrate 10 of the present example also has the top surface killer regions 96. However, in the present example, a width $W_{EB\_2}$ of top surface killer regions 96 in the X-axis direction in regions not provided with emitter bridge portions 52 is larger than a width $W_{EB\_1}$ of top surface killer regions 96 in the X-axis direction in regions provided with emitter bridge portions 52. Thereby, because the area of the top surface killer regions 96 can be reduced, defects to be introduced into the semiconductor substrate 10 can be reduced as compared with the example in FIG. 12. The position of each width $W_{EB\_1}$ in (A) in FIG. 14 corresponds to the position of a corresponding one among the emitter bridge portions 52-1 to 52-4 in (B) in FIG. 14.

Figure 15:
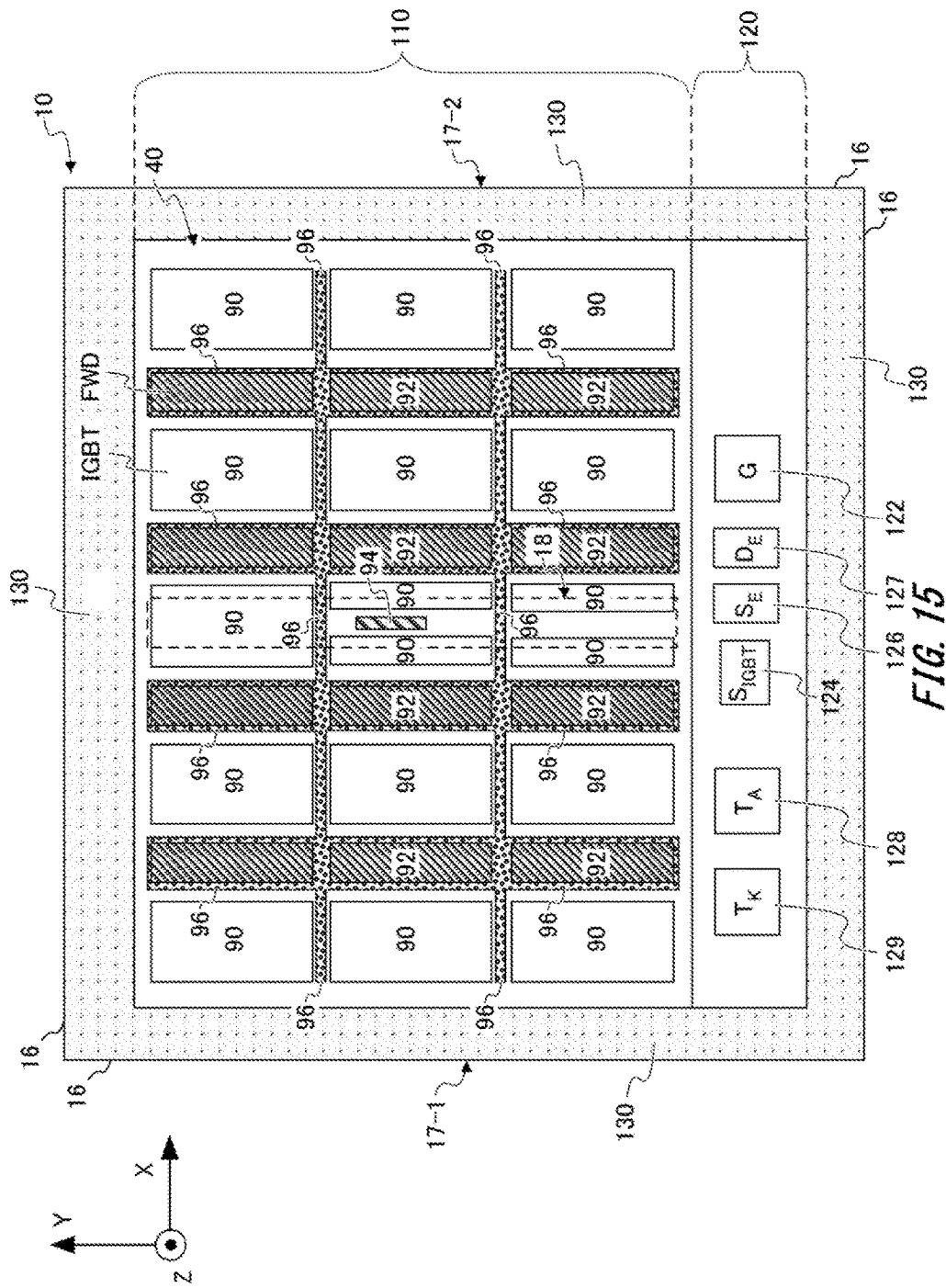
FIG. 15 is a top view showing a second variant of the top surface killer regions 96.

FIG. 15 is a top view showing a second variant of the top surface killer regions 96. For the purpose of facilitating understanding, in FIG. 15 also, the periphery portions 44 and extending portions 46 of the gate metal layer 40, and the like are omitted. In addition, the top surface killer regions 96 are indicated with dots. The top surface killer regions 96 are provided also to FWD regions 92. In the present example, in addition to being provided between FWD regions 92 that are adjacent to each other in the Y-axis direction and to FWD regions 92, top surface killer regions 96 are provided also below the gate bridge trench portion 42 and the extending portions 46 of the gate metal layer 40. That is, the top surface killer regions 96 of the present example extend in the X-axis direction between the FWD regions 92 and between the IGBT regions 90 that are adjacent to each other in the Y-axis direction.

The P$^+$-type well region 20 is provided between the FWD regions 92 and between the IGBT regions 90 that are adjacent to each other in the Y-axis direction. Holes are prone to be accumulated in the P$^+$-type well region 20. In view of this, by arranging the top surface killer regions 96 as in the present example, the amount of holes to be accumulated in the P$^+$-type well region 20 can be reduced.

Figure 16:
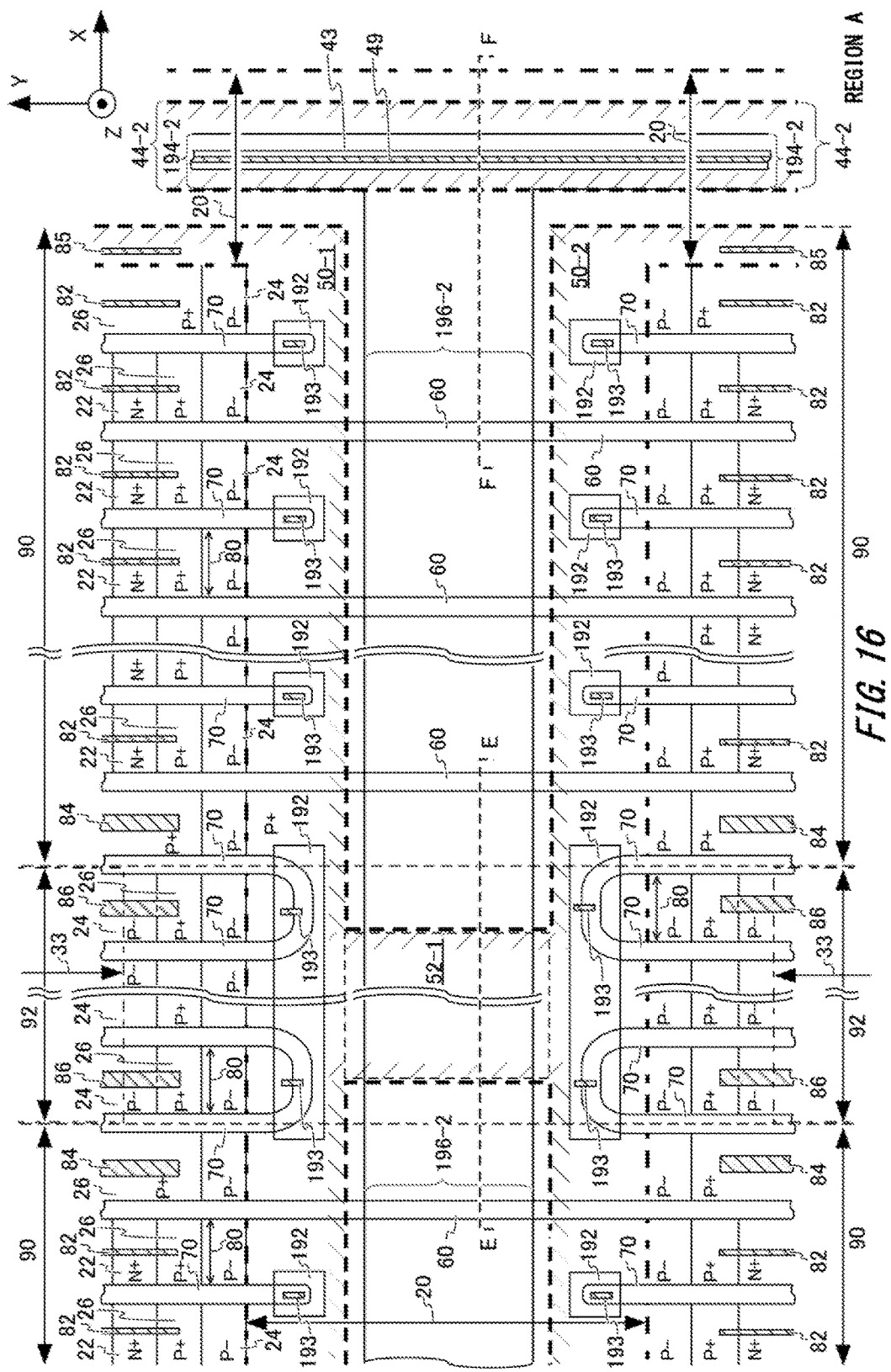
FIG. 16 is an enlarged view of the region A in a second embodiment.

FIG. 16 is an enlarged view of the region A in a second embodiment. The gate metal layer 40 of the present example has the periphery portions 44, but does not have the extending portions 46. The semiconductor device 100 of the present example has a polysilicon wiring layer provided above the top surface 12 of the semiconductor substrate 10. The semiconductor device 100 of the present example has polysilicon wiring layer extending portions 196, in place of the extending portions 46 of the gate metal layer 40 and the gate bridge trench portion 42. The polysilicon wiring layer extending portions 196 are one example of a first connecting portion. The polysilicon wiring layer extending portions 196 are provided also below an emitter bridge portion 52.

The semiconductor device 100 of the present example has island-like connecting portions 192 between emitter conductive portions 72 of emitter trench portions 70 and the emitter electrode 50. The connecting portions 192 may be conductive materials. The connecting portions 192 of the present example are polysilicon layers that are the same as the polysilicon wiring layers. The connecting portions 192 of the present example may be provided at respective Y-axis positive/negative direction end portions of the emitter trench portions 70. The respective connecting portions 192 may electrically connect to the emitter electrode 50 through contact portions 193.

In the present example, the periphery portions 44 of the gate metal layer 40 are provided above a polysilicon wiring layer periphery portion 194. The periphery portions 44 of the present example electrically connect to the periphery portion 194 through openings in the interlayer dielectric film 38. Similar to the gate periphery trench portion 43 and the contact portion 49, the polysilicon wiring layer periphery portion 194 also may be provided as one continuous portion so as to form a quadrangular frame-like form. As explained with reference to FIG. 7B, in the present example also, an advantageous effect attained by the respective regions of the emitter electrode 50 being electrically connected can be attained.

In the present example also, top surface killer regions 96 are provided below the polysilicon wiring layer extending portions 196. In other respects, the configuration may be the same as that in the first embodiment. In the second embodiment also, the variant of the emitter electrode 50 shown in FIG. 8 and the top surface killer regions 96 shown in FIG. 12 to FIG. 15 may also be applied.

Figure 17:
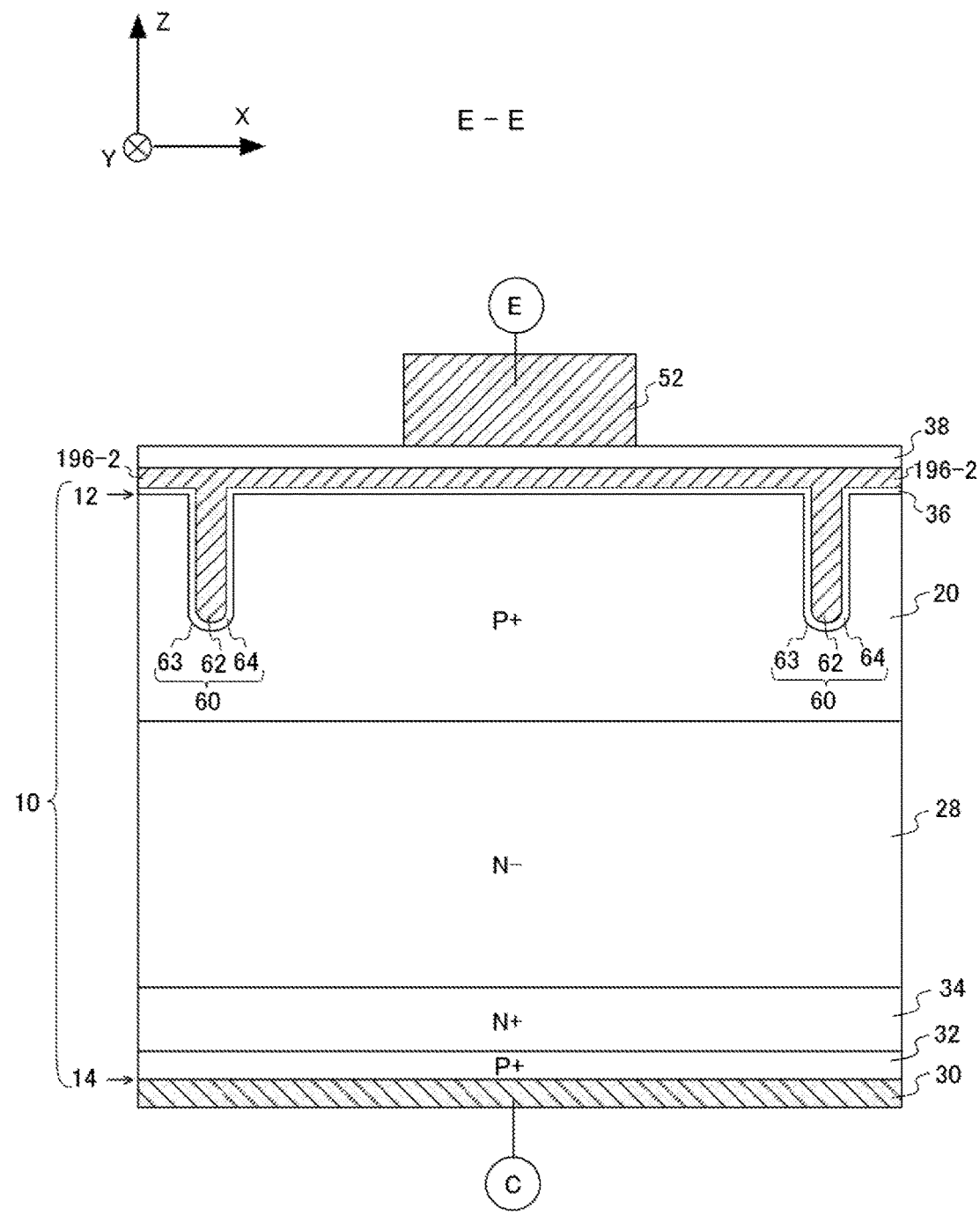
FIG. 17 is a figure showing a cross section taken along E-E in FIG. 16.

FIG. 17 is a figure showing a cross section taken along E-E in FIG. 16. FIG. 17 is a cross section that is parallel with the X-Z plane and passes through a polysilicon wiring layer extending portion 196. The polysilicon wiring layer of the present example is provided in contact with the oxide film 36. The polysilicon wiring layer may contact gate conductive portions 62 of gate trench portions 60. In the present example, the polysilicon wiring layer extending portion 196 contacts the gate conductive portions 62. In addition, the interlayer dielectric film 38 may be positioned on the polysilicon wiring layer. The gate metal layer 40 and the emitter electrode 50 may be positioned on the interlayer dielectric film 38.

Figure 18:
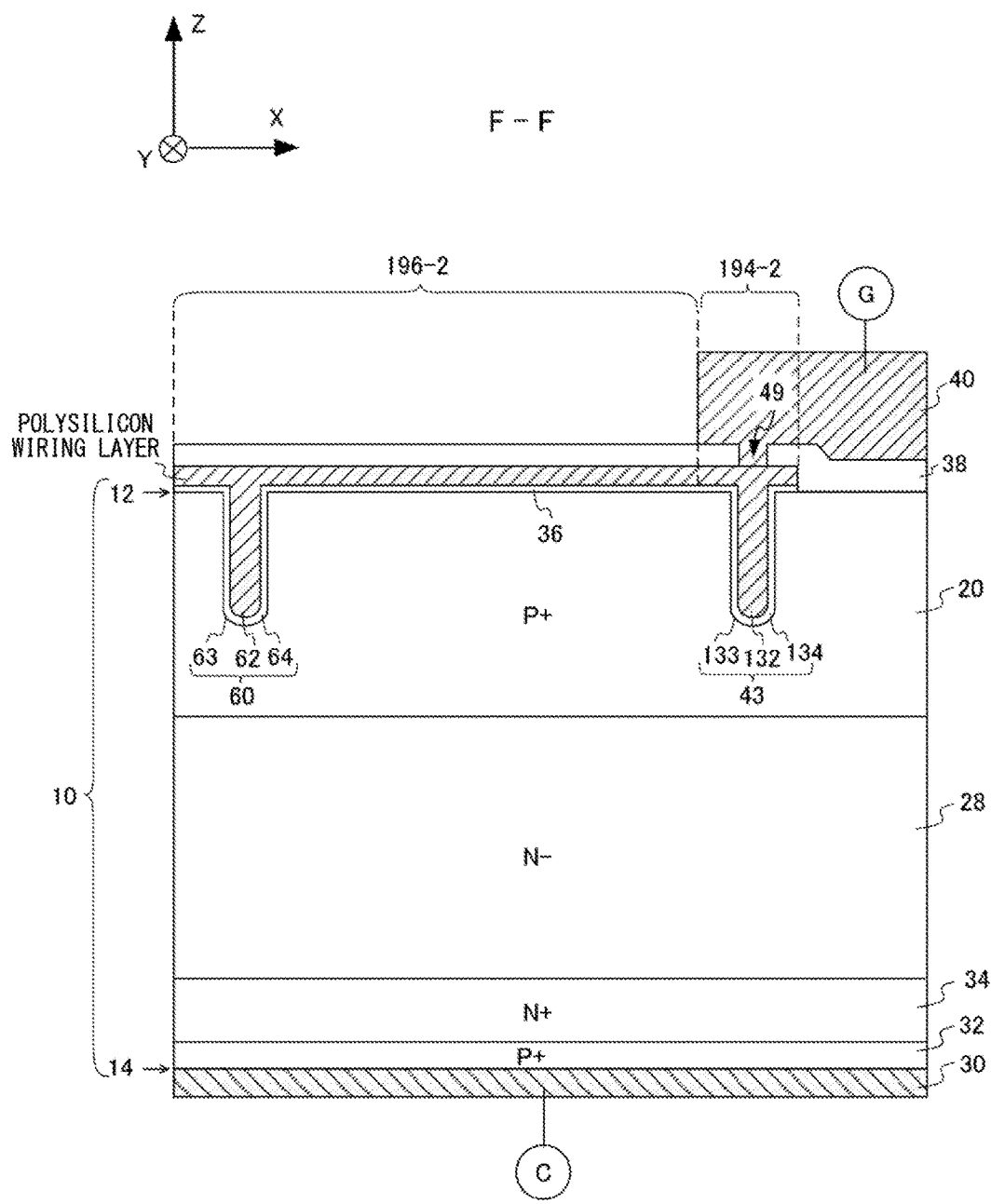
FIG. 18 is a figure showing a cross section taken along F-F in FIG. 16.

FIG. 18 is a figure showing a cross section taken along F-F in FIG. 16. FIG. 18 is a cross section that is parallel with the X-Z plane and passes through the polysilicon wiring layer extending portion 196 and the periphery portion 194. The polysilicon wiring layer periphery portion 194 of the present example electrically contacts a gate periphery conductive portion 132 of a gate periphery trench portion 43. In addition, the polysilicon wiring layer periphery portion 194 contacts the gate metal layer 40 at a contact portion 49.

Figure 19A:
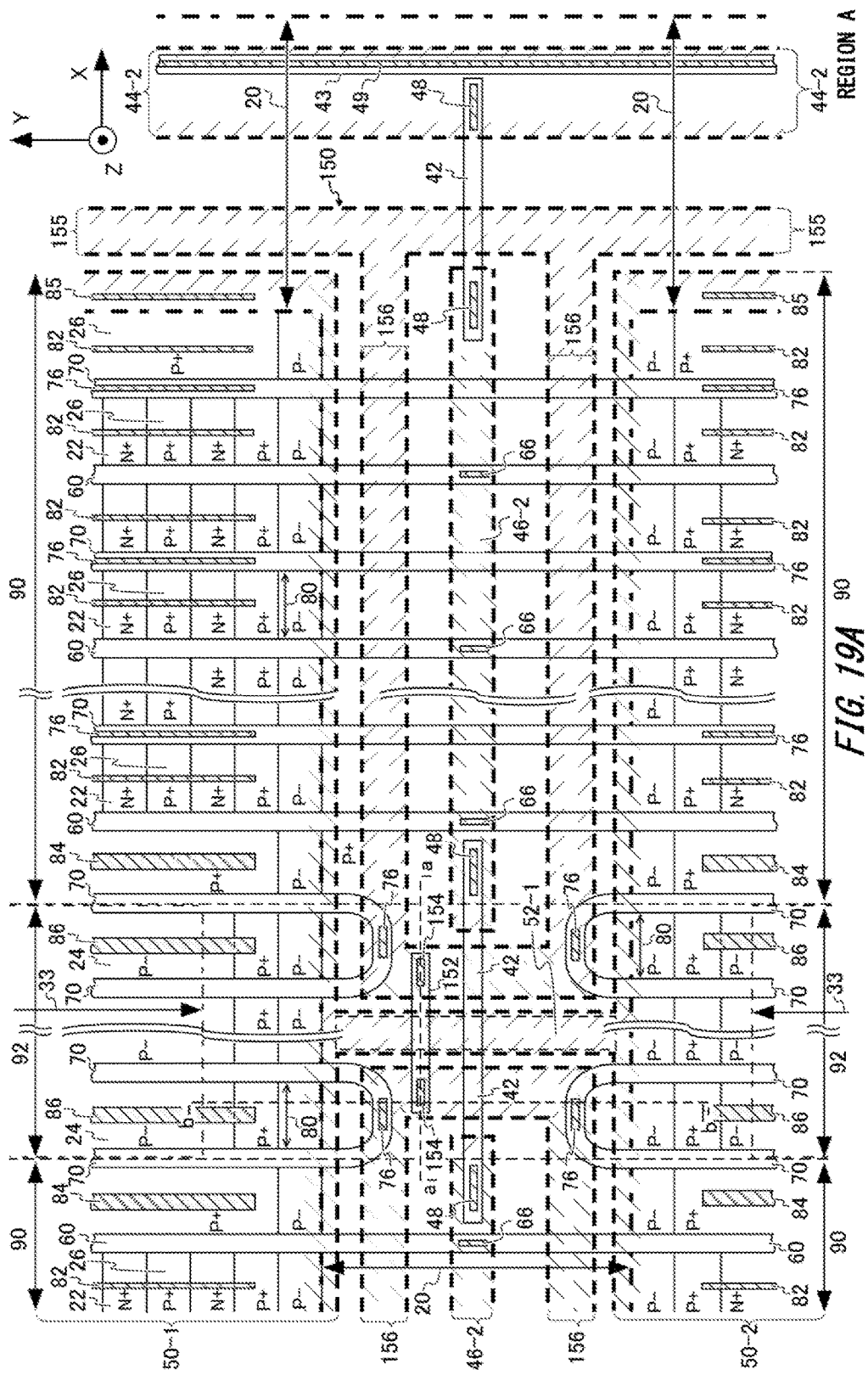
FIG. 19A is an enlarged view of the region A in a third embodiment.

FIG. 19A is an enlarged view of the region A in a third embodiment. The semiconductor device 100 of the present example further includes a dummy emitter electrode 150 in the active region 110. The dummy emitter electrode 150 is one example of a third top surface electrode. The dummy emitter electrode 150 may be used for a screening test shown in FIG. 20A and FIG. 20B.

The semiconductor substrate 10 of the present example has a dummy bridge trench portion 152 that electrically connects with the dummy emitter electrode 150. Similar to trench portions, the dummy bridge trench portion 152 of the present example is provided to reach a predetermined depth from the top surface 12 of the semiconductor substrate 10. In addition, similar to the gate bridge trench portion 42, the dummy bridge trench portion 152 is positioned below an emitter bridge portion 52. The dummy bridge trench portion 152 may electrically connect with the dummy emitter electrode 150 at contact portions 154. The contact portions 154 may be connecting portions at openings provided to the interlayer dielectric film 38. This is a main difference between the present example and the first embodiment.

Figure 20A:
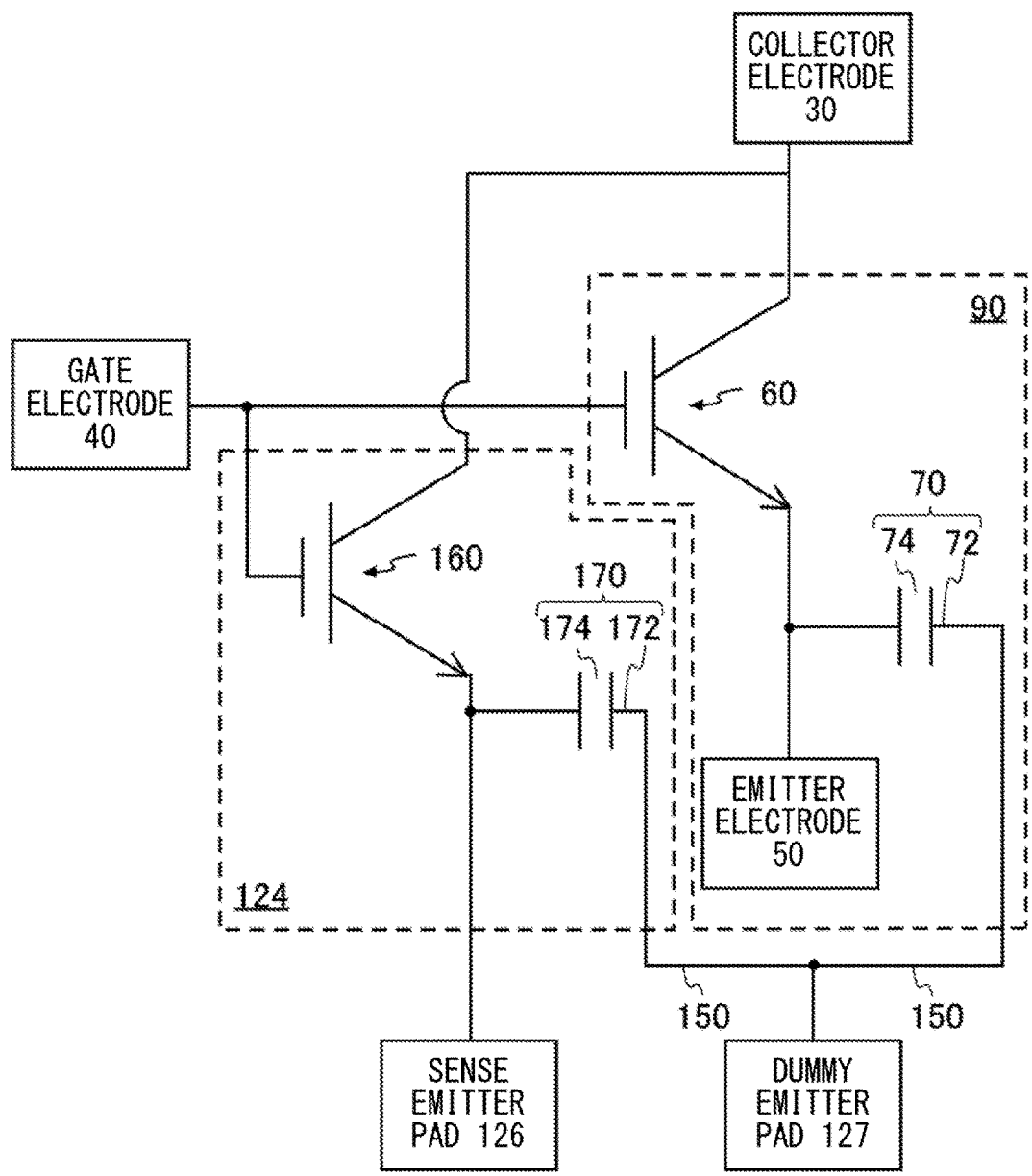
FIG. 20A is a circuit diagram corresponding to part of a semiconductor device 200 before a screening test.
Figure 20B:
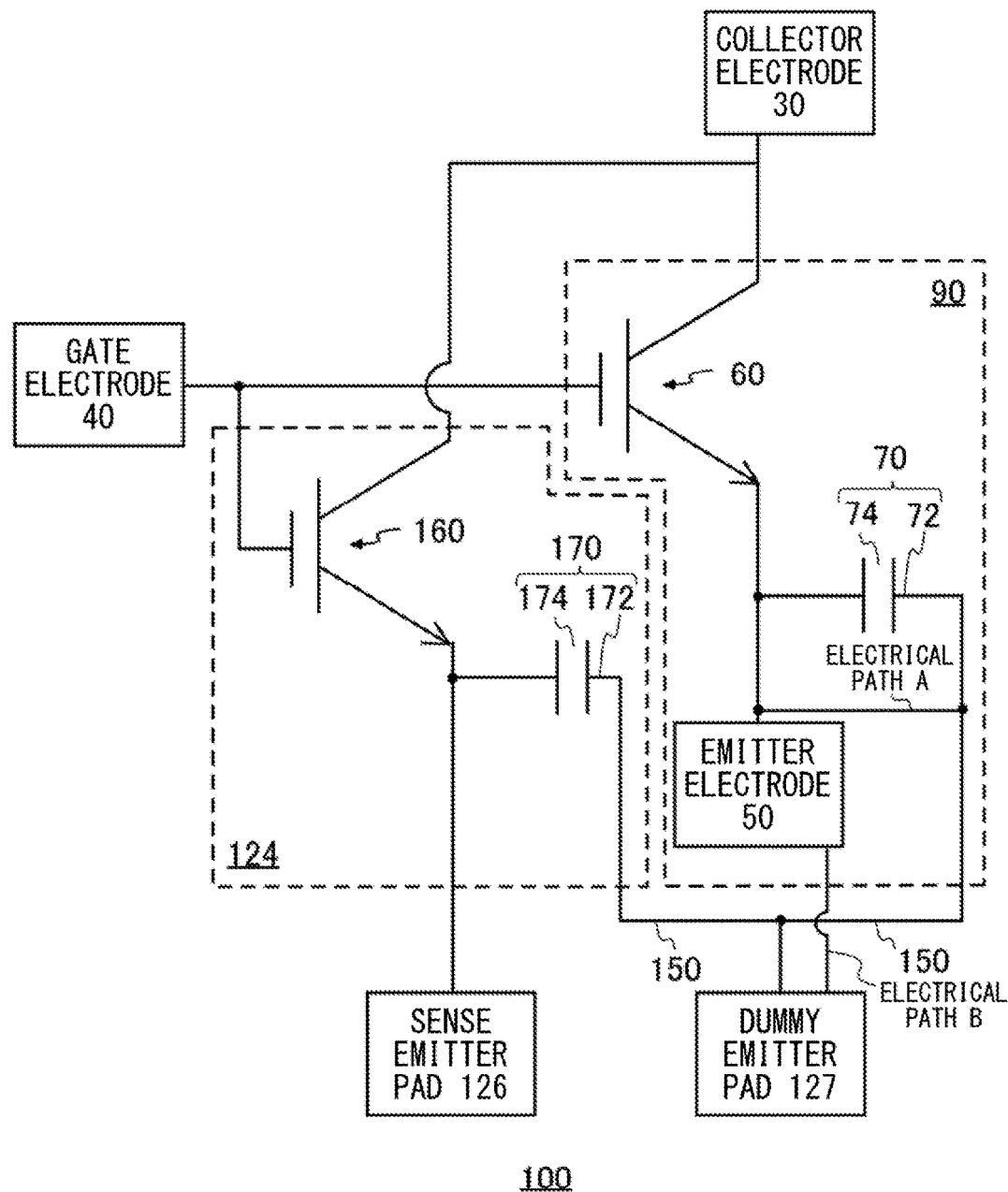
FIG. 20B is a circuit diagram corresponding to part of the semiconductor device 100 in which the emitter electrode 50 and a dummy emitter electrode 150 are short-circuited after a screening test.

In the active region 110, the dummy emitter electrode 150 may be provided detached from the gate metal layer 40 and the emitter electrode 50. The dummy emitter electrode 150 of the present example electrically connects with emitter trench portions 70 in IGBT regions 90 and a FWD region 92. In addition, as shown in FIG. 20A and FIG. 20B, the dummy emitter electrode 150 of the present example electrically connects with a sense emitter trench portion 170 of the sense IGBT region 124 in the pad region 120.

The dummy emitter electrode 150 may have periphery portions 155 and extending portions 156. The periphery portions 155 of the dummy emitter electrode 150 of the present example are positioned between an IGBT region 90 positioned at an X-axis direction end portion and the periphery portion 44 of the gate metal layer 40. In addition, the extending portions 156 of the dummy emitter electrode 150 of the present example are provided between FWD regions 92 and between IGBT regions 90 that are adjacent to each other in the Y-axis direction. The extending portions 156 of the dummy emitter electrode 150 may be provided to surround the extending portions 46 of the gate metal layer 40. In the present example, the extending portions 156 of the dummy emitter electrode 150 have longer-side portions extending in the X-axis direction and shorter-side portions extending in the Y-axis direction.

In the present example, the gate bridge trench portion 42 provided between two FWD regions 92 in the Y-axis direction is positioned below the emitter bridge portion 52 and below the extending portions 46 of the dummy emitter electrode 150. This gate bridge trench portion 42 electrically connects two extending portions 46-2 of the gate metal layer 40 that are adjacent to each other in the X-axis direction. Furthermore, in the present example, near an X-axis direction end portion of an IGBT region, it is provided below a periphery portion 155 of the dummy emitter electrode 150. This gate bridge trench portion 42 electrically connects an extending portion 46-2 and periphery portion 44-2 of the gate metal layer 40. In the present example, a gate bridge trench portion 42 positioned below the periphery portion 155 electrically connects to an extending portion 46 and periphery portion 44 of the gate metal layer 40 through contact portions 48.

Extending portions 46 of the gate metal layer 40 in the present example may also be polysilicon wiring layers. In addition, in the present example also, as in the second embodiment, top surface killer regions 96 may also be provided below a polysilicon wiring layer extending portion 196. Furthermore, the extending portions 46 of the gate metal layer 40 in the present example may also be laminated layers of polysilicon wiring layers and metallic wiring layers made of aluminum or the like. In the third embodiment also, the variant of the emitter electrode 50 shown in FIG. 8, the variant of the gate bridge trench portion 42 shown in FIG. 9 to FIG. 11 and the top surface killer regions 96 shown in FIG. 12 to FIG. 15 may be applied.

Figure 19B:
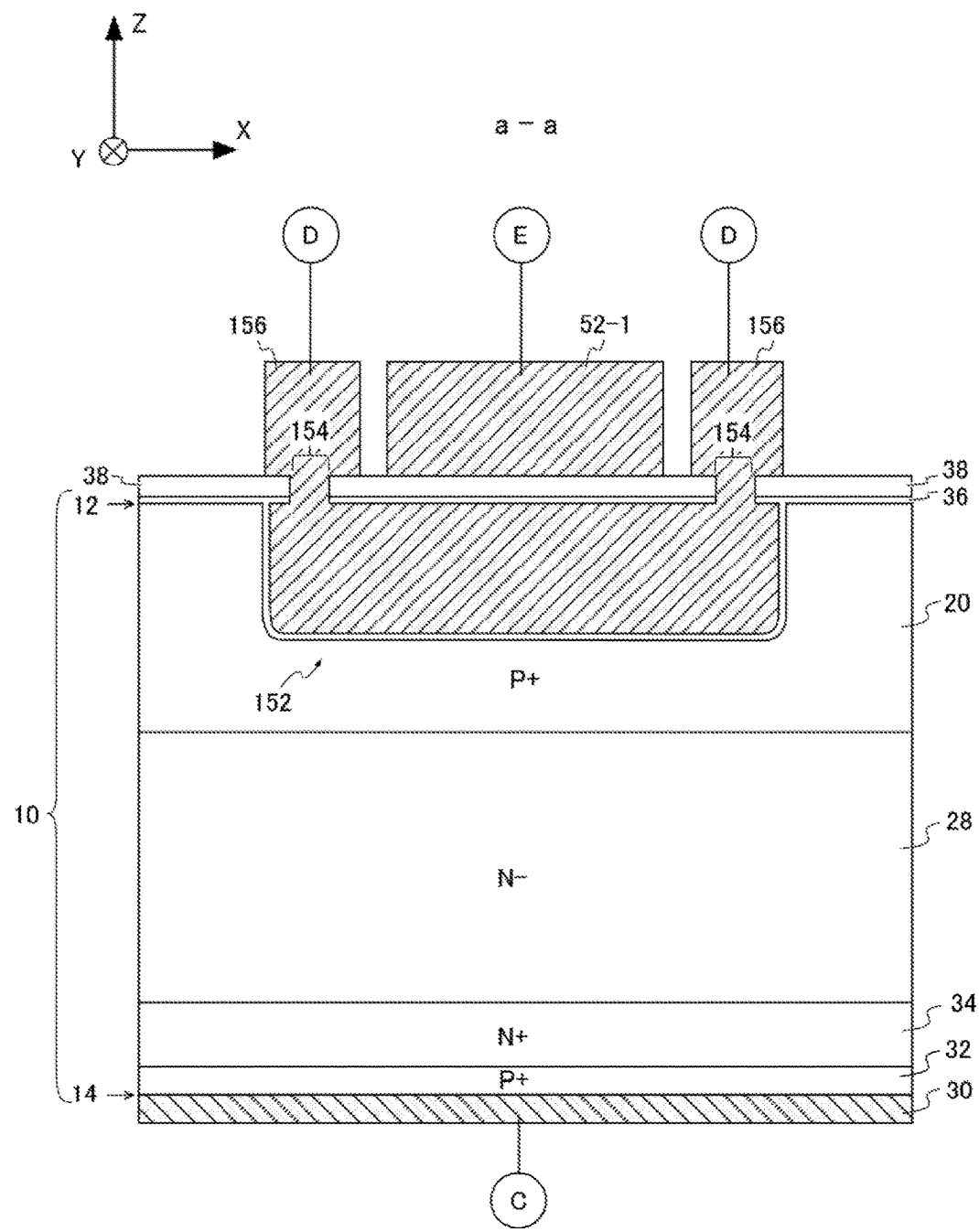
FIG. 19B is a figure showing a cross section taken along a-a in FIG. 19A.

FIG. 19B is a figure showing a cross section taken along a-a in FIG. 19A. The cross section taken along a-a is a cross section that is parallel with the X-Y plane and passes through two contact portions 154. Extending portions 156 of the dummy emitter electrode 150 may be detached from an emitter bridge portion 52-1. As shown in the cross section taken along a-a, the two extending portions 156 are detached from each other, sandwiching the emitter bridge portion 52-1 in the X-axis direction. However, the dummy bridge trench portion 152 is provided so as to link the mutually detached two extending portions 156. Each among the two extending portions 156 connects to a conductive portion inside the dummy bridge trench portion 152. Thereby, the mutually detached two extending portions 156 can electrically connect with each other via conductive portions inside the dummy bridge trench portion 152. The emitter bridge portion 52-1 is electrically insulated from the conductive portions inside the dummy bridge trench portion 152 by the interlayer dielectric film 38 and the oxide film 36.

Figure 19C:
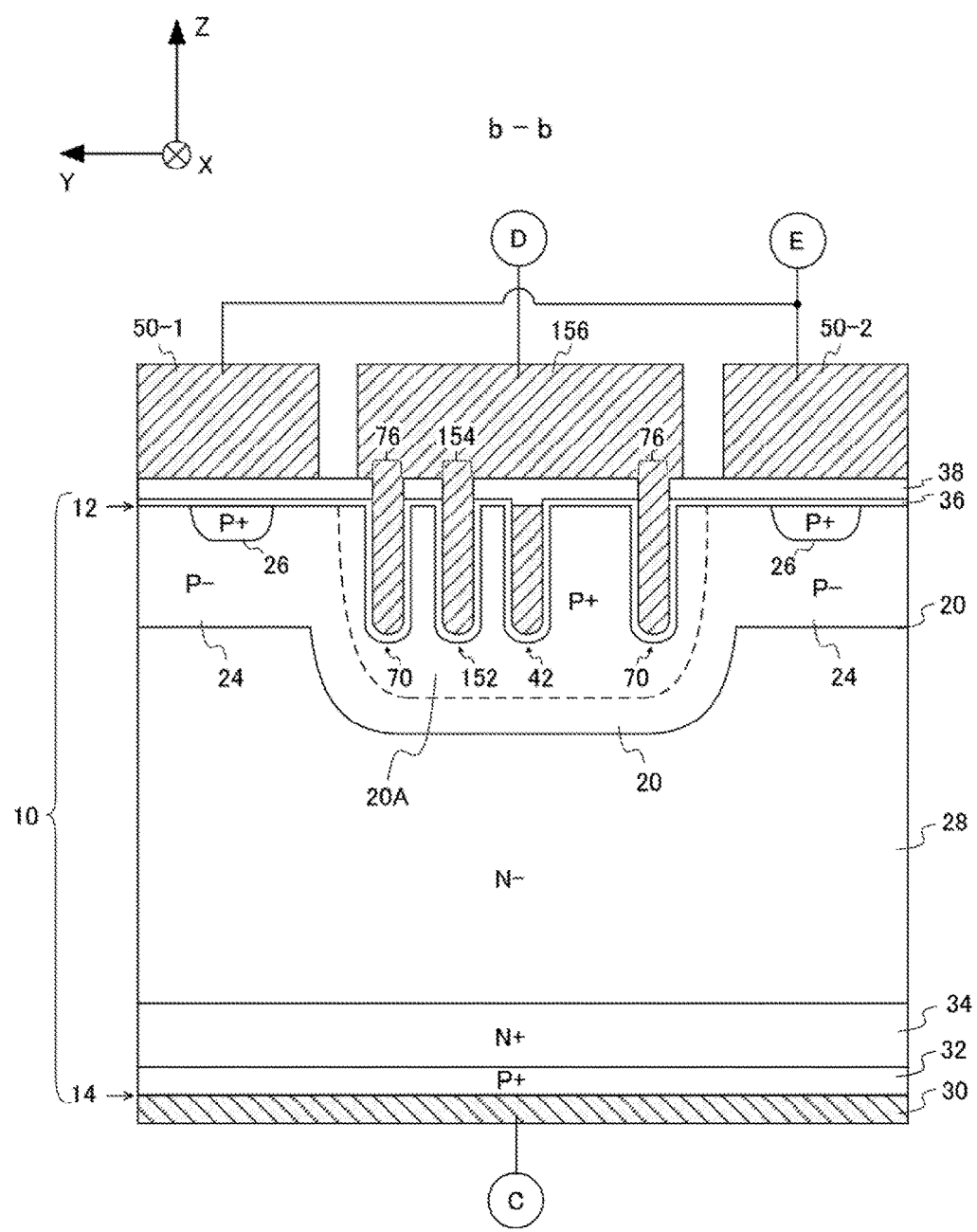
FIG. 19C is a figure showing a cross section taken along b-b in FIG. 19A.

FIG. 19C is a figure showing a cross section taken along b-b in FIG. 19A. The cross section taken along b-b is a cross section that is parallel with the Y-Z plane and passes through two contact portions 76 and one contact portion 154. In the cross section taken along b-b, four trench portions are provided below an extending portion 156. Two emitter trench portions 70 positioned at both ends in the Y-axis direction among the four trench portions are U-shaped trench portions positioned in FWD regions 92 in FIG. 19A. Between the two emitter trench portions 70 in the Y-axis direction, the dummy bridge trench portion 152 and the gate bridge trench portion 42 are provided. The dummy bridge trench portion 152 is positioned between an emitter trench portion 70 positioned relatively in the +Y direction among the two emitter trench portions 70 and the gate bridge trench portion 42.

The gate bridge trench portion 42 may electrically connect, with the gate metal layer 40, an extending portion 46-2 of the gate metal layer 40 separated due to the emitter bridge portion 52-1 and the dummy emitter electrode 150 being provided. A conductive portion of the gate bridge trench portion 42 is electrically insulated from the extending portion 156 of the dummy emitter electrode 150 by the interlayer dielectric film 38 and the oxide film 36. In contrast to this, an emitter conductive portion 72 of an emitter trench portion 70 electrically connects to the extending portion 156 of the dummy emitter electrode 150 at a contact portion 76. In addition, a conductive portion of the dummy bridge trench portion 152 electrically connects to the extending portion 156 of the dummy emitter electrode 150 at the contact portion 154.

FIG. 20A is a circuit diagram corresponding to part of a semiconductor device 200 before a screening test. In FIG. 20A, an IGBT region 90 and the sense IGBT region 124 are indicated with broken lines. Common gate potential may be supplied to each gate of the IGBT region 90 and the sense IGBT region 124 via the gate metal layer 40.

An emitter trench portion 70 in the IGBT region 90 and a sense emitter trench portion 170 in the sense IGBT region 124 are indicated with the symbols of capacitors. In the emitter trench portion 70, an emitter insulating film 74 may be regarded as a dielectric of the capacitor. In addition, among two electrodes sandwiching the dielectric, one electrode may be regarded as the emitter electrode 50 and the other electrode may be regarded as a dummy emitter electrode 150 connected to an emitter conductive portion 72. In the sense emitter trench portion 170, a sense emitter insulating film 174 which is a dielectric may be regarded as being sandwiched by the sense emitter pad 126 and the dummy emitter electrode 150. The dummy emitter electrode 150 connects to the dummy emitter pad 127.

One of the features of the third embodiment is that the emitter conductive portion 72 of the emitter trench portion 70 and a sense emitter conductive portion 172 of the sense emitter trench portion 170 are electrically connected to the common dummy emitter electrode 150. Thereby, they can be electrically connected to the one common dummy emitter pad 127 via the dummy emitter electrode 150.

The screening test may be a defect detection test for the semiconductor device 100. The screening test may include a test to measure leakage current between the gate and the emitter by applying a voltage between the gate and the emitter which is higher than normally used voltages. In addition, the screening test may also include a test to measure gate leakage current after applying an excessively high voltage to a gate trench portion.

By the leakage current measurement between the gate and the emitter, it is possible to detect a defect due to short-circuiting between the gate metal layer 40 and the emitter electrode 50, base region 24 or semiconductor substrate 10. By this gate leakage current measurement, it is possible to detect an insulating film defect (for example, that the gate insulating film 64 is formed locally thin or that the film quality of the gate insulating film 64 is low).

Test conditions may be different for IGBT region 90 and the sense IGBT region 124. For example, while applying voltage the values of which are the same, leakage current measurement time for the IGBT region 90 having a relatively large area is made longer than leakage current measurement time for the sense IGBT region 124 having a relatively small area.

For example, a predetermined high voltage is applied to the dummy emitter pad 127, and leakage current between the dummy emitter electrode 150 and the emitter electrode 50 is measured for the emitter trench portion 70 (Measurement A). In addition, for example, the same predetermined high voltage is applied to the dummy emitter pad 127, and leakage current between the dummy emitter electrode 150 and the sense emitter pad 126 is measured for the sense emitter trench portion 170 (Measurement B).

In this case, leakage current measurement time in Measurement A is made longer than leakage current measurement time in Measurement B. Measurements A and B can be performed separately using the one common dummy emitter pad 127. In the present example, at the time of the screening test, the one common dummy emitter pad 127 is used for the IGBT region 90 and the sense IGBT region 124. Thereby, because it becomes unnecessary to arrange a separate dummy emitter pad 127 in the pad region 120, increase in the number of pads can be suppressed.

In addition, test conditions may also be different for the gate trench portion 60 and the emitter trench portion 70. Specifically, conditions of tests for the gate trench portion 60 and the emitter trench portion 70 may also be different according to the areas of regions in a top view. In one example, while applying voltage the values of which are the same, leakage current of the gate trench portion 60 and the emitter trench portion 70 may also be measured based on the time ratio which is the same as the area ratio between the gate trench portion 60 and the emitter trench portion 70. For example, if the area ratio between the gate trench portion 60 and the emitter trench portion 70 is 2:1, the measurement time ratio between the gate trench portion 60 and the emitter trench portion 70 is set to 2:1.

In addition, the gate metal layer 40, the collector electrode 30 and the emitter electrode 50 may be used to conduct a screening test on the gate trench portion 60. Similarly, the gate metal layer 40, the collector electrode 30 and the sense emitter pad 126 may be used to conduct a screening test on the sense gate trench portion 160. in this manner, screening tests may also be conducted separately on the gate trench portion 60 and the sense gate trench portion 160.

FIG. 20B is a circuit diagram corresponding to part of the semiconductor device 100 in which the emitter electrode 50 and a dummy emitter electrode 150 are short-circuited after a screening test. After the screening test, in the pad region 120, the emitter electrode 50 and the dummy emitter electrode 150 may be short-circuited by an electrical path A. As one example, at a position where the emitter electrode 50 and the dummy emitter electrode 150 come close to each other, both of them may be connected by plating. Instead of this, after the screening test, the emitter electrode 50 and the dummy emitter pad 127 may also be short-circuited by an electrical path B. The means for short-circuiting may be plating or wire connection.

Figure 21:
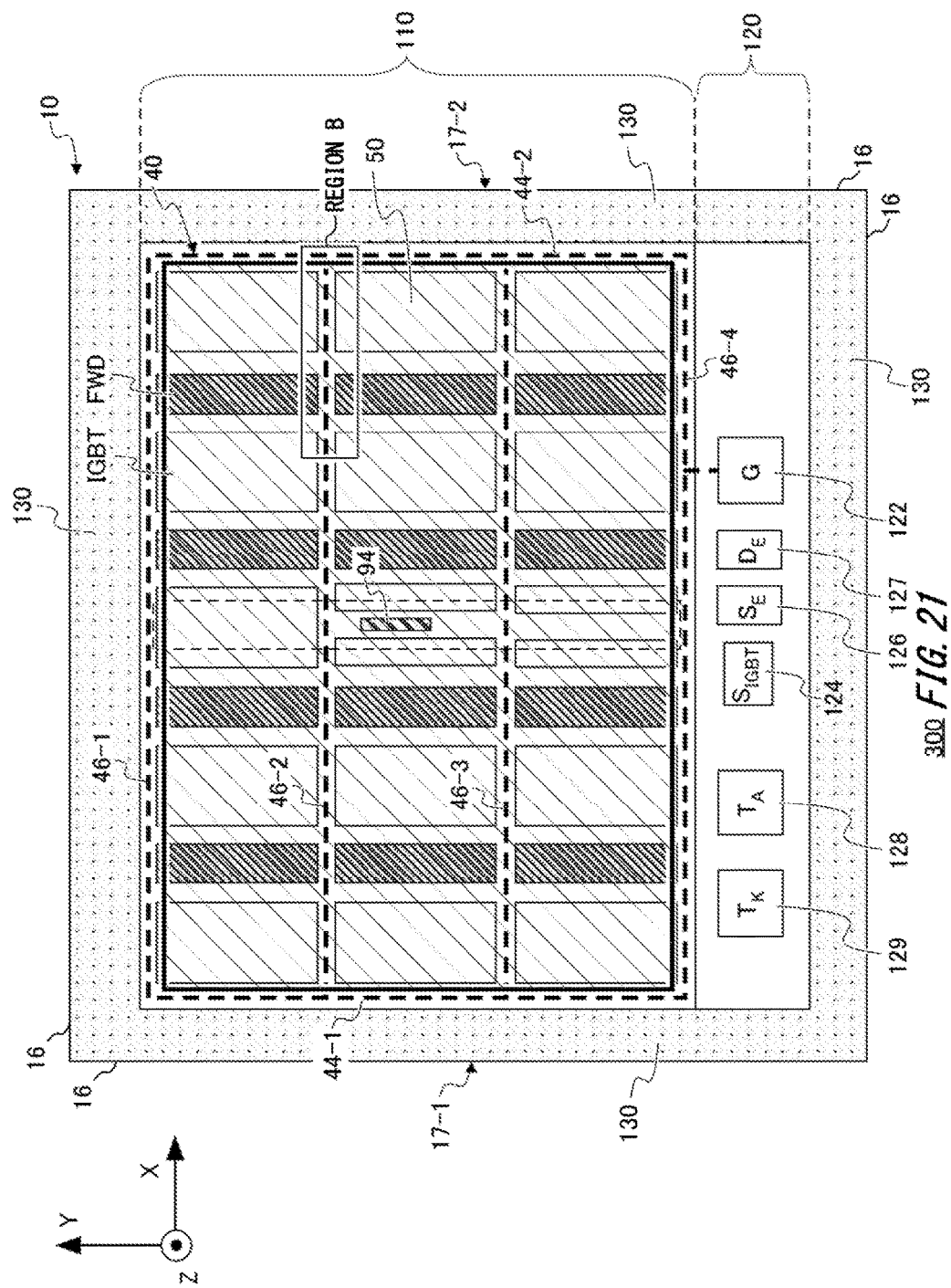
FIG. 21 is a schematic diagram showing the top surface of a semiconductor device 300 in another example.

FIG. 21 is a schematic diagram showing the top surface of a semiconductor device 300 in another example. The emitter electrode 50 in the semiconductor device 300 of the present example does not have an emitter bridge portion 52. The emitter electrode 50 of the present example has a rectangular shape substantially covering the active region 110. The present example is different from the semiconductor device 100 in this respect.

Figure 22:
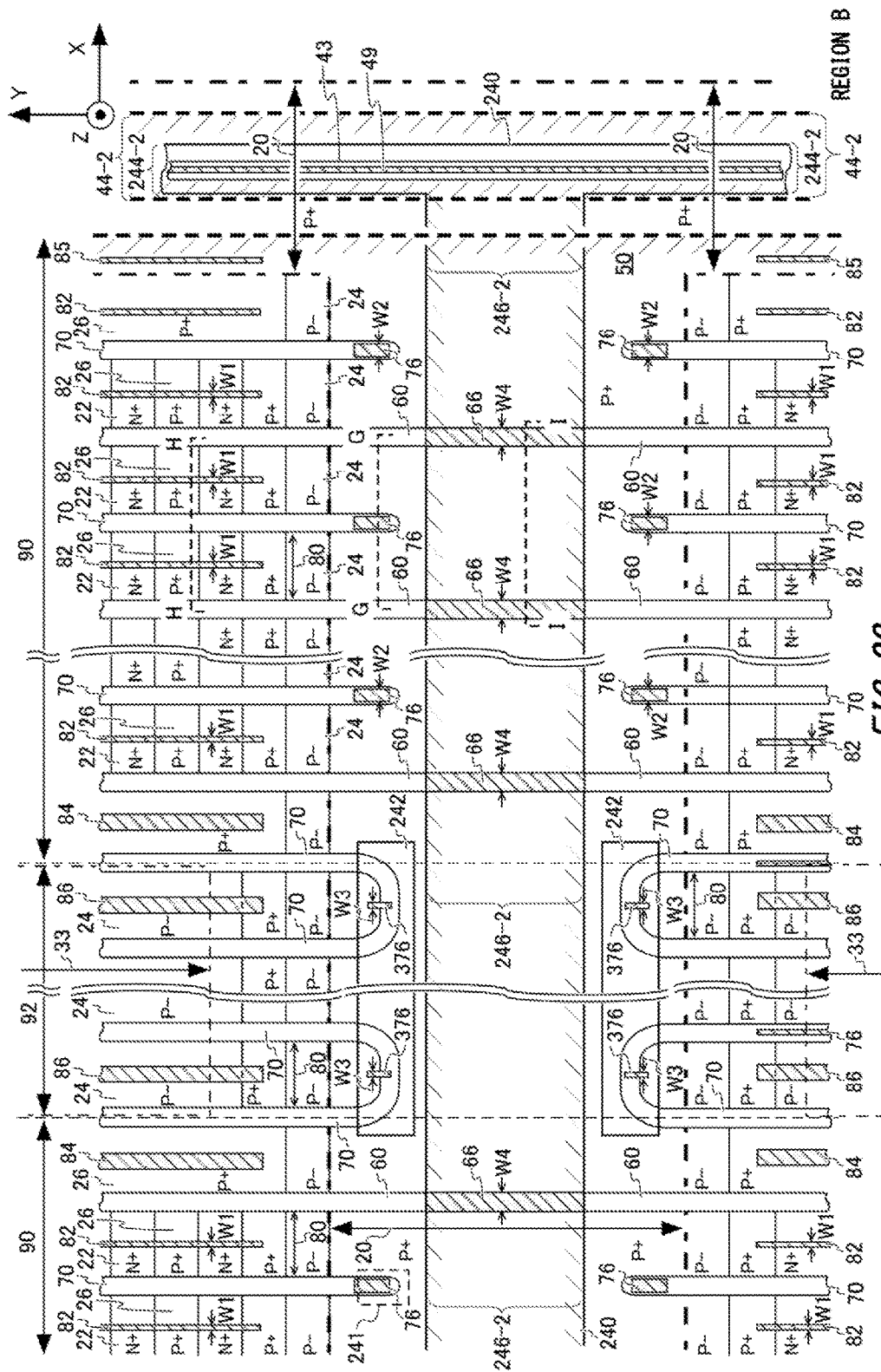
FIG. 22 is an enlarged view of a region B in a fourth embodiment.

FIG. 22 is an enlarged view of a region B in a fourth embodiment. The semiconductor device 300 of the present example has a polysilicon wiring layer 240 provided below the gate metal layer 40 and the emitter electrode 50. The polysilicon wiring layer 240 of the present example has periphery portions 244 and extending portions 246. The periphery portions 244 and extending portions 246 may have the functions corresponding to the periphery portions 44 and extending portions 46 of the gate metal layer 40, respectively. The polysilicon wiring layer 240 of the present example electrically connects with the periphery portions 44 of the gate metal layer 40 through the contact portion 49. That is, the periphery portion 244-2 of the present example supplies gate potential to the gate conductive portions 62 through the periphery portions 44 of the gate metal layer 40.

The extending portions 246 may extend in parallel with the X-axis direction. The extending portions 246-2 of the present example intersect the gate trench portions 60 extending in the Y-axis direction between two IGBT regions 90. The extending portions 246-2 of the present example connect directly with the gate conductive portions 62 through the contact portions 66 at the portions at which they intersect the gate trench portions 60. The extending portions 246 may electrically connect with the gate conductive portions 62 of each IGBT region 90 in the semiconductor device 300 through each contact portion 66. The extending portions 246 are one example of a first connecting portion positioned under the emitter electrode 50.

In the present example, emitter trench portions 70 of IGBT regions 90 do not intersect the extending portions 246. The emitter trench portions 70 of the present example are detached from the extending portion 246 in the Y-axis direction. The semiconductor device 300 of the present example has contact portions 76 on regions where the emitter trench portions 70 terminate and that are near the extending portions 246-2 and part of the emitter trench portions 70. The contact portions 76 of the present example are provided on the end portion regions that are on the emitter trench portions 70 positioned at the $P^+$-type well region 20 and are part of the emitter trench portions 70.

At the contact portions 76, the emitter electrode 50 and the emitter conductive portions 72 of the emitter trench portions 70 may be electrically connected. In the present example, the emitter electrode 50 and the emitter conductive portion 72 are connected via plugs made of metal. In the present example, the emitter electrode 50 and the emitter conductive portions 72 are electrically connected not via a connection layer made of a polysilicon layer. This is one feature in the present example.

In the present example, emitter trench portions 70 of a FWD region 92 also do not intersect the extending portions 246 in the Z-axis direction. In the FWD region 92, connection layers 242 made of polysilicon may be provided so as to cover at least shorter-side portions of U-shapes of the emitter trench portions 70 in the Z-axis direction. Although the connection layers 242 are detached from the polysilicon wiring layers 240, they may be the same layers. For example, the connection layers 242 and the polysilicon wiring layer 240 may be formed by patterning of one polysilicon layer formed by PECVD (Plasma-Enhanced Chemical Vapor Deposition). In the present example, the emitter conductive portions 72 of the FWD region 92 directly connect with the connection layers 242, and the connection layers 242 electrically connect with the emitter electrode 50 via contact portions 376.

In the present example, through-opening portions are formed in the interlayer dielectric film 38 on the connection layers 242, and the contact portions 376 are provided in these through-opening portions. Generally, if it is attempted to miniaturize the structures of IGBT regions 90 and FWD regions 92 by narrowing the intervals of trench portions, it becomes difficult to form contact holes which are through-opening portions in the interlayer dielectric film 38 due to steps in a connection layer which is a polysilicon layer. For example, if an island-like imaginary connection layer 241 made of polysilicon is provided to part of an IGBT region 90 as indicated with broken lines in FIG. 22, an upper portion of the imaginary connection layer 241 contacting an emitter conductive portion 72 may form a convex shape protruding in the +Z direction. In addition, corresponding to this, the size of the contact portion 76 may dwindle in the -Z direction to form a reversed convex shape.

For example, the imaginary connection layer 241 made of polysilicon tends to form a convex shape protruding in the +Z direction due to side etching of a photoresist at the time of processing or the like. In addition, the imaginary connection layer 241 made of polysilicon also tends to be difficult to remain as a layer because its area is very small. These drawbacks become particularly noticeable as miniaturization by narrowing the intervals of trench portions advances further. Even if the imaginary connection layer 241 remains, the emitter conductive portion 72 of the IGBT region 90 and the emitter electrode 50 are inevitably not electrically connected, if a bottom portion of the contact portion 76 does not reach the imaginary connection layer 241. It should be noted that the semiconductor device 300 of the present example actually does not have the imaginary connection layer 241, and the imaginary connection layer 241 is merely a polysilicon layer mentioned for convenience in order to explain a drawback.

In addition, in a region provided with a micro island-like polysilicon layer like the imaginary connection layer 241, a step corresponding to the thickness of the polysilicon layer is inevitably provided. Because the thickness of a photoresist becomes uneven at a portion near the step region in a photolithography step, a drawback that the processing precision of etching cannot be secured also occurs.

In view of this, in IGBT regions 90 of the present example, the emitter conductive portions 72 and the emitter electrode 50 are directly connected not via a polysilicon layer. In the present example, the emitter conductive portions 72 and the emitter electrode 50 being electrically connected not via a polysilicon layer is expressed as the emitter conductive portions 72 and the emitter electrode 50 being directly connected. Therefore, if the emitter conductive portions 72 and the emitter electrode 50 are directly connected, plugs formed of tungsten (W) may also be provided between the emitter conductive portions 72 and the emitter electrode 50. Thereby, the drawbacks of connection failure between the emitter conductive portions 72 and emitter electrode 50 and of the processing precision in etching in the case where the imaginary connection layer 241 is used can be solved.

In IGBT regions 90 of the present example, the contact portions 76 provided on emitter trench portions 70 are one example of a second contact portion. A width W2 of the contact portions 76 in the X-axis direction may be larger than a width W3, in the X-axis direction, of the contact portions 376 provided on the connection layers 242 of the FWD region 92. Because the imaginary connection layer 241 made of polysilicon to connect with an emitter trench portion 70 is not provided in an IGBT region 90 of the present example, the contact portions 76 with a relatively large width W2 can surely directly connect the emitter conductive portions 72 and the emitter electrode 50.

Contact portions 82 provided on mesa portion 80 in IGBT regions 90 of the present example are one example of a first contact portion. In the contact portions 82, the mesa portions 80 and the emitter electrode 50 may be electrically connected. Because the imaginary connection layer 241 made of polysilicon is not provided in an IGBT region 90 of the present example, the width W2 of the contact portions 76 in the X-axis direction can be made larger than a width W1 of the contact portions 82 in the X-axis direction.

The width of mesa portions 80 in the X-axis direction may be equal to or larger than 0.3 µm and equal to or smaller than 0.5 µm. In one example the width of mesa portions 80 in the X-axis direction is 0.4 µm. In addition, the widths of gate trench portions 60 and emitter trench portions 70 in the X-axis direction may be equal to or larger than 0.4 µm and equal to or smaller than 1.2 µm, and may also be equal to or larger than 0.4 µm and equal to or smaller than 0.8 µm. In one example, the widths of gate trench portions 60 and emitter trench portions 70 in the X-axis direction is 0.7 µm.

Contact portions 82 and contact portions 76 may be provided at different position in the Y-axis direction. That is, contact portions 82 and contact portions 76 corresponding to micro opening patterns in the interlayer dielectric film 38 may not be adjacent to each other in the X-axis direction. In the present example, contact portions 76 are positioned at end portion regions that are above the P$^+$-type well region 20, and part of emitter trench portions 70 positioned near extending portions 246-2. In contrast to this, contact portions 82 are located on N$^+$-type emitter regions 22 and P$^+$-type contact regions 26 and are detached further from extending portions 246-2 as compared with the contact portions 76.

Because if contact portions 76 and contact portions 82 are adjacent to each other in the X-axis direction, abnormality occurs to the thickness of a photoresist at a photolithography step, the opening pattern of the interlayer dielectric film 38 cannot be formed as designed in some cases. In contrast to this, because in the present example, contact portions 82 and contact portions 76 are not adjacent to each other in the X-axis direction, the opening pattern of the interlayer dielectric film 38 can be formed more precisely as compared with the case where they are adjacent to each other. In addition, it is advantageous also in that intervals (margins) between contact portions 82 and contact portions 76 which are required if they are adjacent to each other in the X-axis direction are not required to be provided.

The temperature sense diode region 94 may have a polysilicon layer including a PN junction diode. The polysilicon layer including the PN junction diode may be the same layer as the polysilicon wiring layer 240. In the present example, also in emitter trench portions 70 positioned around the polysilicon layer including the PN junction diode, emitter conductive portions 72 and the emitter electrode 50 are electrically connected not via a polysilicon layer. Therefore, also in emitter trench portions 70 positioned around the polysilicon layer including the PN junction diode, contact portions and openings can be made larger than conventional sizes.

In another example, contact portions 82 and contact portions 76 may also overlap partially in the X-axis direction. In addition, contact portions 82 and contact portions 76 may also be arranged side-by-side in a straight line in the X-axis direction. However, because the width of mesa portions 80 in the X-axis direction becomes smaller along with miniaturization of the semiconductor device 300, it is advantageous for contact portions 82 and contact portions 76 not to be adjacent to each other in the X-axis direction as in the present example, in terms of securing processing precision of each opening portion. The structure of the present example may also be combined with the configuration of the emitter electrode 50 having emitter bridge portions 52 in the first to third embodiments. In addition, in place of the polysilicon wiring layer 240 of the present example, the gate metal layer 40 and gate periphery trench portion 43 of the first to third embodiments may also be applied.

Figure 23:
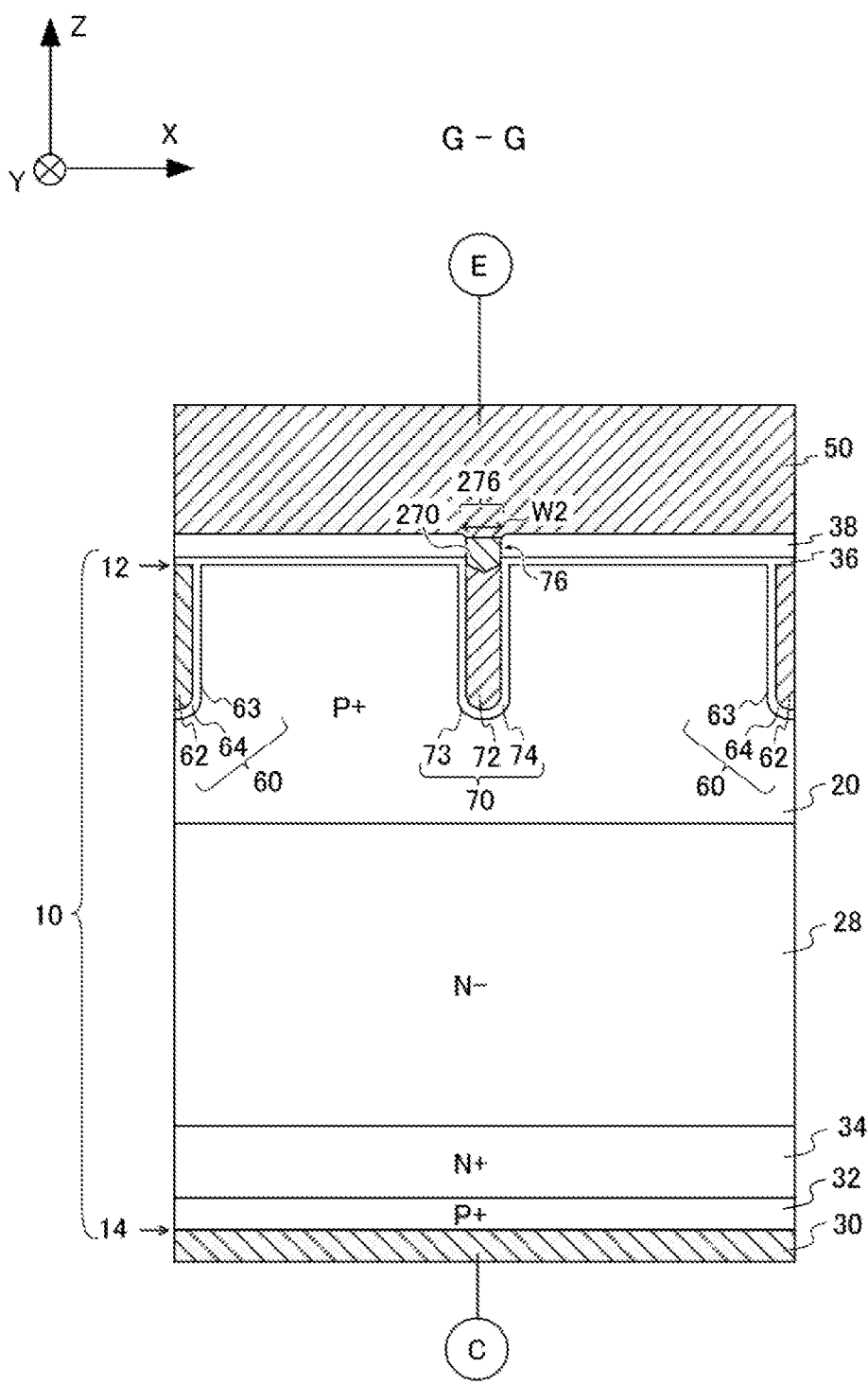
FIG. 23 is a figure showing a cross section taken along G-G in FIG. 22.

FIG. 23 is a figure showing a cross section taken along G-G in FIG. 22. The cross section taken along G-G is a cross section parallel with the X-Z plane. The cross section taken along G-G passes through two gate trench portions 60 and a contact portion 76 of an emitter trench portion 70 positioned between them, between two IGBT regions 90 that are adjacent to each other in the Y-axis direction. The contact portion 76 may be provided to a second opening portion 276 which is a through-opening portion formed in the interlayer dielectric film 38. In the present example, the emitter electrode 50 and the emitter trench portion 70 are electrically connected via a plug 270, not via a polysilicon wiring layer at the second opening portion 276. In the present example, the contact portion 76 corresponds to the plug 270 provided to the second opening portion 276.

In the present example, the width of the contact portion in the X-axis direction matches the width of the opening portion in the X-axis direction. Therefore, the shapes of the contact portion 76 and a first opening portion may correspond to each other in the X-Y plane. In the present example, the width of the second opening portion 276 in the X-axis direction is W2. In the present example, the width W2 is assumed to be the width, in the X-axis direction, of the interlayer dielectric film 38 at its upper portion. However, the width of the opening portion in the X-axis direction does not necessarily have to be the width, in the X-axis direction, of the interlayer dielectric film 38 at its upper portion as long as it is defined at a predetermined position in the Z-axis direction in a plurality of opening portions. At the second opening portion 276 and a first opening portion 282 mentioned below, the widths thereof, in the X-axis direction, at a predetermined position in the Z-axis direction between a bottom portion and upper portion of the interlayer dielectric film 38 may also be treated as the width W2 and a width W1, respectively. The width W2 of the second opening portion 276 in the X-axis direction is larger than the width W1 of the first opening portion 282 mentioned blow in the X-axis direction.

Figure 24:
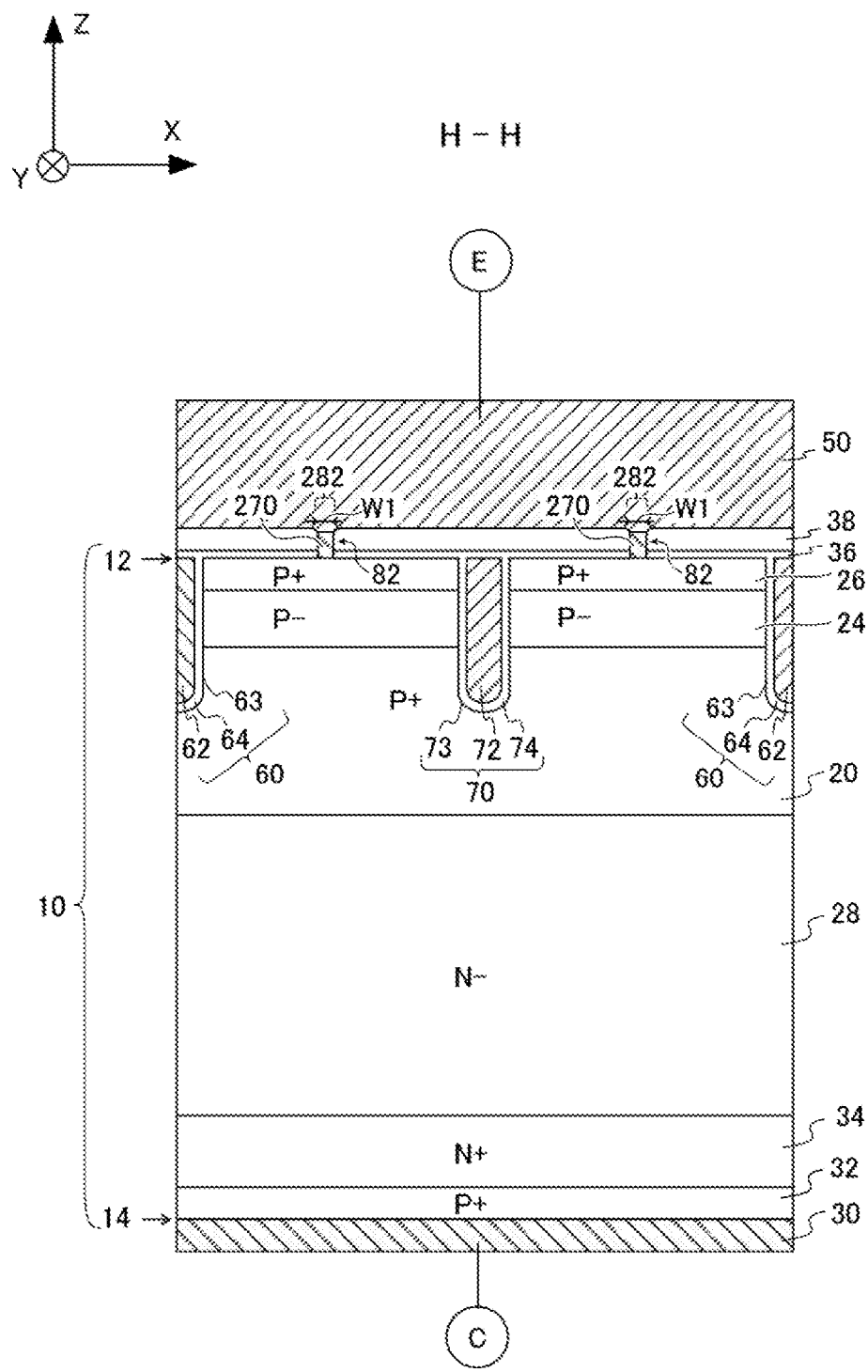
FIG. 24 is a figure showing a cross section taken along H-H in FIG. 22.

FIG. 24 is a figure showing a cross section taken along H-H in FIG. 22. The cross section taken along H-H is a cross section parallel with the X-Z plane. The cross section taken along H-H passes through two gate trench portions 60, an emitter trench portion 70 positioned between them, and contact portions 82 on mesa portions 80 in an IGBT region 90. The contact portions 82 may be provided to the first opening portions 282 which are through-opening portions formed in the interlayer dielectric film 38. In the present example, the mesa portions 80 and the emitter electrode 50 are electrically connected in the first opening portions 282 via plugs 270. In the present example, the contact portions 82 correspond to the plugs 270 provided to the first opening portions 282. In the present example also, the shapes of the contact portions 82 and the second opening portion correspond to each other in the X-Y plane. In the present example, the width of the first opening portions 282 in the X-axis direction is W1.

Figure 25:
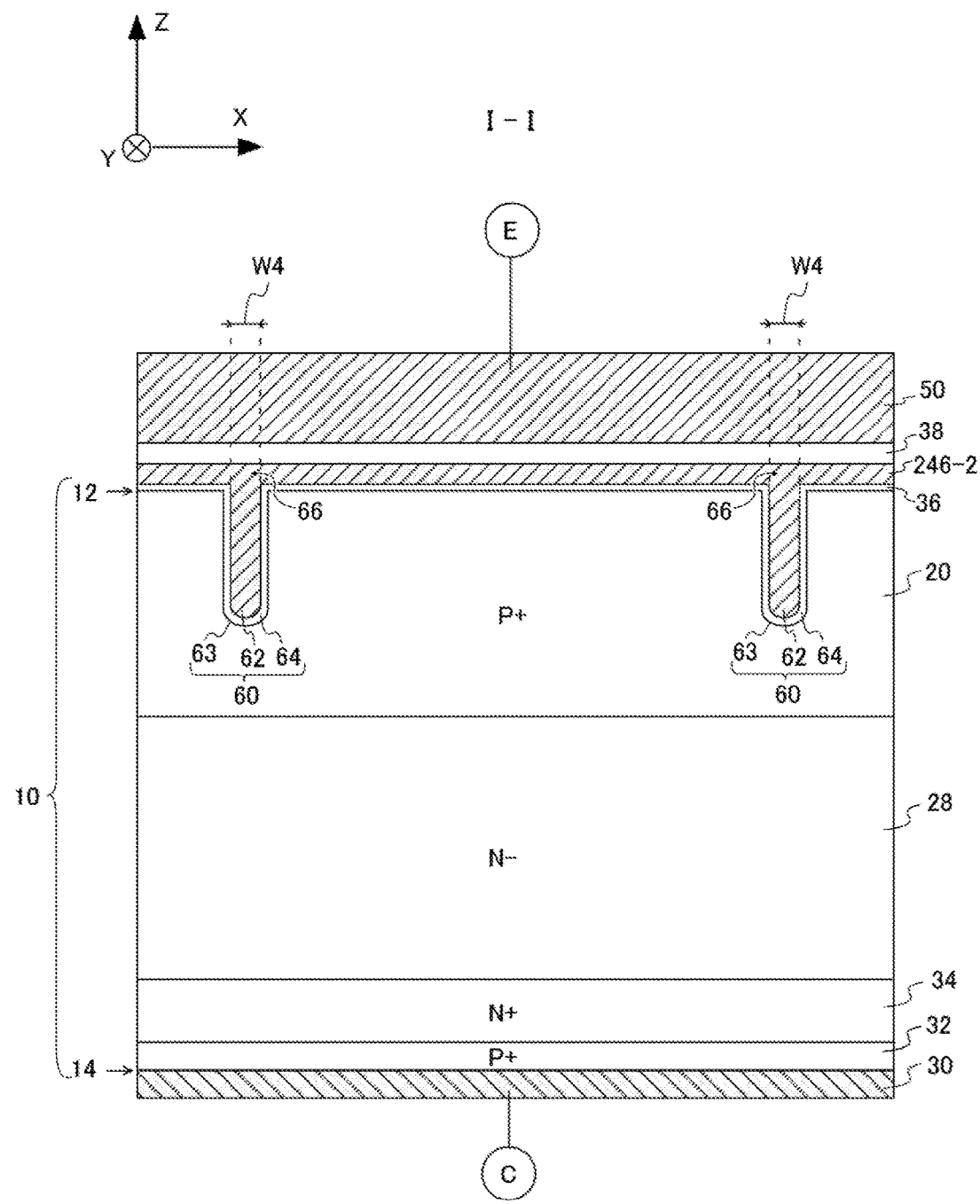
FIG. 25 is a figure showing a cross section taken along I-I in FIG. 22.

FIG. 25 is a figure showing a cross section taken along I-I in FIG. 22. The cross section taken along I-I is a cross section parallel with the X-Z plane. The cross section taken along I-I passes through contact portions 66 at which gate trench portions 60 and extending portions 246-2 contact each other, between two IGBT regions 90 that are adjacent to each other in the Y-axis direction. The contact portions 66 of the present example are portions at which the extending portions 246-2 and gate conductive portions 62 contact each other. In the present example, the width of the contact portions 66 in the X-axis direction is W4. The width W4 may be the same as the width W1 or may also be larger than the width W1.

Both the extending portions 246-2 and the gate conductive portions 62 may be formed through PECVD. Therefore, the extending portions 246-2 and the gate conductive portions 62 may be a continuous polysilicon layer. In the present example, for convenience, upper portions of the gate trench portions 60 are treated as the contact portions 66.

Figure 26:
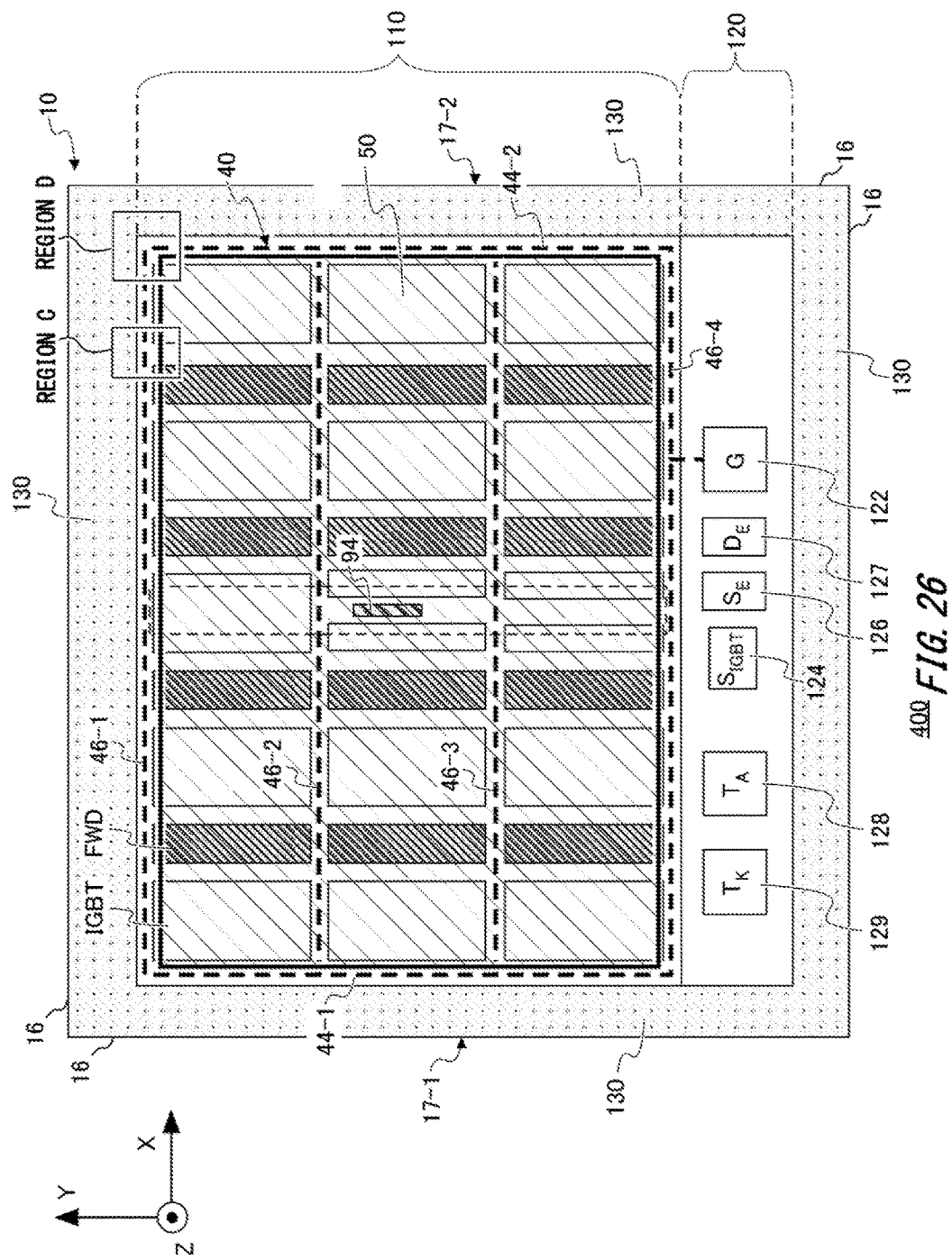
FIG. 26 is a schematic diagram showing the top surface of a semiconductor device 400 in a still another example.

FIG. 26 is a schematic diagram showing the top surface of a semiconductor device 400 in a still another example. The emitter electrode 50 in the semiconductor device 400 of the present example does not have an emitter bridge portion 52. The present example is different from the semiconductor device 100 in this respect.

Figure 27:
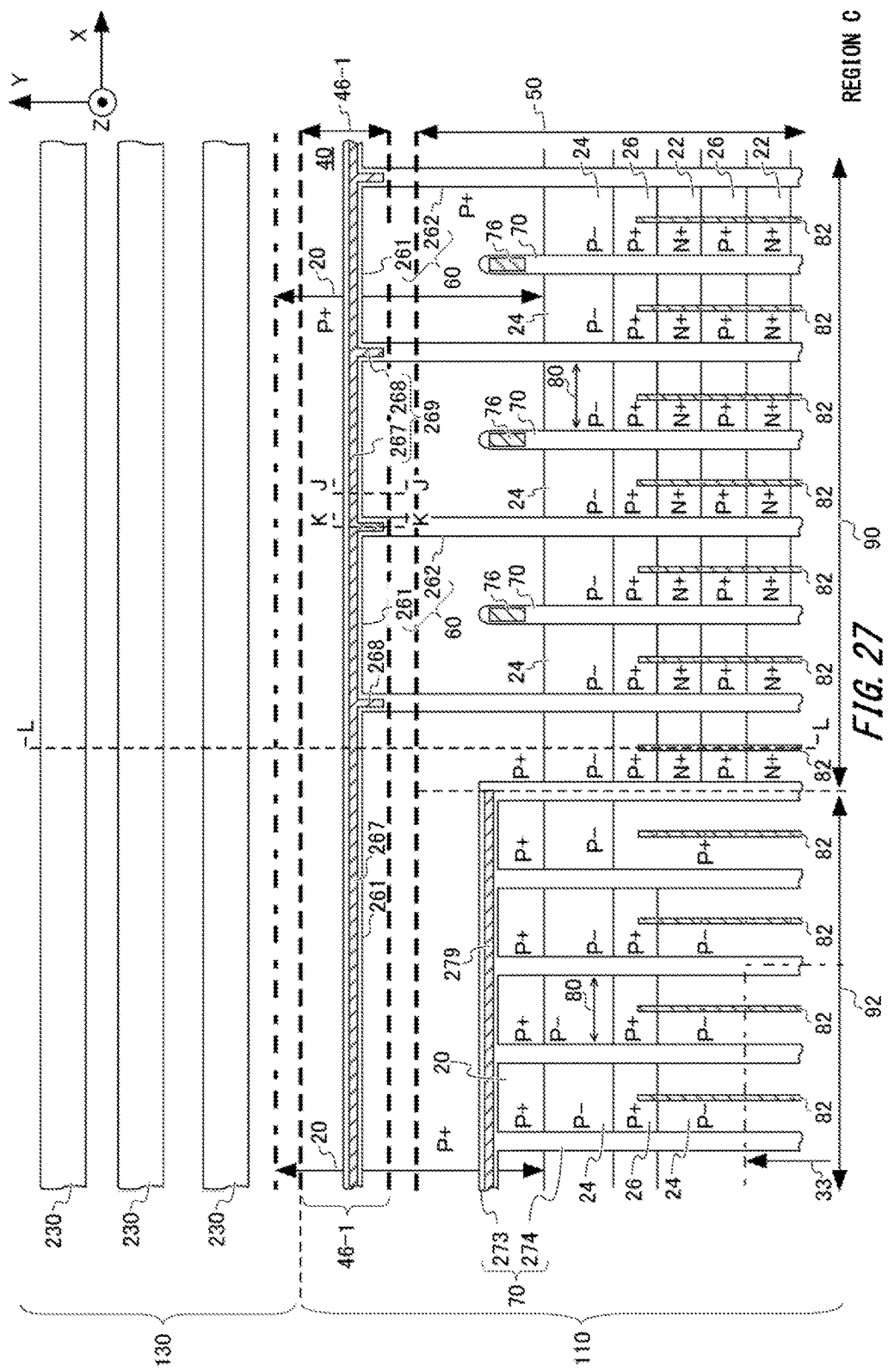
FIG. 27 is an enlarged view of a region C in a fifth embodiment.

FIG. 27 is an enlarged view of a region C in a fifth embodiment. The region C is a region including a +Y direction end portion of the active region 110 and part of the edge termination region 130. The edge termination region 130 has a plurality of guard rings 230 that are detached from each other in the Y-axis direction. A gate trench portions 60 of the present example includes a first extending region 261 extending in the X-axis direction and second extending regions 262 extending in the Y-axis direction.

The first extending region 261 of the present example corresponds to the gate periphery trench portion 43 positioned below the extending portion 46-1. In addition, the second extending regions 262 of the present example correspond to the gate trench portions 60 in the first embodiment. However, because in the present example, the first extending region 261 and second extending regions 262 are continuous, the gate trench portions 60 are assumed to be including the first extending region 261 and second extending regions 262. At a portion where the first extending region 261 and a second extending region 262 intersect each other, the depth of a gate trench 63 is large as compared with the depth at non-intersection portions. However, a bottom portion of the intersection portion is provided at a position shallower than the P+-type well region 20.

The first extending region 261 may connect at least three second extending regions 262 in the X-axis direction. The first extending region 261 may also connect ten second extending regions 262 in one IGBT region 90 in the X-axis direction. The first extending region 261 of the present example connects all the second extending regions 262 in one IGBT region 90 in the X-axis direction. However, in the IGBT region 90, emitter trench portions 70 terminate in the well region 20 before the first extending region 261.

In the present example, the first extending region 261 and second extending regions 262 connect with an extending portion 46-1 of the gate metal layer 40 via a contact portion 269. The contact portion 269 of the present example has a comb-shape having a contact extending portion 267 and contact protruding portions 268. In the present example, the contact extending portion 267 is a portion that extends in parallel with the first extending region 261. In addition, the contact protruding portions 268 of the present example extend from the contact extending portion 267 in the Y-axis direction, but terminate at below the gate metal layer 40, and do not extend to below the emitter electrode 50.

An emitter trench portion 70 of the present example includes a third extending region 273 extending in the X-axis direction and fourth extending regions 274 extending in the Y-axis direction. The third extending region 273 may extend in the X-axis direction in the well region 20. In the present example, the position, in the Y-axis direction, of a +Y direction end portion of the third extending region 273 matches the position of +Y direction end portions of emitter trench portions 70 in an IGBT region 90. In the present example, the emitter trench portion 70 in a FWD region 92 is assumed to be including the third extending region 273 and the fourth extending regions 274.

The third extending region 273 may connect at least three fourth extending regions 274 in the X-axis direction. The third extending region 273 may also connect ten fourth extending regions 274 in one FWD region 92 in the X-axis direction. The third extending region 273 of the present example connects all the fourth extending regions 274 in one FWD region 92 in the X-axis direction. In the present example, the third extending region 273 connects with the emitter electrode 50 via a contact portion 279. The contact portion 279 of the present example extends in parallel with the third extending region 273.

Figure 28A:
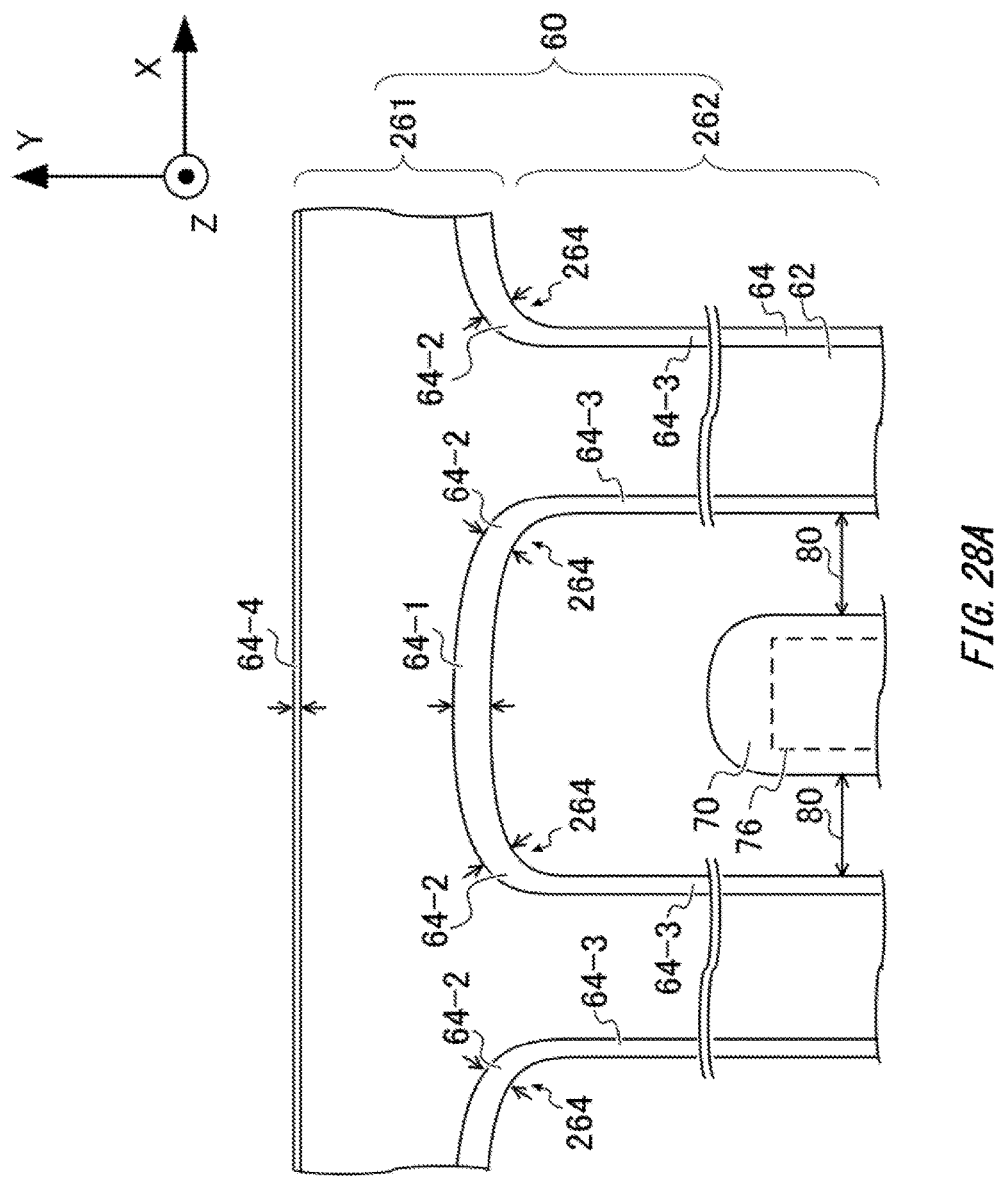
FIG. 28A is an enlarged view of a portion at which a first extending region 261 and second extending regions 262 intersect each other in the present example.

FIG. 28A is an enlarged view of a portion at which the first extending region 261 and second extending regions 262 intersect each other in the present example. FIG. 28B is an enlarged view of Y-axis direction end portions of a gate trench portion 60 and an emitter trench portion 70 in a comparative example.

As shown in FIG. 28A, the portions connecting the first extending region 261 and second extending regions 262 are corner portions 264 having curvature. The thickness of the gate insulating film 64 may not be constant in the first extending region 261 and the second extending regions 262. In the present example, the thickness of a gate insulating film 64-1 at the first extending region 261 that faces an emitter trench portion 70 in the Y-axis direction and is positioned between the two corner portions 264 in the X-axis direction is larger than any of gate insulating films 64 at other portions.

In addition, the thickness of a gate insulating films 64-2 at the corner portions 264 is the second thickest next to the thickness of the gate insulating film 64-1. The thickness of a gate insulating films 64-3 in the second extending regions 262 is the third thickest next to the thickness of the gate insulating films 64-2. In contrast to this, the thickness of a gate insulating film 64-4 positioned at a +Y-axis direction end portion of the first extending region 261 is the smallest.

As shown in the comparative example in FIG. 28B, a gate trench portion 60 has an inversely oriented U-shape. In this comparative example, the thickness of the gate insulating film 64-1 that is at a shorter-side portion of the U-shape, facing an emitter trench portion 70 in the Y-axis direction and is positioned between two curvature portions 265 in the X-axis direction is the largest. In addition, the thickness of the gate insulating films 64-2 at the curvature portions 265 is the second thickest next to the thickness of the gate insulating film 64-1. The thickness of the gate insulating films 64-3 at longer-side portions of the U-shape, facing the emitter trench portion 70 in the X-axis direction is the third thickest next to the thickness of the gate insulating films 64-2.

The thickness of gate insulating films 64-5 positioned at a +Y-axis direction end portion of a shorter-side portion of the U-shape and at curvature portions 266 opposite to the curvature portions 265 is the smallest. The gate insulating films 64-5 are prone to be thinner particularly, due to the shapes of the curvature portions 265 and curvature portions 266. If the gate insulating film 64 gets thin, a drawback that the gate insulating film 64 is destroyed at the time of gate-ON occurs.

In contrast to this, the present example shown in FIG. 28A does not have the curvature portions 266 of the comparative example shown in FIG. 28B. Due to this difference in shape, the gate insulating film 64-4 which is the thinnest in FIG. 28A is thicker than the gate insulating films 64-5 which are the thinnest in FIG. 28B. Therefore, in the present example in FIG. 28A, the possibility of the gate insulating film 64 being destroyed at the time of gate-ON can be lowered as compared with the comparative example in FIG. 28B. For example, by the first extending region 261 connecting at least three second extending regions 262 in the X-axis direction, the possibility of the gate insulating film 64 being destroyed at the time of gate-ON can be lowered as compared with the case where it does not connect them.

Figure 29:
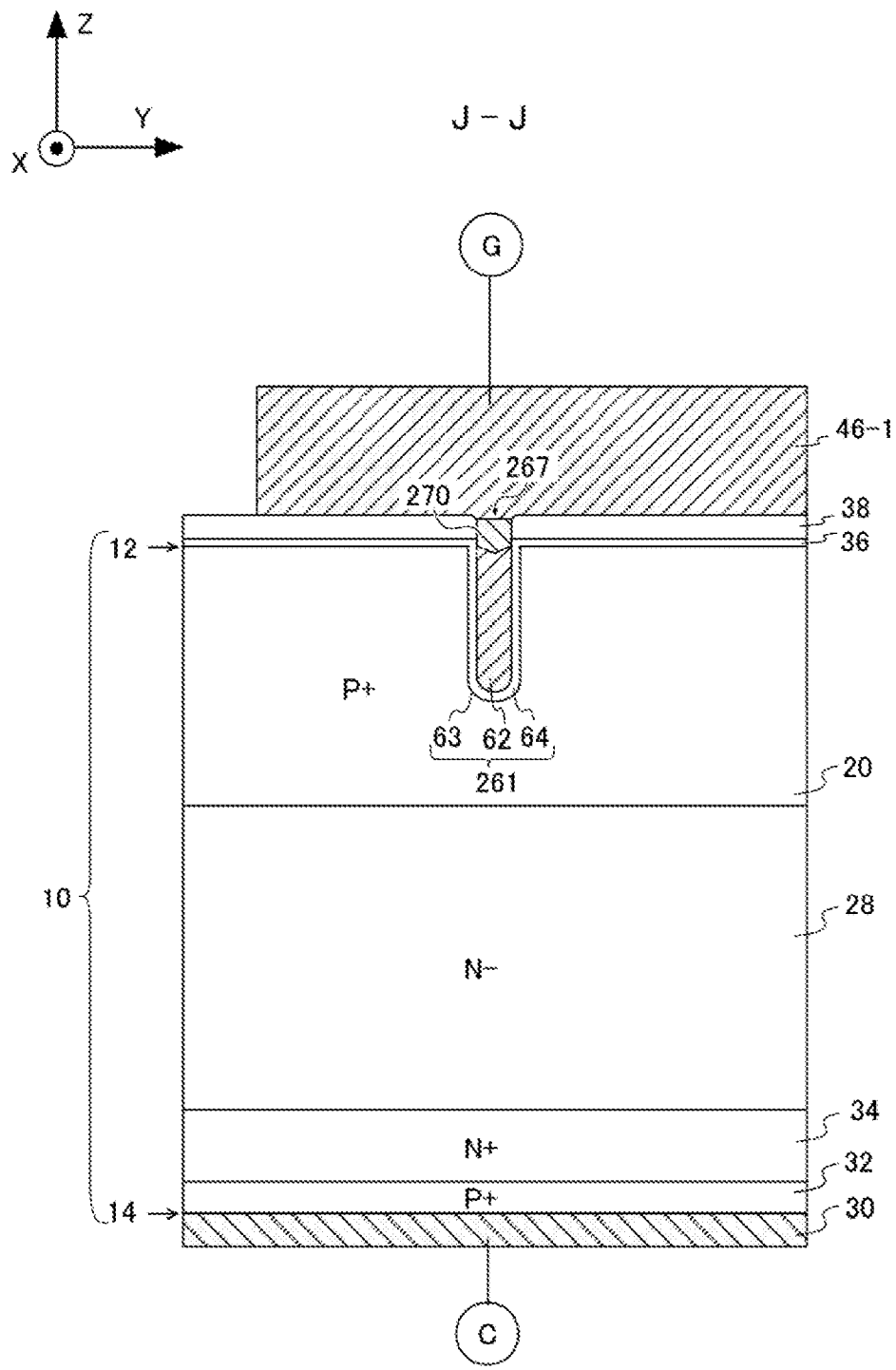
FIG. 29 is a figure showing a cross section taken along J-J in FIG. 27.

FIG. 29 is a figure showing a cross section taken along J-J in FIG. 27. The cross section taken along J-J is a cross section parallel with the Y-Z plane. The cross section taken along J-J passes through the first extending region 261, but does not pass through the second extending regions 262. In the present example, a gate conductive portion 62 of the first extending region 261 and the gate metal layer 40 are electrically connected via a plug 270. In the present example, a contact extending portion 267 corresponds to the plug 270.

Figure 30:
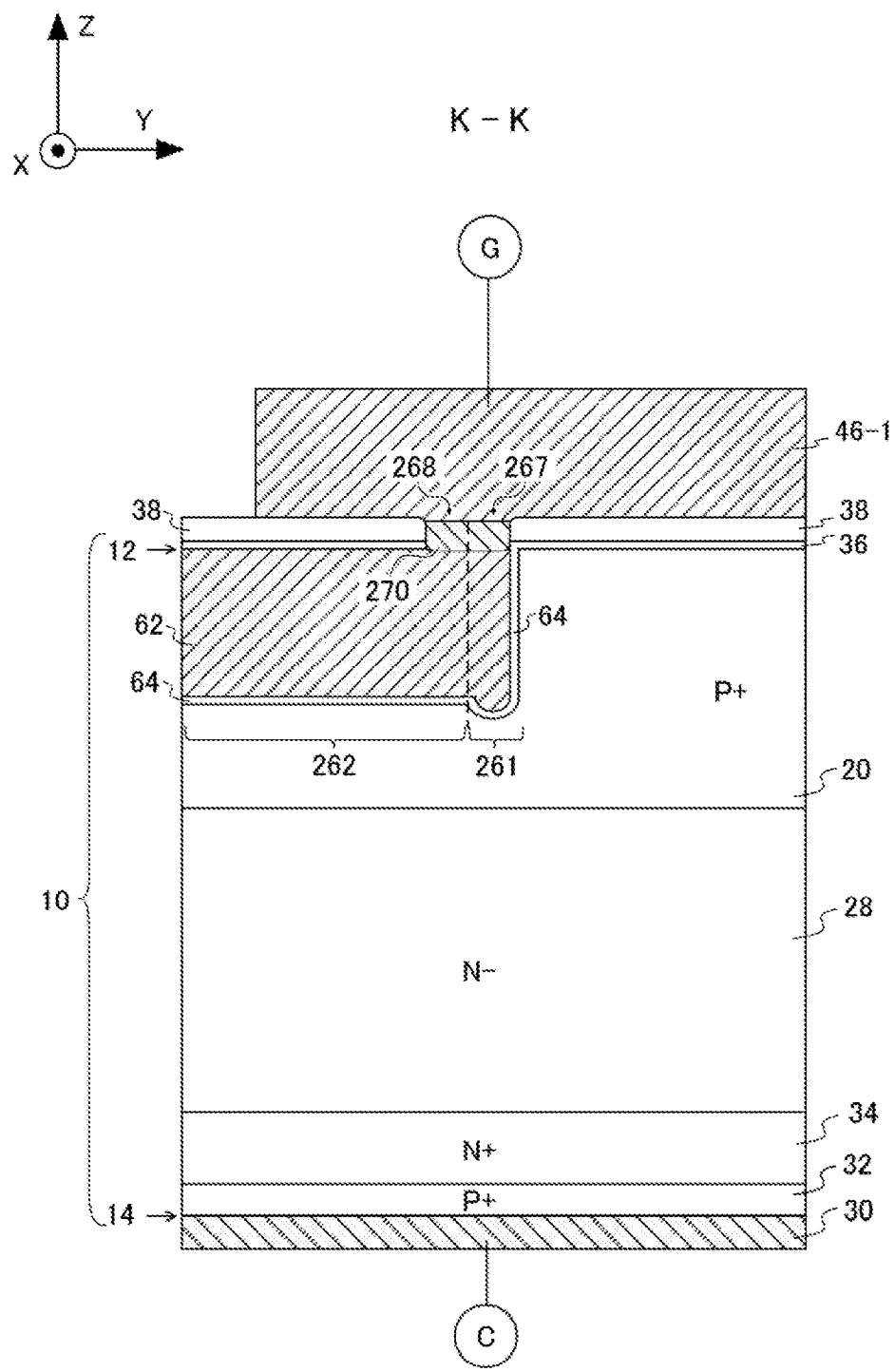
FIG. 30 is a figure showing a cross section taken along K-K in FIG. 27.

FIG. 30 is a figure showing a cross section taken along K-K in FIG. 27. The cross section taken along K-K is a cross section parallel with the Y-Z plane. The cross section taken along K-K passes through the first extending region 261 and a second extending region 262. In the present example, a gate conductive portion 62 and the gate metal layer 40 are electrically connected via a plug 270 provided to the first extending region 261 and second extending region 262. In the present example, a contact extending portion 267 and a contact protruding portion 268 correspond to part of the plug 270 provided to the first extending region 261 and other part of the plug 270 provided to the second extending region 262, respectively. Because the first extending region 261 in FIG. 30 is a portion at which the first extending region 261 and the second extending region 262 intersect each other, a bottom portion of the first extending region 261 is deeper than a bottom portion of the second extending region 262.

Figure 31:
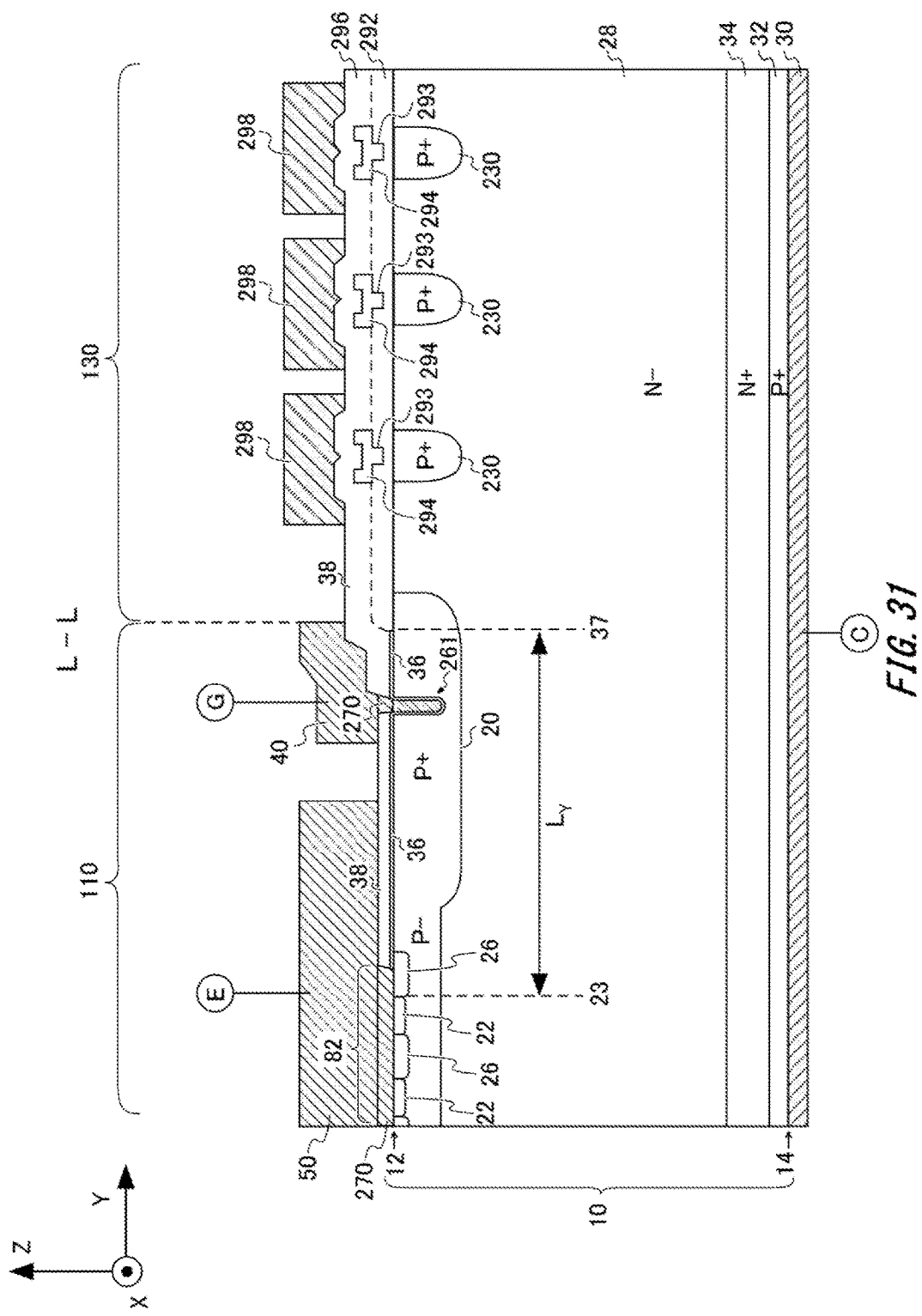
FIG. 31 is a figure showing a cross section taken along L-L in FIG. 27.

FIG. 31 is a figure showing a cross section taken along L-L in FIG. 27. The cross section taken along L-L is a cross section parallel with the Y-Z plane. The cross section taken along L-L passes through a contact portion 82 of an IGBT region 90, the first extending region 261 and the edge termination region 130. The edge termination region 130 of the present example has a plurality of guard rings 230, a relatively thick silicon dioxide layer 292, polysilicon layers 294, an interlayer dielectric film 296 and electrodes 298.

The guard rings 230 may be provided to reach a predetermined depth from the top surface 12 of the semiconductor substrate 10. The guard rings 230 of the present example are provided to the same depth position as that of the P$^+$-type well region 20. The guard rings 230 of the present example are of P$^+$-type. In the present example, P-type is an example of a second conductivity type, and N-type is an example of a first conductivity type. However, in another example, P-type may be a first conductivity type, and N-type may also be a second conductivity type. In the present example, N and P mean that electrons and holes are the majority carriers, respectively. About + and – affixed to the right of N and P, N+ or P+ means that the carrier concentration is higher than what N or P without + indicates, and N– or P– means that the carrier concentration is lower than what N or P without – indicates.

The silicon dioxide layer 292 may be provided on each guard ring 230. The silicon dioxide layer 292 may include the oxide film 36 provided in contact with the top surface 12. The silicon dioxide layer 292 may be formed by performing thermal oxidation of the semiconductor substrate 10 made of silicon. The silicon dioxide layer 292 may have a thickness which is equal to or larger than 1 μm in the Z-axis direction. The silicon dioxide layer 292 of the present example has a thickness of 1.1 μm in the Z-axis direction.

The polysilicon layers 294 may be provided in contact with concave portions 293 provided to the silicon dioxide layer 292. However, the polysilicon layers 294 do not connect with the guard rings 230 in the cross section taken along L-L. The polysilicon layers 294 may be formed at the time of forming gate conductive portions 62 made of polysilicon. The interlayer dielectric film 296 may be provided on the silicon dioxide layer 292 and the polysilicon layers 294. The interlayer dielectric film 296 may be a film made of any of BPSG (Boro-Phospho Silicate Glass), PSG (Phosphorus Silicate Glass) and BSG (Borosilicate Glass) or may also be a film formed by layering any two of them one on another.

The electrodes 298 are provided above the polysilicon layers 294, sandwiching the interlayer dielectric film 296 therebetween. The electrodes 298 may be formed of an alloy which is the same as that used for the gate metal layer 40 and the emitter electrode 50. The electrodes 298 may also connect to the polysilicon layers 294 through openings of the interlayer dielectric film 296.

In the present example, a +Y direction end portion of the gate metal layer 40 is treated as the boundary between the active region 110 and the edge termination region 130. In the present example, the contact portion 82 is detached sufficiently (for example, by 100 μm or longer) from the relatively thick silicon dioxide layer 292 in the edge termination region 130. Thereby, influence, on the contact portion 82, of abnormality in the thickness of a photoresist that is generated due to a step of the silicon dioxide layer 292 can be suppressed.

In the present example, a distance $L_Y$ between a –Y direction end portion 37, of the silicon dioxide layer 292, which is the closest to an emitter region 22 of the IGBT region 90 and a +Y direction end portion 23 of the emitter region 22 which is the closest to the edge termination region 130 is equal to or larger than 100 μm. As a variant, if a polysilicon wiring layer is provided on the first extending region 261, the distance between a –Y direction end portion, of the polysilicon wiring layer, which is the closest to the IGBT region 90 and the +Y direction end portion 23 of the emitter region 22 which is the closest to the edge termination region 130 may be equal to or larger than 50 μm.

Figure 32:
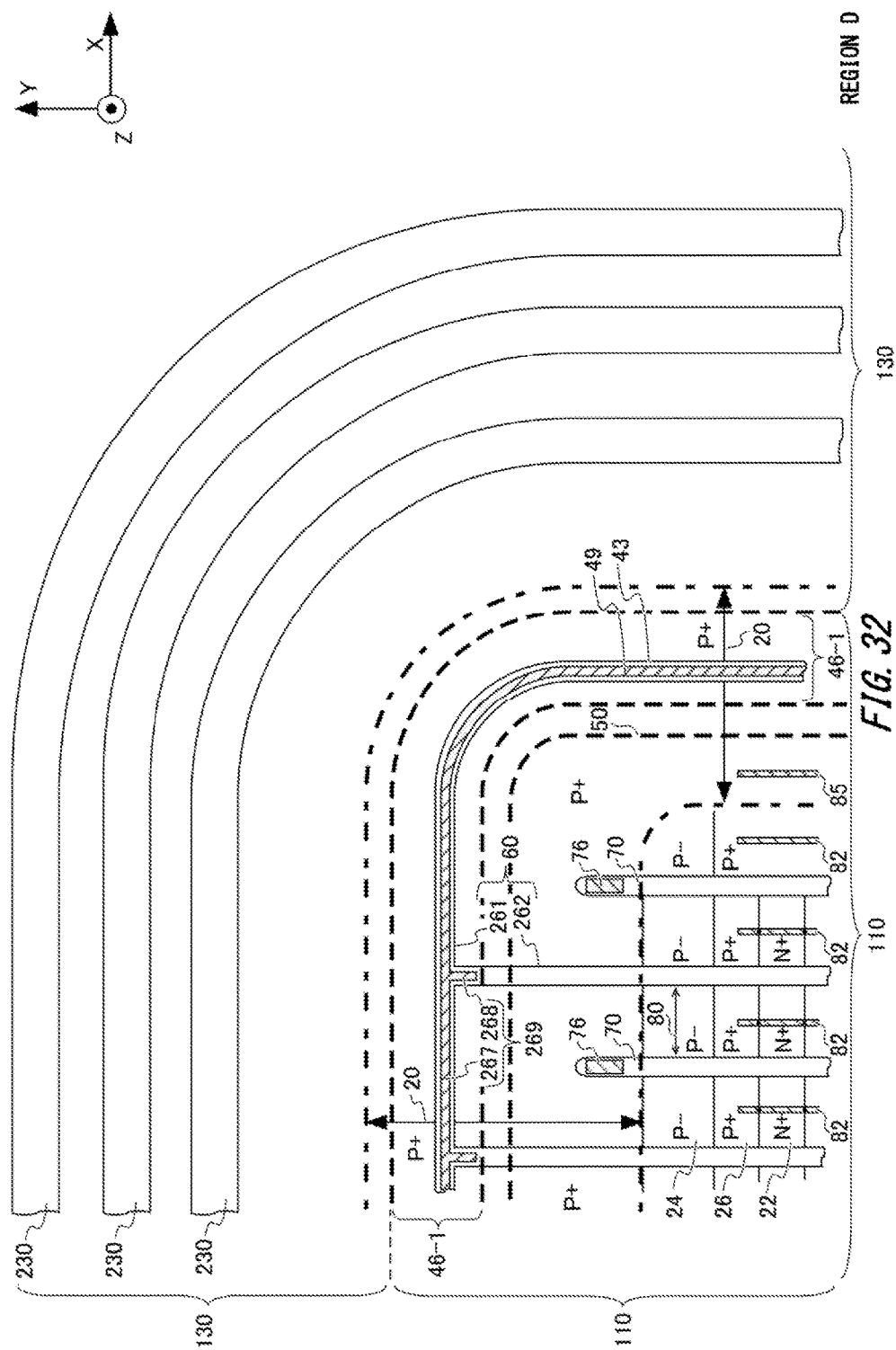
FIG. 32 is an enlarged view of a region D in a sixth embodiment.

FIG. 32 is an enlarged view of a region D in a sixth embodiment. At an end portion, of the active region 110, which is on the edge termination region 130 side, the first extending region 261 of the present example connects to a gate periphery trench portion 43 extending in the Y-axis direction. At a corner portion of the active region 110, the first extending region 261 extending in the X-axis direction and the gate periphery trench portion 43 extending in the Y-axis direction may be connected by the gate periphery trench portion 43 having curvature in a top view. In addition, the contact portion 269 and the contact portion 49 may also be connected by a contact portion having curvature.

Although in the present specification, an RC-IGBT is explained mainly, the technical spirit of the present application may also be applied to a power MOSFET (Metal Oxide Semiconductor Field Effect Transistor). In this case, the emitter electrode 50 as a second top surface electrode may be treated as a source electrode. Furthermore, the collector electrode 30 and the P+-type collector regions 32 may be treated as a drain electrode and N+-type regions, respectively.

Figure 33:
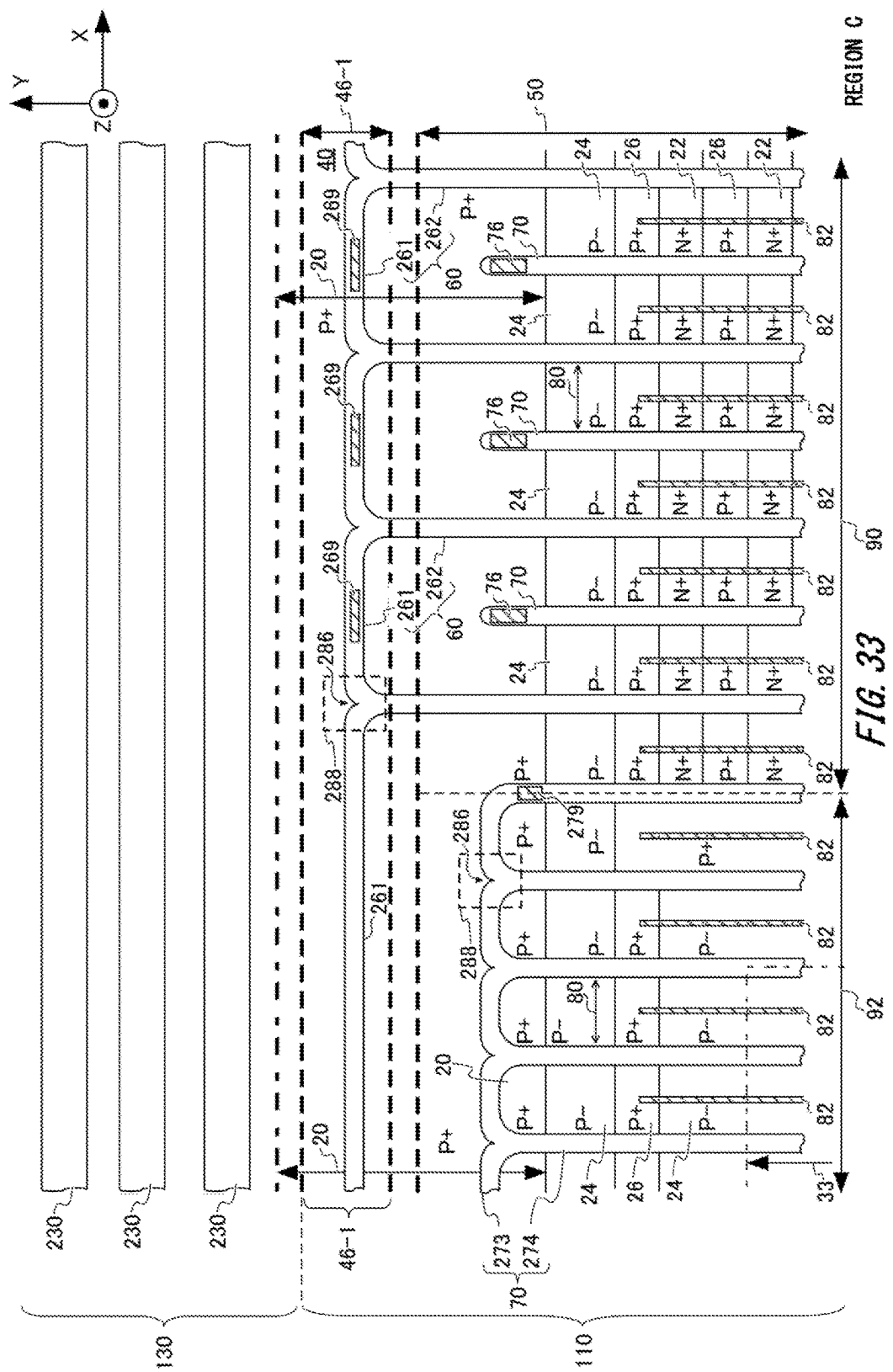
FIG. 33 is an enlarged view of a region C in the sixth embodiment.

FIG. 33 is an enlarged view of a region C in the sixth embodiment. In the sixth embodiment, the shapes of gate trench portions 60 and emitter trench portions 70 are different from those in the fifth embodiment shown in FIG. 27. In other respects, the structure is the same as that in the fifth embodiment.

In the present example, a portion of a gate trench portion 60 at which a first extending region 261 and a second extending region 262 are connected is treated as a connecting portion 288. Similarly, a portion of an emitter trench portion 70 at which a third extending region 273 and a fourth extending region 274 are connected is also treated as a connecting portion 288. Although in the present example, a connecting portion 288 at a gate trench portion 60 is explained, a connecting portion 288 at an emitter trench portion 70 also has a similar structure.

A first extending region 261 of the present example has a recessed portion 286 in a top view of a connecting portion 288. The recessed portion 286 is provided at a position where it faces a second extending region 262 in the Y-axis direction. The recessed portion 286 refers to a portion which is at one end portion among end portions of the first extending region 261 in the Y-axis direction and is recessed toward the second extending region 262, the one end portion being opposite to the second extending region 262. The recessed portion 286 of the present example has a tapered shape in which the width in the X-axis direction gradually decreases as the distance from the second extending region 262 decreases. Although in the fifth embodiment, a first extending region 261 and a second extending region 262 intersect each other vertically in a top view, in the sixth embodiment, a first extending region 261 and a second extending region 262 intersect each other at an angle smaller than 90 degrees in a top view.

By providing a recessed portion 286, the area of a gate trench portion 60 at a connecting portion 288 can be reduced. At a connecting portion 288 where a first extending region 261 and a second extending region 262 intersect each other, the trench area tends to increase due to a corner portion 264 indicated in (A) in FIG. 28 and the like. If the trench area increases, the trench depth of a connecting portion 288 increases in some cases as compared with other portions. In addition, the depth position of a gate conductive portion 62 to be embedded in a trench also varies in some cases. By providing a recessed portion 286 in the present example, increase in the trench area at a connecting portion 288 can be suppressed.

Figure 34:
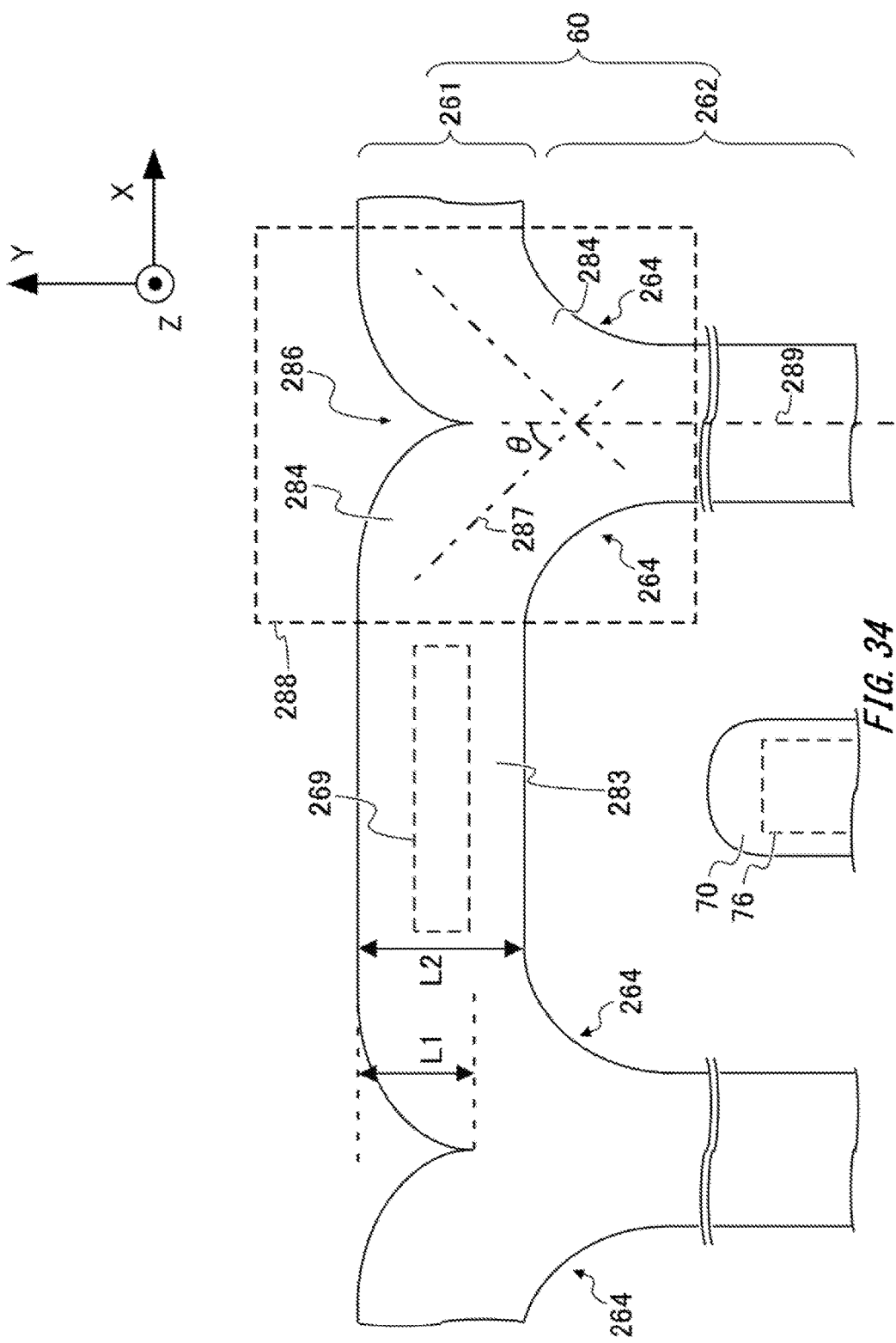
FIG. 34 is an enlarged view of a connecting portion 288.

FIG. 34 is an enlarged view of a connecting portion 288. A first extending region 261 of the present example has a linear portion 283 and a curved portion 284. The linear portion 283 has a linear shape extending along the X-axis direction. The curved portion 284 may have a curved shape almost parallel with a corner portion 264. The curvature of the curved portion 284 may be the same as the curvature of the corner portion 264. The curvature of the curved portion 284 may also be equal to or larger than half of the curvature of the corner portion 264 and equal to or smaller than 200% of it. The curved portion 284 connects the linear portion 283 and a second extending region 262.

In the present example, an angle at which the curved portion 284 and the second extending region 262 intersect each other is assumed to be θ. The angle θ is smaller than 90 degrees. The angle θ may also be smaller than 70 degrees, and may be smaller than 50 degrees. The angle θ may be an angle formed by a straight line 287 approximating a curve passing through the center of the curved portion 284 in the width direction and a straight line 289 approximating the direction of extension of the second extending region 262. The straight line 289 of the present example is a straight line parallel with the Y-axis.

The length L1 of the recessed portion 286 in the Y-axis direction may be shorter than the width L2, in the Y-axis direction, of the linear portion 283 of the first extending region 261. The length L1 may be the same as the width L2 or may also be longer than the width L2.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: a semiconductor substrate; 12: top surface; 14: bottom surface; 16: periphery; 17: one side; 18: middle portion; 20: well region; 22: emitter region; 23: end portion; 24: base region; 26: contact region; 28: drift region; 30: collector electrode; 32: collector region; 33: cathode region; 34: buffer region; 36: oxide film; 37: end portion; 38: interlayer dielectric film; 40: gate metal layer; 42: gate bridge trench portion; 43: gate periphery trench portion; 44: periphery portion; 46: extending portion; 48: contact portion; 49: contact portion; 50: emitter electrode; 50-1: first region; 50-2: second region; 50-3: third region; 50-4: fourth region; 52: emitter bridge portion; 60: gate trench portion; 62: gate conductive portion; 63: gate trench; 64: gate insulating film; 66: contact portion; 70: emitter trench portion; 72: emitter conductive portion; 73: emitter trench; 74: emitter insulating film; 76: contact portion; 80: mesa portion; 82; 84; 85; 86: contact portion; 90: IGBT region; 92: FWD region; 94: temperature sense diode region; 96: top surface killer region; 100: semiconductor device; 110: active region; 120: pad region; 122: gate pad; 124: sense IGBT region; 126: sense emitter pad; 127: dummy emitter pad; 128: temperature sense anode pad; 129: temperature sense cathode pad; 130: edge termination region; 132: gate periphery conductive portion; 133: gate periphery trench; 134: gate periphery insulating film; 142: gate bridge conductive portion; 143: gate bridge trench; 144: gate bridge insulating film; 150: dummy emitter electrode; 152: dummy bridge trench portion; 154: contact portion; 155: periphery portion; 156: extending portion; 160: sense gate trench portion; 170: sense emitter trench portion; 172: sense emitter conductive portion; 174: sense emitter insulating film; 180: probe card; 182: probe; 192: connecting portion; 193: contact portion; 194: periphery portion; 196: extending portion; 200: semiconductor device; 230: guard ring; 240: polysilicon wiring layer; 241: imaginary connection layer; 242: connection layer; 244: periphery portion; 246: extending portion; 261: first extending region; 262: second extending region; 264: corner portion; 265; 266: curvature portion; 267: contact extending portion; 268: contact protruding portion; 269: contact portion; 270: plug; 273: third extending region; 274: fourth extending region; 276: second opening portion; 279: contact portion; 282: first opening portion; 283: linear portion; 284: curved portion; 286: recessed portion; 287: straight line; 288: connecting portion; 289: straight line; 292: silicon dioxide layer; 293: concave portion; 294: polysilicon layer; 296: interlayer dielectric film; 298: electrode; 300: semiconductor device; 376: contact portion; 400: semiconductor device

What is claimed is:
1. A semiconductor device comprising:
a semiconductor substrate;
a first top surface electrode and a second top surface electrode that are provided above a top surface of the semiconductor substrate and contain a metal material; and
a first connecting portion that electrically connects to the first top surface electrode and contains a semiconductor material, wherein
the second top surface electrode has:
a first region and a second region that are arranged being separated from each other with the first connecting portion as a boundary in a top view of the semiconductor substrate, and
a second connecting portion that connects the first region and the second region above the first connecting portion.
2. The semiconductor device according to claim 1, wherein the first connecting portion has a gate bridge trench portion that: is provided spreading from the top surface of the semiconductor substrate and reaching a predetermined depth; is positioned below the second connecting portion; and electrically connects with the first top surface electrode.
3. The semiconductor device according to claim 2, wherein
the first top surface electrode has a metallic wiring layer separated at least at a position of the second connecting portion in a top view of the semiconductor substrate, and
the metallic wiring layer electrically connects to the gate bridge trench portion.
4. The semiconductor device according to claim 2, further comprising a first trench portion that electrically connects with the first top surface electrode and a second trench portion that electrically connects with the second top surface electrode, the first trench portion and the second trench portion each being provided at a predetermined depth position from the top surface of the semiconductor substrate, wherein
a width of the gate bridge trench portion in a second direction perpendicular to a first direction which is a direction of extension of the first connecting portion in a top view of the semiconductor substrate is larger than both a width of the second trench portion in the first direction and a width of the first trench portion in the first direction.
5. The semiconductor device according to claim 2, wherein the first connecting portion has a plurality of the gate bridge trench portions provided being separated from each other in a second direction perpendicular to a first direction which is a direction of extension of the first connecting portion in a top view of the semiconductor substrate.
6. The semiconductor device according to claim 2, wherein the first connecting portion has the gate bridge trench portion provided annularly in a top view of the semiconductor substrate.
7. The semiconductor device according to claim 1, wherein
the first connecting portion is a polysilicon wiring layer provided above the top surface of the semiconductor substrate, and
the polysilicon wiring layer is provided also below the second connecting portion.
8. The semiconductor device according to claim 1, wherein
the first top surface electrode is a gate metal layer, and
the second top surface electrode is an emitter electrode.
9. The semiconductor device according to claim 1, wherein
the semiconductor device has an active region including a transistor region and a free wheeling diode region, and
the second connecting portion connects the first region and the second region between at least two of the free wheeling diode regions that are detached from each other in a second direction perpendicular to a first direction which is a direction of extension of the first connecting portion in a top view of the semiconductor substrate.
10. The semiconductor device according to claim 9, wherein a width of the second connecting portion in the first direction is smaller than a width of one of the free wheeling diode regions in the first direction.
11. The semiconductor device according to claim 9, wherein the second connecting portion that connects the first region and the second region is not provided between at least two of the free wheeling diode regions among a plurality of the free wheeling diode regions detached from each other in the second direction.
12. The semiconductor device according to claim 9, wherein
the semiconductor substrate has a top surface killer region that: is provided in a predetermined depth range from the top surface between the free wheeling diode regions detached from each other in the second direction; and adjusts hole lifetime, and
a width of the top surface killer region in the first direction in a region not provided with the second connecting portion is larger than a width of the top surface killer region in the first direction in a region provided with the second connecting portion.
13. The semiconductor device according to claim 9, wherein the second connecting portion is provided at least between two of the free wheeling diode regions arranged close to a middle portion of the semiconductor substrate in a top view of the semiconductor substrate.
14. The semiconductor device according to claim 13, wherein a width, in the first direction, of the second connecting portion provided between two of the free wheeling diode regions arranged close to a middle portion of the semiconductor substrate in a top view of the semiconductor substrate is larger than a width, in the first direction, of the second connecting portion provided between two of the free wheeling diode regions arranged away from the middle portion of the semiconductor substrate in a top view of the semiconductor substrate.

15. The semiconductor device according to claim 1, wherein
the semiconductor device has an active region including a transistor region and a free wheeling diode region,
in the active region, the first top surface electrode electrically connects with a first trench portion in the transistor region, and
the semiconductor device further comprises a third top surface electrode that: is provided, in the active region, being detached from the first top surface electrode and the second top surface electrode, and electrically connects with a second trench portion in the transistor region.

16. The semiconductor device according to claim 15, wherein the semiconductor substrate has a dummy bridge trench portion that: is provided spreading from the top surface of the semiconductor substrate and reaching a predetermined depth; is positioned below the second connecting portion; and electrically connects with the third top surface electrode.

17. The semiconductor device according to claim 15, wherein the first connecting portion has a gate bridge trench portion that: is provided spreading from the top surface of the semiconductor substrate and reaching a predetermined depth; is positioned below the third top surface electrode; and electrically connects with the first top surface electrode.

18. The semiconductor device according to claim 17, wherein the gate bridge trench portion electrically connects:
a periphery portion of the first top surface electrode that: is provided near an end portion of an active region of the semiconductor substrate; and extends in a second direction perpendicular to a first direction which is a direction of extension of the first connecting portion; and
an extending portion of the first top surface electrode that extends in the first direction between a pair of the periphery portions.

19. The semiconductor device according to claim 1, wherein
the semiconductor device has:
a first trench portion that: is provided at a predetermined depth position from the top surface of the semiconductor substrate; and extends in a second direction perpendicular to a first direction which is a direction in which the first connecting portion extends if the semiconductor substrate is seen from above;
a second trench portion that: is provided at the predetermined depth position; extends in the second direction; and electrically connects with the second top surface electrode; and
a mesa portion positioned between the first trench portion and the second trench portion that are adjacent to each other in the first direction, and
a width, in the first direction, at a second opening portion for electrically connecting the second top surface electrode and the second trench portion is larger than a width, in the first direction, at a first opening portion for electrically connecting the mesa portion and the second top surface electrode.

20. The semiconductor device according to claim 19, wherein a width, in the first direction, at a second contact portion at which the second top surface electrode and the second trench portion are electrically connected is larger than a width, in the first direction, at a first contact portion at which the mesa portion and the second top surface electrode are electrically connected.

21. The semiconductor device according to claim 19, wherein the second top surface electrode and the second trench portion are electrically connected at the second opening portion not via a polysilicon wiring layer.

22. The semiconductor device according to claim 19, wherein the second opening portion and the first opening portion are provided at different positions in the second direction.

23. The semiconductor device according to claim 19, wherein
the semiconductor device comprises:
an active region including a transistor region and a free wheeling diode region; and
an edge termination region provided around the active region,
the transistor region has a first conductivity type emitter region provided to the semiconductor substrate,
the edge termination region has:
a second conductivity type guard ring provided spreading from the top surface of the semiconductor substrate and reaching a predetermined depth; and
a silicon dioxide layer that is provided on the guard ring and has a thickness which is equal to or larger than 1 μm, and
a distance between an end portion, of the silicon dioxide layer, which is closest to the emitter region and an end portion of the emitter region which is closest to the edge termination region is equal to or larger than 100 μm.

24. The semiconductor device according to claim 19, wherein
the first trench portion includes:
a first extending region extending in the first direction; and
a second extending region extending in the second direction, and
the first extending region connects at least three of the second extending regions in the first direction.

25. The semiconductor device according to claim 24, wherein
the semiconductor device comprises:
an active region including a transistor region and a free wheeling diode region; and
an edge termination region provided around the active region,
at an end portion, of the active region, which is on the edge termination region side, the first extending region of the first trench portion connects to a gate periphery trench portion extending in the second direction.

26. The semiconductor device according to claim 24, wherein the first extending region has a recessed portion which is at one end portion among end portions of the first extending region in the second direction and is recessed toward the second extending region, the one end portion being opposite to the second extending region.

27. The semiconductor device according to claim 19, wherein
the semiconductor device has an active region including a transistor region and a free wheeling diode region, the free wheeling diode region has a second trench portion that: is provided at the predetermined depth position; and electrically connects with the second top surface electrode, the second trench portion includes:
- a third extending region extending in the first direction; and
- a fourth extending region extending in the second direction, and the third extending region connects at least three of the fourth extending regions in the first direction.

28. The semiconductor device according to claim 27, wherein the third extending region connects, in the first direction, all the fourth extending regions in a plurality of the second trench portions in one of the free wheeling diode regions.

* * * * *